(12) United States Patent
Schrauben et al.

(10) Patent No.: US 10,957,615 B2
(45) Date of Patent: Mar. 23, 2021

(54) LASER-SEEDING FOR ELECTRO-CONDUCTIVE PLATING

(71) Applicant: ELECTRO SCIENTIFIC INDUSTRIES, INC., Portland, OR (US)

(72) Inventors: Joel Schrauben, Portland, OR (US); Jan Kleinert, Portland, OR (US)

(73) Assignee: ELECTRO SCIENTIFIC INDUSTRIES, INC, Portland, OR (US)

(*) Notice: Subject to any disclaimer, the term of this patent is extended or adjusted under 35 U.S.C. 154(b) by 0 days.

(21) Appl. No.: 16/067,693

(22) PCT Filed: Mar. 31, 2017

(86) PCT No.: PCT/US2017/025392
§ 371 (c)(1),
(2) Date: Jul. 2, 2018

(87) PCT Pub. No.: WO2017/173281
PCT Pub. Date: Oct. 5, 2017

(65) Prior Publication Data
US 2019/0019736 A1 Jan. 17, 2019

Related U.S. Application Data

(60) Provisional application No. 62/315,913, filed on Mar. 31, 2016, provisional application No. 62/407,848, filed on Oct. 13, 2016.

(51) Int. Cl.
*H01L 21/48* (2006.01)
*H01L 23/15* (2006.01)
*H01L 23/498* (2006.01)

(52) U.S. Cl.
CPC ............ *H01L 23/15* (2013.01); *H01L 21/486* (2013.01); *H01L 21/4857* (2013.01); *H01L 23/49822* (2013.01); *H01L 23/49827* (2013.01)

(58) Field of Classification Search
CPC ............ C23C 18/1608; C23C 18/1612; C23C 18/1862; C23C 18/1868; C23C 18/1851;
(Continued)

(56) References Cited

U.S. PATENT DOCUMENTS 5,266,446 A * 11/1993 Chang .................. H01L 21/481
216/13
6,805,918 B2 * 10/2004 Auyeung ............... H05K 3/046
427/554
(Continued)

FOREIGN PATENT DOCUMENTS

CN 101121575 B 11/2010
WO WO2011/124826 A1 10/2011
(Continued)

OTHER PUBLICATIONS

PCT/US2017/025392, international search report dated Aug. 18, 2017, 2 pages.
(Continued)

*Primary Examiner* — Michael P Wieczorek

(57) ABSTRACT

A workpiece (100) having substrate, such as a glass substrate, can be etched by a laser or by other means to create recessed features (200, 202). A laser-induced forward transfer (LIFT) process or metal oxide printing process can be employed to impart a seed material (402), such as a metal, onto the glass substrate, especially into the recessed features (200, 202). The seeded recessed features can be plated, if desired, by conventional techniques, such as electroless plating, to provide conductive features (500) with predictable and better electrical properties. The workpieces (100)
(Continued)

can be connected in a stacked such that subsequently stacked workpieces (100) can be modified in place.

20 Claims, 30 Drawing Sheets

(58) Field of Classification Search
CPC ... C23C 18/20; C23C 18/2026; C23C 18/204; C23C 18/28; C23C 18/38; H01L 23/15; H01L 23/49822; H01L 23/49827; H01L 21/4857; H01L 21/486
USPC .......................................... 427/595, 596, 597
See application file for complete search history.

(56) References Cited

U.S. PATENT DOCUMENTS

| | | | |
|---|---|---|---|
| 6,815,015 B2 | 11/2004 | Young et al. | |
| 7,927,454 B2* | 4/2011 | Huynh | C23C 18/1608 156/234 |
| 7,998,857 B2* | 8/2011 | Gurumurthy | H01L 21/288 438/629 |
| 8,703,579 B2* | 4/2014 | Miyairi | H01L 27/1266 438/455 |
| 8,840,972 B2* | 9/2014 | Yamazaki | B82Y 20/00 427/554 |
| 2005/0003101 A1* | 1/2005 | Damerell | H05K 3/185 427/554 |
| 2009/0057156 A1* | 3/2009 | Haba | C23C 18/1608 205/118 |
| 2011/0292622 A1* | 12/2011 | Hovestad | C23C 18/1605 361/748 |
| 2014/0001150 A1* | 1/2014 | Lecesse | H05K 3/429 216/18 |
| 2015/0086705 A1 | 3/2015 | Meinders et al. | |
| 2015/0200370 A1 | 7/2015 | Unnikrishnan et al. | |
| 2015/0309600 A1* | 10/2015 | Ramakrishnan | G06F 3/041 427/108 |

FOREIGN PATENT DOCUMENTS

| | | |
|---|---|---|
| WO | WO2011/145930 A1 | 11/2011 |
| WO | WO2015/005779 A1 | 1/2015 |

OTHER PUBLICATIONS

A. Piqué, C. B. et al., "Laser-Induced Forward Transfer Direct-Write of Miniature Sensor and Microbattery Systems", Proceedings of SPIE—the International Society for Optical engineering, Apr. 2002. 8 pages.

Alexandra Palla-Papavlu, et al., "Laser Induced Forward Transfer for Materials Patterning", Romanian Reports in Physics, vol. 63 Supplement, p. 1285-1301, 2011.

C.T. Pan, "Selective electroless copper plating micro-coil assisted by 248 nm excimer laser", Department of Mechanical and Electro-Mechanical Engineering, National Sun Yat-Sen University, Kaoshiung, Taiwan, Dec. 14, 2003. 10 pages.

Dilshani Rathnayake-Arachchige, et al., "Patterning of Electroless Copper Deposition on Low Temperature Co-fired Ceramic", Wolfson School of Mechanical and Manufacturing Engineering, Loughborough University, UK. IEEE 2013. 5 pages.

Fuhan Liu, et al., "Advances in Embedded Traces for 1.5 μm RDL on 2.5D Glass Interposers", 3D Systems Packaging Research Center, Georgia Institute of Technology, IEEE 2015. 6 pages.

Jiangxin Song, et al., "Fabrication of Gold Microelectrodes on a Glass Substrate by Femtosecond-Laser-Assisted Electroless Plating". JLMN—Journal of Laser Micro/Nanoegineering vol. 7, No. 3, 2012. 5 pages.

Monica Aleman Martinez, Doctoral Dissertation: "Low Temperature Processes for the Front-Side Metalization of Crystalline Silicon Solar Cells" Fraunhofer-Institut für Solare Energie Systeme Freiburg im Breisgau 2013. 215 pages.

Manoj Kumar Sharma, "Optimization of Laser Induced Forward Transfer by Finite Element Modeling", Royal Institute of Technology-KTH, Stockholm Sweden, Apr. 2013. 89 pages.

Joel Shrauben, "Embedded 25 μm Copper Wires in Glass and FR4", Jan. 5, 2016.

* cited by examiner

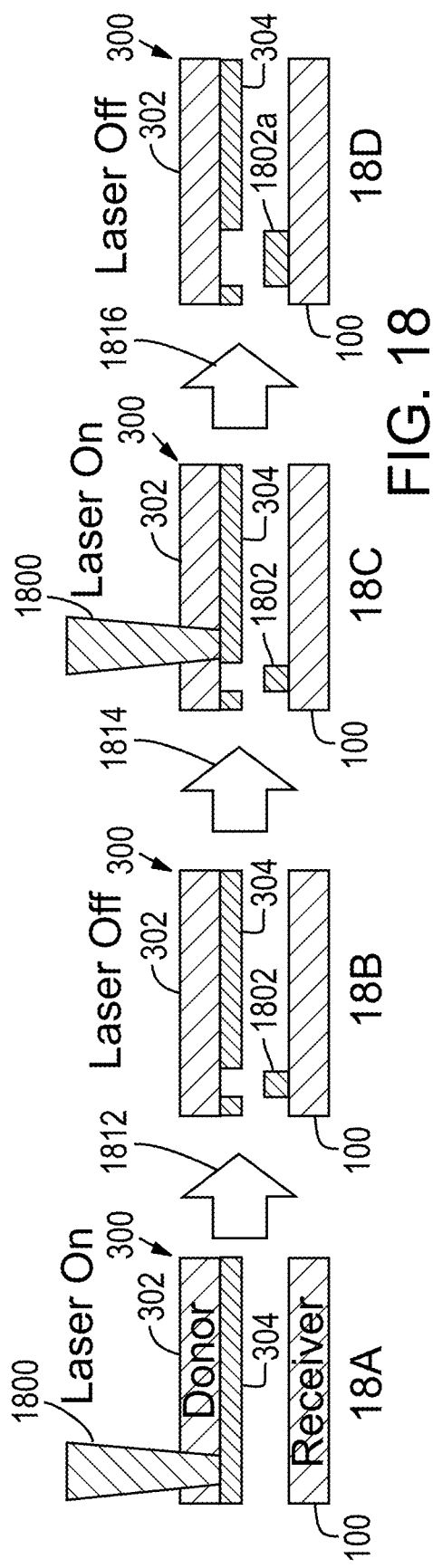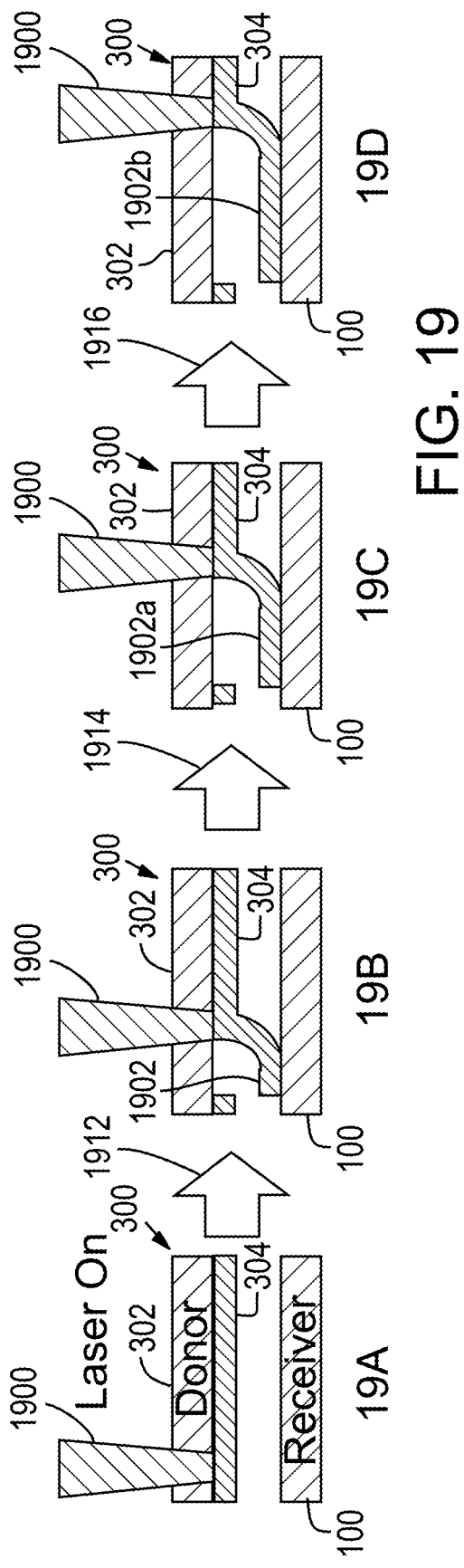

LASER-SEEDING FOR ELECTRO-CONDUCTIVE PLATING

CROSS REFERENCE TO RELATED APPLICATION

This application is PCT National Phase in US which is claims priority benefit from U.S. Provisional Application No. 62/315,913, filed Mar. 31, 2016, and from U.S. Provisional Application No. 62/407,848, filed Oct. 13, 2016, which are both herein incorporated by reference in their entirety.

COPYRIGHT NOTICE

©2018 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

BACKGROUND

I. Technical Field

Embodiments described herein relate generally to formation of conductive lines within substrates. More particularly, embodiments described herein relate to formation of recessed conductive lines within dielectric substrates.

II. Technical Background

Increased demand for high data transmission rates is driving the development of smaller printed circuit board (PCB) features. Electrical circuits are reaching the physical limitations of traditional PCB dielectric materials under which electromagnetic compatibility can be controlled. Additionally, a high-density of features, such as in advanced flip chip packages, require substrates with low coefficient of thermal expansion (CTE), high dimensional stability, high thermal conductivity and suitable dielectric constant. Glass offers a number of advantages in this regard, including that it is very stable in terms of electrical properties, moisture absorption, and aging, and has a CTE similar to that of silicon, making it ideal for IC packaging. Furthermore, the dielectric constant of glass is, in some instances, lower than that of FR4. This, coupled with a low loss tangent, and low materials cost compared to high-performance materials, make glass suitable for high-frequency applications.

Many different approaches have been taken toward the realization of conductive plating of glass substrates, including: chemical vapor deposition, evaporation and sputtering; chemical, mechanical, and laser roughening to improve electro- and electroless plating; laser direct-write techniques, including sintering of metallic powders; and using self-assembled monolayers to better adsorb or bond catalysts for electroless plating. Difficulties with glass metallization arise from chemical and mechanical incompatibilities between brittle, stiff glass and the metal, such as CTE incompatibility and strong interfacial stresses. Smooth glass surfaces present no possibility of mechanical interlocking, so metal films can easily separate from the substrate.

Laser-induced forward transfer (LIFT) is one particular approach that has been used to form conductive metal structures on substrates, and has also been applied toward the deposition of oxides, organics, and biological materials. In LIFT, a layer of the desired material for deposition (i.e., the "donor material," "donor layer," "donor film," etc.) is adhered to a transparent carrier; the combined structure of the transparent carrier (also referred to as the "carrier substrate"); and the donor layer is referred to as the "donor substrate" or "donor structure." A laser is focused through the transparent carrier of the donor onto the material, resulting in transfer of the material to a "receiving" substrate.

The LIFT technique for transferring metallic material was first described in 1987, for the forward transfer of copper onto silica substrates using an ArF excimer laser, and has since been applied to deposit a variety of materials onto many different substrates, including organic and biological materials. Printing of conductive inks and nanopastes has been a focus of recent research into LIFT applications. Techniques that utilize conductive inks offer the promise of a high degree of shape and size control for the deposited material (for example, using spatial light modulators), but the inks themselves have conductivities several orders of magnitude less than their bulk counterparts, some of which can be mitigated through in situ laser curing of the deposited ink. LIFT has also been used for preparing embedded components, by direct-writing conductive inks to make connections between already embedded components, or by using LIFT to place the components themselves. Copper beams can be laser cut, bent, and deposited using LIFT, but require conductive pastes for adhesion.

SUMMARY

This summary is provided to introduce a selection of concepts in a simplified form that are further described in greater detail below. This summary is not intended to identify key or essential inventive concepts of the claimed subject matter, nor is it intended for determining the scope of the claimed subject matter.

In some embodiments, a seed layer is formed on a workpiece, wherein forming the seed layer includes directing a beam of laser energy onto a seed material; and a plating process is performed using the seed layer as a seed to form a conductive feature on the seed layer.

In some alternative, additional, or cumulative embodiments, a donor structure is arranged adjacent to a workpiece, the donor structure comprising a carrier substrate that is transparent to a beam of laser energy and a donor film, wherein the donor film faces toward the workpiece; and a laser-induced forward-transfer (LIFT) process is performed by directing the beam of laser energy through the carrier substrate and onto the donor film, wherein the beam of laser energy is characterized by a pulse repetition rate less than 200 kHz and an average power less than 20 W.

In some alternative, additional, or cumulative embodiments, a donor structure is arranged adjacent to a workpiece, the donor structure comprising a carrier substrate that is transparent to a beam of laser energy and a donor film, wherein the donor film faces toward the workpiece; and a laser-induced forward-transfer (LIFT) process is performed by directing the beam of laser energy through the carrier substrate and onto the donor film, wherein the beam of laser energy is characterized by a pulse repetition rate greater than 10 MHz and an average power greater than 100 W.

In some alternative, additional, or cumulative embodiments, a printed circuit board (PCB), comprises: a glass substrate; recessed features etched into the glass substrate; and a conductive features deposited within the recessed features.

In some alternative, additional, or cumulative embodiments, a workpiece substrate is provided, wherein the workpiece substrate includes a primary surface, wherein the workpiece substrate includes recessed features etched into the workpiece substrate, wherein the recessed features each include a recessed surface, wherein the recessed surface has a roughness that is greater than the roughness of the primary surface, and wherein the recessed features include metallic seed material deposited by a laser-induced forward transfer (LIFT) process; and a plating process is performed using the metallic seed material as a seed to form a conductive feature on the seed material.

In some alternative, additional, or cumulative embodiments, a workpiece substrate is provided, wherein the workpiece substrate includes a primary surface, wherein the workpiece substrate includes recessed features etched into the workpiece substrate, wherein the recessed features each include a recessed surface, and wherein the recessed surface has a roughness that is greater than the roughness of the primary surface; a laser-induced forward transfer (LIFT) process is performed to deposit metallic seed material into the recessed features; and a plating process is performed using the metallic seed material as a seed to form a conductive feature on the seed material.

In some alternative, additional, or cumulative embodiments, a workpiece having a workpiece substrate is provided, wherein the workpiece substrate includes a primary surface, wherein the workpiece substrate includes recessed features etched into the workpiece substrate, wherein the recessed features each include a recessed surface, and wherein the recessed surface has a roughness that is greater than the roughness of the primary surface; a donor structure is arranged adjacent to a workpiece, wherein the donor structure comprises a metallic donor material attached to a carrier substrate that is transparent to a beam of laser energy, and wherein the metallic donor material faces toward the workpiece; and a laser-induced forward-transfer (LIFT) process is performed by directing the beam of laser energy through the carrier substrate to cause metallic donor material to be deposited into the recessed features.

In some alternative, additional, or cumulative embodiments, a workpiece having a workpiece substrate is provided, wherein the workpiece substrate includes a primary surface, wherein the workpiece substrate includes recessed features etched into the workpiece substrate, wherein the recessed features each include a recessed surface, and wherein the recessed surface has a roughness that is greater than the roughness of the primary surface; a metallic ink including a metallic material is deposited into the recessed features etched into the workpiece; and the metallic material is reduced to form conductive features in the recessed features.

In some alternative, additional, or cumulative embodiments, a workpiece having a workpiece substrate is provided, wherein the workpiece substrate includes a primary surface, wherein the workpiece substrate includes recessed features etched into the workpiece substrate, wherein the recessed features each include a recessed surface, and wherein the recessed surface has a roughness that is greater than the roughness of the primary surface; an ink composition is deposited into the recessed features etched into the workpiece, wherein the ink composition includes a metallic material; and a photothermal process is applied to the ink composition to form conductive features in the recessed features.

In some alternative, additional, or cumulative embodiments, a workpiece having a workpiece substrate is provided, wherein the workpiece substrate includes a primary surface, wherein the workpiece substrate includes recessed features etched into the workpiece substrate, wherein the recessed features each include a recessed surface, and wherein the recessed surface has a roughness that is greater than the roughness of the primary surface; an ink composition is deposited into the recessed features etched into the workpiece, wherein the ink composition includes a metallic material; and electrons are supplied to the metallic material in the ink composition to form conductive features in the recessed features.

In some alternative, additional, or cumulative embodiments, the workpiece comprises a glass substrate upon which metallic material is deposited or the seed layer is formed.

In some alternative, additional, or cumulative embodiments, the substrate comprises an amorphous silica-based material that is transparent to visible light.

In some alternative, additional, or cumulative embodiments, the workpiece comprises a glass substrate upon which the seed layer is formed, wherein the glass substrate includes: silica glass, soda-lime glass, borosilicate glass, aluminosilicate glass, aluminoborosilicate glass, or any combination thereof, which optionally includes one or more alkali and/or alkaline earth modifiers.

In some alternative, additional, or cumulative embodiments, the workpiece includes a substrate that includes: alumina, aluminum nitride, beryllium oxide, or any combination thereof, a glass-ceramic, a glass-bonded ceramic, a polymer, a glass-filled polymer, a glass fiber-reinforced polymer, or any combination thereof.

In some alternative, additional, or cumulative embodiments, the workpiece includes a workpiece substrate having a primary surface, wherein the primary surface is a naked primary surface that receives the seed layer.

In some alternative, additional, or cumulative embodiments, the workpiece includes a workpiece substrate having a primary surface, wherein the seed layer is formed within a recessed feature that is recessed with respect to the primary surface, wherein the recessed feature includes at least one of a recessed sidewall surface and a recessed bottom surface.

In some alternative, additional, or cumulative embodiments, at least one of the recessed sidewall surface and the recessed bottom surface are naked surfaces that receive the seed layer.

In some alternative, additional, or cumulative embodiments, at least one of the recessed sidewall surface and the recessed bottom surface has a roughness that is greater than the roughness of the primary surface.

In some alternative, additional, or cumulative embodiments, at least one of the recessed sidewall surface and the recessed bottom surface has a roughness (Ra) that is greater than or equal to 500 nm, that is between 500 nm and 1500 nm, or the like.

In some alternative, additional, or cumulative embodiments, the recessed feature comprises a trench, blind via, or through hole via.

In some alternative, additional, or cumulative embodiments, the seed layer is inorganic, includes copper, or the like.

In some alternative, additional, or cumulative embodiments, forming the seed layer comprises depositing globules of seed material, wherein the globules have a diameter that is smaller than 10 μm, that is smaller than 2 μm, that is smaller than 1 μm, that is greater than 100 nm, or the like.

In some alternative, additional, or cumulative embodiments, the globules impact the substrate at a velocity greater than 50 m/s, at a velocity greater than 100 m/s, at a velocity greater than 400 m/s, or the like.

In some alternative, additional, or cumulative embodiments, the globules penetrate the substrate to a depth greater than 1 micron.

In some alternative, additional, or cumulative embodiments, the seed layer is formed in the presence of one or more ambient conditions of light, temperature, pressure, and atmospheric composition.

In some alternative, additional, or cumulative embodiments, performing the plating comprises performing an electroless plating process.

In some alternative, additional, or cumulative embodiments, the conductive feature comprises copper.

In some alternative, additional, or cumulative embodiments, the donor material or the metallic material comprises gold, aluminum, titanium, tungsten, copper, nickel, chromium, platinum, palladium, germanium, selenium, or the like, oxides thereof, nitrides thereof, an alloy thereof, or any other combination thereof.

In some alternative, additional, or cumulative embodiments, the donor film has a thickness in a range from 0.01 μm to 250 μm, in a range from 0.1 μm to 250 μm, in a range from 0.01 μm to 1 μm, in a range from 0.1 μm to 1 μm, greater than or equal to 1 μm, greater than or equal to 2 μm, greater than or equal to 3 μm, or the like.

In some alternative, additional, or cumulative embodiments, the conductive feature is formed in a recessed feature of the workpiece, and wherein the conductive feature has a width smaller than 12 μm, smaller than 9 μm, smaller than or equal to 5 μm, or the like.

In some alternative, additional, or cumulative embodiments, the conductive feature is formed in a recessed feature of the workpiece, and wherein the conductive feature has a depth smaller than or equal to 5 μm, smaller than or equal to 1 μm, or the like.

In some alternative, additional, or cumulative embodiments, the conductive feature has a length greater than or equal to 1 mm.

In some alternative, additional, or cumulative embodiments, the workpiece includes a workpiece substrate, wherein multiple conductive features are formed in the workpiece substrate at a pitch of less than or equal to 12 μm, less than or equal to 9 μm, less than or equal to 5 μm, or the like.

In some alternative, additional, or cumulative embodiments, the conductive feature comprises copper, wherein the conductive feature has width smaller than or equal to 25 μm, wherein the conductive feature has a depth smaller than or equal to 25 μm, wherein the conductive feature has a length greater than or equal to 5 mm, and wherein the conductive feature has a resistivity less than or equal to 1.5 times that of bulk copper.

In some alternative, additional, or cumulative embodiments, the workpiece includes a workpiece substrate that has a thickness, and wherein the depth the conductive feature has a depth equal to the thickness of the workpiece substrate to form a conductive through hole through the workpiece substrate.

In some alternative, additional, or cumulative embodiments, any cross section of the conductive feature exhibits an absence of voids when viewed through an optical microscope at 150× magnification.

In some alternative, additional, or cumulative embodiments, at least one of the conductive features forms a high-frequency circuit component, forms an antenna for a mobile phone, or the like.

In some alternative, additional, or cumulative embodiments, the beam of laser energy for depositing seed material has a wavelength shorter than 550 nm.

In some alternative, additional, or cumulative embodiments, the beam of laser energy is characterized by a pulse repetition rate less than 200 kHz and an average power less than 20 W, by a pulse repetition rate greater than 10 MHz and an average power greater than 100 W, or the like.

In some alternative, additional, or cumulative embodiments, the workpiece has a primary surface and recessed features, wherein the beam of laser energy deposits seed material into the recessed features without depositing seed material onto the primary surface.

In some alternative, additional, or cumulative embodiments, forming the seed layer comprises: providing an ink on the workpiece, the ink comprising a metal oxide and a reducing agent; and chemically reducing the metal oxide by irradiating the ink with the beam of laser energy.

In some alternative, additional, or cumulative embodiments, the step of etching the substrate and the step of depositing metallic material are performed simultaneously or substantially simultaneously.

In some alternative, additional, or cumulative embodiments, forming the seed layer comprises: providing a donor structure comprising a carrier substrate that is transparent to the beam of laser energy and a donor film, wherein the donor film faces toward the workpiece; and directing the beam of laser energy through the carrier substrate to impinge a portion of the donor film such that at least a portion of the donor film impinged by the laser energy is transferred onto the workpiece In some alternative, additional, or cumulative embodiments, the donor film is inorganic.

In some alternative, additional, or cumulative embodiments, the portion of the donor film impinged by the laser energy is ejected from the donor structure onto the workpiece.

In some alternative, additional, or cumulative embodiments, the portion of the donor film impinged by the laser energy is heated to flow from the donor structure onto the workpiece.

In some alternative, additional, or cumulative embodiments, the donor structure is spaced apart from the workpiece during formation of the seed layer.

In some alternative, additional, or cumulative embodiments, the donor material or metallic material is deposited onto the workpiece from a distance of less than 10 μm, less than 5 μm, less than 1 μm, less than 500 nm, less than 100 nm, or the like.

In some alternative, additional, or cumulative embodiments, the donor structure contacts the workpiece during formation of the seed layer.

In some alternative, additional, or cumulative embodiments, the donor structure includes an adhesive between the carrier substrate and the donor film.

In some alternative, additional, or cumulative embodiments, the deposited material has properties that are more similar to a bulk metal than sintered nanoparticles of the same metal.

In some alternative, additional, or cumulative embodiments, the beam of laser energy has a focal point, and wherein the focal point of the beam of laser energy is positioned between the carrier substrate and the donor film or wherein the focal point of the beam of laser energy is positioned at an interface between the carrier substrate and the donor film.

In some alternative, additional, or cumulative embodiments, a recessed feature is formed in the workpiece to receive the seed layer, and wherein the recessed feature is created by application of a laser-machining beam.

In some alternative, additional, or cumulative embodiments, the laser-machining beam includes laser pulses having a pulsewidth shorter than 500 ps, shorter than 1 ps, or the like.

In some alternative, additional, or cumulative embodiments, the laser-machining beam for etching the substrate has a wavelength shorter than 550 nm.

In some alternative, additional, or cumulative embodiments, the workpiece includes a workpiece substrate having a primary surface, wherein the laser-machining beam for etching the substrate forms part of a laser-machining system, wherein the laser-machining beam has a focal point, wherein the laser-machining system employs sensor feedback to maintain a predetermined elevation range between the focal point of the laser-machining beam and the primary surface.

In some alternative, additional, or cumulative embodiments, a pulsed laser is employed to provide the beam of laser energy that impinges the donor material.

In some alternative, additional, or cumulative embodiments, a continuous wave (CW) laser and/or a quasi-continuous wave (QCW) laser is employed to provide the beam of laser energy that impinges the donor material.

In some alternative, additional, or cumulative embodiments, the deposited metallic material is used to form a wire mesh. The wire mesh is employed in a display, touch screen, photovoltaic device, solar cell, photodetector, or anti-fogging device In some alternative, additional, or cumulative embodiments, the substrate of the workpiece and the conductive features exhibit a sheet resistance of less than or equal to 1 $\Omega\square^{-1}$ (ohm per square) and optical transmission greater than or equal to 90%.

In some alternative, additional, or cumulative embodiments, the substrate of the workpiece is flexible.

In some alternative, additional, or cumulative embodiments, the workpiece includes a workpiece substrate having a primary surface, wherein the workpiece substrate includes recessed features etched into the workpiece substrate, wherein the recessed features include at least a recessed sidewall surface and a recessed bottom surface, wherein at least one of the recessed sidewall surface and the recessed bottom surface has a roughness that is greater than the roughness of the primary surface, wherein the seed material comprises a metallic material, wherein seed material is deposited by a laser-induced forward transfer (LIFT) process into the recessed features, wherein the plating process forms conductive features in the recessed features, wherein the conductive features have a width smaller than or equal to 12 μm and a length greater than 250 μm, wherein spaced apart conductive features have a pitch smaller than or equal to 12 μm, and wherein any cross section of the conductive features exhibits an absence of voids when viewed through an optical microscope at 150× magnification.

Additional aspects and advantages will be apparent from the following detailed description of exemplary embodiments, which proceeds with reference to the accompanying drawings.

BRIEF DESCRIPTION OF THE DRAWINGS

FIG. 18 is a flow diagram of an exemplary alternative LIFT process, demonstrating laser gating for depositing a pattern voxel by voxel.

FIG. 19 is a flow diagram of an exemplary alternative LIFT process, demonstrating continuous relative motion of a beam axis for depositing a pattern.

DETAILED DESCRIPTION OF EXEMPLARY EMBODIMENTS

Figure 1:
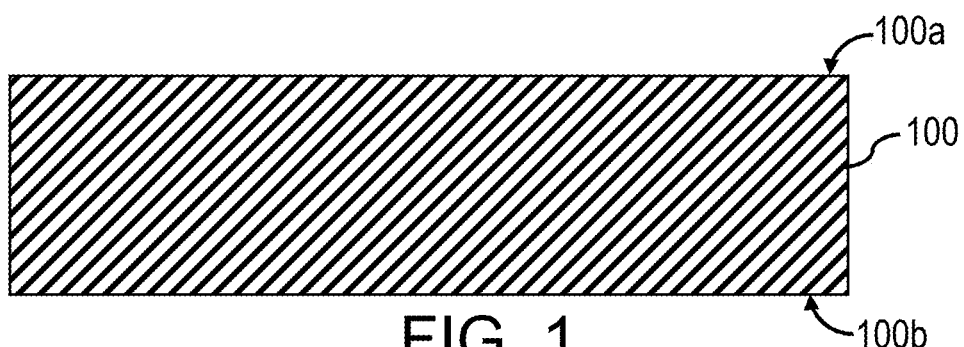
FIG. 1 is a cross-sectional view of a workpiece having first and second surfaces.

Example embodiments are described below with reference to the accompanying drawings. Unless otherwise expressly stated, in the drawings the sizes, positions, etc., of components, features, elements, etc., as well as any distances therebetween, are not necessarily to scale, and may be disproportionate and/or exaggerated for clarity.

The terminology used herein is for the purpose of describing particular example embodiments only and is not intended to be limiting. As used herein, the singular forms "a," "an" and "the" are intended to include the plural forms as well, unless the context clearly indicates otherwise. It should be recognized that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise specified, a range of values, when recited, includes both the upper and lower limits of the range, as well as any sub-ranges therebetween. Unless indicated otherwise, terms such as "first," "second," etc., are only used to distinguish one element from another. For example, one node could be termed a "first node" and similarly, another node could be termed a "second node", or vice versa. The section headings used herein are for organizational purposes only and are not to be construed as limiting the subject matter described.

Unless indicated otherwise, the term "about," "thereabout," etc., means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

Spatially relative terms, such as "below," "beneath," "lower," "above," and "upper," and the like, may be used herein for ease of description to describe one element or feature's relationship to another element or feature, as illustrated in the figures. It should be recognized that the spatially relative terms are intended to encompass different orientations in addition to the orientation depicted in the figures. For example, if an object in the figures is turned over, elements described as "below" or "beneath" other elements or features would then be oriented "above" the other elements or features. Thus, the exemplary term "below" can encompass both an orientation of above and below. An object may be otherwise oriented (e.g., rotated 90 degrees or at other orientations) and the spatially relative descriptors used herein may be interpreted accordingly.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

Many different forms and embodiments are possible without deviating from the spirit and teachings of this disclosure and so this disclosure should not be construed as limited to the example embodiments set forth herein. Rather, these example embodiments are provided so that this disclosure will be thorough and complete, and will convey the scope of the disclosure to those skilled in the art.

I. OVERVIEW

According to some embodiments discussed herein, methods for metallization of glass and other dielectric materials can involve LIFT of metallic foils onto workpiece surfaces to form seeds for a subsequent plating process, thereby forming strongly anchored conductive patterns. The embodiments disclosed herein allow for plating of conductive traces, vias, and other structures in single- or multi-layer all-glass structures and multilayer mixed-material structures. The disclosed embodiments also allow for the formation of other structures (e.g., which may be electrically conductive, electrically insulative, electrically semiconductive, etc.), for the embedding of active or passive electronic components, or the like, or any combination thereof.

II. DISCUSSION

FIG. 1 is a cross-sectional view of a workpiece 100. Referring to FIG. 1, in one embodiment, the workpiece 100 is formed of a material such as glass, which may be strengthened (e.g., thermally, chemically, by one or more ion exchange processes, or some combination thereof) or unstrengthened. Exemplary types of glass from which the workpiece 100 may be formed include fused silica glass, soda-lime glass, borosilicate glass, aluminosilicate glass, aluminoborosilicate glass, or the like, or any combination thereof, which may optionally include one or more alkali and/or alkaline earth modifiers. In addition to (or as an alternative to glass), the workpiece 100 may be formed of a material such as a ceramic (e.g., alumina, aluminum nitride, beryllium oxide, or the like or any combination thereof), a glass-ceramic, a glass-bonded ceramic, a polymer (e.g., a polyamide, a polyimide, or the like or any combination thereof), a glass-filled polymer, a glass fiber-reinforced polymer, or the like or any combination thereof. In some embodiments, the workpiece 100 can be provided as any suitable or known PCB. A surface of the workpiece 100 (e.g., a first workpiece surface 100a) may be flat, curved, or the like or any combination thereof.

Figure 2:
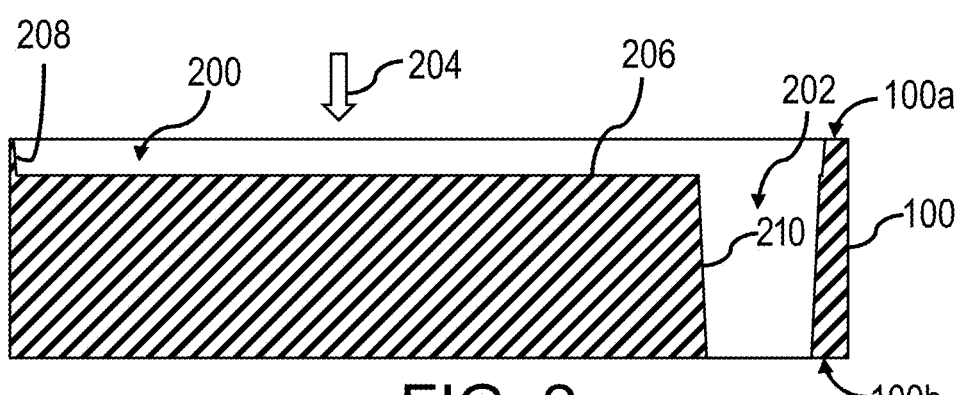
FIG. 2 is a cross-sectional view of a workpiece having exemplary features such as a trench and a through via.

FIG. 2 is a cross-sectional view of the workpiece 100 having exemplary features. Referring to FIG. 2, one or more features such as a trench (e.g., trench 200), a through via (e.g., through via 202), a blind via (not shown), a slot, a groove, or the like or any combination thereof, may be formed in the workpiece 100 so as to extend from the first workpiece surface 100a, a second workpiece surface 100b (e.g., opposite the first workpiece surface 100a), or both the first workpiece surface 100a and the second workpiece surface 100b. Both the first workpiece surface 100a and the second workpiece 100b can be considered to be a primary surface. Thus, although FIG. 2 illustrates the trench 200 as extending from first workpiece surface 100a, it will be appreciated that the trench 200 may be formed so as to extend from the second workpiece surface 100b. Although FIG. 2 illustrates the trench 200 as communicating with the through via 202, it will be appreciated that the trench 200 may communicate with a blind via or may be separated from the through via 202 (e.g., by a portion of the workpiece 100) or the blind via.

The aforementioned features (also referred to herein as a "workpiece feature" or "recessed feature") can be formed by one or more suitable processes (e.g., chemical etching, reactive ion etching, mechanical drilling, water jet cutting, abrasive jet cutting, laser processing, or the like or any combination thereof). In one embodiment, the features are formed by directing a beam of laser energy (e.g., manifested as a continuous beam of laser energy, as a series of pulses of laser energy—also referred to herein as "laser pulses", or the like or any combination thereof) onto the workpiece 100, and causing relative movement between the workpiece 100 and the beam axis of the laser-machining beam 204 (e.g., represented in FIG. 2 by an arrow). Relative movement may be induced by moving the workpiece 100, by moving the laser-machining beam 204 (e.g., by moving a scan head from which the laser-machining beam 204 is output, by deflecting the laser-machining beam 204 with a one or more galvanometer mirrors (also known as "galvos"), one or more spinning polygon mirrors, one or more fast-steering mirrors, one or more acousto-optic deflectors, one or more electro-optic deflectors, or the like or any combination thereof), or the like or any combination thereof.

When formed by laser processing, a workpiece feature can be formed using a laser-processing system such as those manufactured by ELECTRO SCIENTIFIC INDUSTRIES, INC. of Portland, Oreg. (e.g., the LODESTONE™ system, the GEMSTONE™ system, the CORNERSTONE™ system, the NVIANT™ system, the 5335™ system, etc.). Exemplary systems that may be used to form one or more workpiece features in the workpiece 100, and laser-processing methods that may be used to form one or more workpiece features in the workpiece 100, are also described in U.S. Pat. Nos. 7,259,354, 8,237,080, 8,350,187, 8,404,998, 8,648,277, 9,227,868, or in U.S. Patent App. Pub. Nos. 2010/0252959, 2014/0197140, 2014/0263201, 2014/0263212 and 2014/0312013, or any combination thereof, each of which is incorporated herein by reference in its entirety. U.S. Pat. No. 8,648,277, in particular, is directed to forming recessed features suitable for providing electrically conductive traces with controlled signal propagation characteristics.

For purposes of discussion herein, when laser energy is used to form a feature in the workpiece 100, the laser-machining beam may be directed (e.g., along a beam axis) so as to be incident upon the workpiece 100 at the first workpiece surface 100a. If, considering the thickness of the workpiece 100 and the material from which the workpiece 100 is formed, at least some laser energy incident upon the first workpiece surface 100a thereafter propagates through the workpiece 100 so as to exit the workpiece 100 through the second workpiece surface 100b, the workpiece 100 is hereinafter considered to be a "transparent workpiece." If, considering the thickness of the workpiece 100 and the material from which the workpiece 100 is formed, none of the laser energy incident upon the first workpiece surface 100a exits the workpiece 100 through the second workpiece surface 100b, the workpiece 100 is hereinafter considered to be an "opaque workpiece."

In some embodiments, the laser-machining beam 204 is focused (e.g., by a scan lens, as is known in the art). If the workpiece 100 is a transparent workpiece, then the beam of laser energy may be focused to produce a beam waist located (at an elevation) at or above the first workpiece surface 100a, at or below the second workpiece surface 100b, within the workpiece 100 (e.g., so as to be spaced from the first workpiece surface 100a and the second workpiece surface 100b). During formation of the workpiece feature, the location or elevation of the beam waist (e.g., along the beam axis) may be changed to maintain a proper or desired spatial relationship between the beam waist and targeted positions across the workpiece 100 to enable or otherwise facilitate formation of one or more features within the workpiece 100.

Generally, the directed laser-machining beam 204 is characterized by one or more parameters such as wavelength, spot size, spatial intensity profile, temporal intensity profile, pulse energy, average power, peak power, fluence, pulse repetition rate, pulse duration (i.e., based on the full-width at half-maximum (FWHM) of the optical power in the pulse versus time), scan speed (e.g. relative motion between the beam axis and the workpiece 100) or the like or any combination thereof. These parameters may be selected or otherwise controlled to enable or otherwise facilitate processing (e.g., via boiling, via electron heating, lattice heating, melting, evaporation, sublimation, surface electron emission, impact ionization, multi-photon absorption, or the like or any combination thereof) of the substrate of the workpiece 100 to form one or more features therein. Example processes that may performed upon directing the laser-machining beam 204 include one or more processes such as boiling, electron heating, lattice heating, melting, evaporation, sublimation, surface electron emission, impact ionization, ablation (e.g., due to linear or non-linear absorption of laser light), or the like or any combination thereof. An example of non-linear absorption includes multi-photon absorption. As used herein, the term "spot size" refers to the diameter or maximum spatial width of a laser pulse at a location where the beam axis traverses a region of the workpiece 100 that is to be, at least partially, processed by the laser pulse.

In some embodiments, the laser-machining beam 204 is manifested as a series of laser pulses each having a pulse duration between 1 fs and 100 µs. In some embodiments, the laser-machining beam 204 is manifested as a series of laser pulses each having a pulse duration between 1 fs and 1 µs. In some embodiments, the laser-machining beam 204 is manifested as a series of laser pulses each having a pulse duration shorter than 500 ns. In some embodiments, the laser-machining beam 204 is manifested as a series of laser pulses each having a pulse duration between 1 fs and 1 ns. In some embodiments, the laser energy 204 is manifested as a series of laser pulses each having a pulse duration shorter than 500 ps. In some embodiments, the laser-machining beam 204 is manifested as a series of laser pulses each having a pulse duration shorter than 50 ps. In some embodiments, the laser-machining beam 204 is manifested as a series of laser pulses each having a pulse duration shorter than 1 ps. In some embodiments, the laser-machining beam 204 is manifested as a series of laser pulses each having a pulse duration between 10 fs and 1 ps.

Once formed, the spatial extent of the workpiece feature within the workpiece 100 can be characterized as being defined by one or more surfaces. For example, and with reference to FIG. 2, the spatial extent (e.g., depth) of the trench 200 may be defined by a trench bottom surface 206 and a trench sidewall surface 208. Likewise, the spatial extent (e.g., depth) of the through via 202 may be defined by a via sidewall surface 210. Surfaces of workpiece features, such as aforementioned surfaces 206, 208 and 210, may herein be generally referred to as "feature surfaces." Depending upon the manner with which a workpiece feature is formed, a feature surface may be different in terms of one or more characteristics (e.g., surface roughness, free-electron density, chemical composition, or the like or any combination thereof) than another surface of the workpiece 100 that was not subject to processing to form a workpiece feature. For example, a feature surface of a workpiece feature formed in a workpiece may be rougher than a surface of the workpiece that was not subject to processing to form a workpiece feature.

Figure 3:
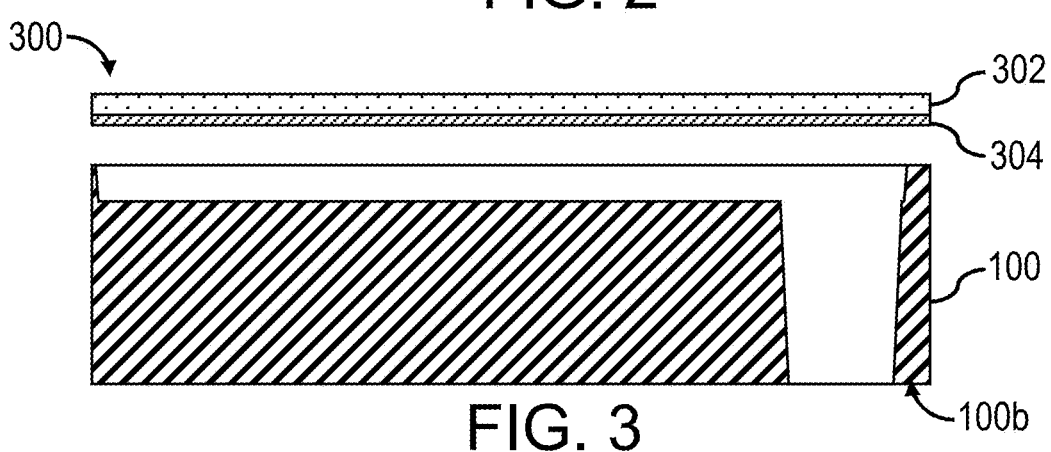
FIG. 3 is a cross-sectional view of an exemplary donor structure positioned over a workpiece with features.

FIG. 3 is a cross-sectional view of an exemplary donor structure 300 positioned over a workpiece 100 with features. Referring to FIG. 3, in many embodiments, a donor structure 300 is disposed over the first workpiece surface 100a. The donor structure 300 includes a carrier substrate 302 and a donor film 304 adhered or otherwise fixed to the carrier substrate 302 (e.g., either directly, or indirectly via an intermediate layer—not shown—such as a dynamic release layer or other sacrificial layer, such as glue). In the illustrated embodiment, the donor structure 300 is arranged such that the donor film 304 is spaced apart from the workpiece 100. In another embodiment, the donor structure 300 is arranged such that the donor film 304 contacts the workpiece 100 (e.g., at the first workpiece surface 100a).

The donor structure 300 may be provided as a substantially rigid plate, or as a flexible film structure (e.g., capable of being indexed in a roll-to-roll manufacturing process). The carrier substrate 302 is typically formed of a material that is transparent to the wavelength of laser energy directed to the donor structure 300 in a subsequent step. For example, the substrate 302 can be formed of a material such as fused silica glass, borosilicate glass, a transparent polymer, or the like or any combination thereof. Generally, the donor film 304 is formed of a material such as gold, aluminum, titanium, tungsten, copper, nickel, chromium, platinum, palladium, germanium, selenium, or the like, oxides thereof, nitrides thereof, an alloy thereof, or any other combination thereof. In other embodiments, however, the donor film 304 includes at least one material selected from the group consisting of a paste, gel, ink, or the like. The paste, gel, ink, etc., may optionally include one or more metallic colloids, particles, crystals (e.g., microcrystals, nanocrystals, etc.), which may be solution-deposited, spin-coated, screen-printed, blade-deposited, etc., onto the carrier substrate 302. The donor film 304 may be formed to a thickness in a range from 0.01 µm to 250 µm. The donor film 304 may be formed to a thickness in a range from 0.1 µm to 250 µm. In one embodiment, the donor film 304 is formed to a thickness in a range from 0.01 µm to 1 µm. In one embodiment, the donor film 304 is formed to a thickness in a range from 0.1 µm to 1 µm.

Figure 4:
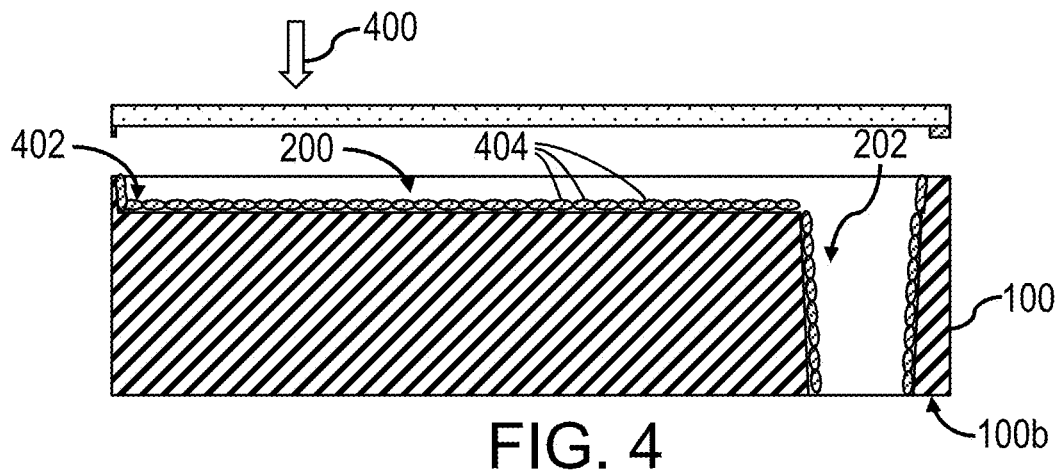
FIG. 4 is a cross-sectional view showing an exemplary transfer of donor material from a donor structure onto exposed surfaces within the features of a workpiece.

FIG. 4 is a cross-sectional view showing an exemplary transfer of donor material from a donor structure 300 onto exposed surfaces 206, 208, and 210 within the features of the workpiece 100. Referring to FIG. 4, laser energy 400 is directed (e.g., as a continuous beam of laser energy 400, or as a series of laser pulses) through the carrier substrate 302 to illuminate the back surface of the donor film 304 as represented by as arrow. The laser energy 400 may be focused or unfocused. Generally, however, characteristics of the laser energy 400 (e.g., wavelength, average power, peak power, pulse energy, pulse repetition rate, spot size at the donor film 304, fluence at the donor film 304, scan rate of relative movement between the beam axis and the workpiece 100 or the like, or any combination thereof) are selected so as to ablate, eject or otherwise dislodge a portion of the donor film 304 from the donor structure 300 toward the workpiece 100, so as to form a "layer" of deposited material 402 (also referred to as seed material) on the workpiece 100 (e.g., on one or more surfaces of a feature such the trench 200 and the via 202).

Skilled persons will appreciate that the laser energy 400 may be provided from the same laser source as that of the laser-machining beam 204. However, the laser energy 400 may be provided from a different laser source from that of the laser-machining beam 204. In embodiments where the laser source is the same for both process steps, at least some of the laser parameters will be different. If different lasers are used for both process steps, then at least some of the laser parameters will be different. For example, the laser-machining beam 204 may provide laser pulses having a shorter pulsewidth than that of the pulses provided by the beam of laser energy 400.

The layer of deposited material 402 may be formed of particles or globules 404 such that the deposited layer is continuous or discontinuous. In many embodiments, the particles or globules 404 of deposited material are larger than the size of particles that would be created through a doping or ion implantation process. In some embodiments, the globules have a diameter that is greater than 50 nm. In some embodiments, the globules have a diameter that is greater than 100 nm. In some embodiments, the globules have a diameter greater than 1 µm. In some embodiments, the globules have a diameter that is greater than or equal to 25 µm. In some embodiments, the globules have a diameter that is smaller than or equal to 25 µm. In some embodiments, the globules have a diameter that is smaller than 10 µm. In some embodiments, the globules have a diameter that is smaller than 2 µm. In some embodiments, the globules have a diameter that is smaller than 1 µm.

In some embodiments, the laser energy 400 is manifested as a series of laser pulses each having a pulse duration between 1 fs and 100 µs. In some embodiments, the laser energy 400 is manifested as a series of laser pulses each having a pulse duration greater than 10 fs. In some embodiments, the laser energy 400 is manifested as a series of laser pulses each having a pulse duration between 500 fs and 1 µs. In some embodiments, the laser energy 400 is manifested as a series of laser pulses each having a pulse duration greater than 800 fs. In some embodiments, the laser energy 400 is manifested as a series of laser pulses each having a pulse duration between 1 ps and 500 ns. In some embodiments, the laser energy 400 is manifested as a series of laser pulses each having a pulse duration shorter than 100 ns. In some embodiments, the laser energy 400 is manifested as a series of laser pulses each having a pulse duration between 500 ps and 100 ns.

In some embodiments, the pulse energy is set to be sufficiently high so that a single pulse can ablate, eject or otherwise dislodge the entire thickness of the donor film 304 from a region of the donor structure 300 that is illuminated by the directed laser energy. Doing so can enable rapid movement of the beam to reduce or otherwise minimize overlap of sequentially directed pulses of the applied laser energy. Depending upon characteristics of the applied laser energy 400, material can be deposited onto the workpiece 100 (e.g., along a desired trajectory) at a rate in a range from 1 mm/s to 5000 mm/s. In some embodiments, material is deposited onto the workpiece 100 (e.g., along a desired trajectory) at a rate in a range from 250 mm/s to 3000 mm/s (e.g., 700 mm/s). In some embodiments, material can be deposited onto the workpiece 100 (e.g., along a desired trajectory) at a rate in a range from 500 mm/s to 2500 mm/s.

Although FIG. 4 illustrates an embodiment in which a single layer of deposited material 402 (e.g., copper) onto the workpiece 100, skilled persons will appreciate that multiple layers of deposited material may be deposited on the workpiece 100 (e.g., so as to form a stack of layers of deposited material). Within a stack, different layers may be formed of the same material (e.g., copper) or from different materials. When different materials are deposited, one or more layers of material (e.g., acting as a barrier layer formed of titanium nitride, tantalum nitride, etc.) may be initially deposited and, thereafter, one or more layers of material (e.g., acting as a seed layer formed of copper) may be deposited thereafter.

Although FIG. 4 illustrates an embodiment in which a layer of deposited material 402 is formed within a feature formed in the workpiece 100, and not on the first workpiece surface 100a, it will be appreciated that the layer of deposited material 402 may be formed outside of a feature (e.g., on the first workpiece surface 100a).

Figure 7:
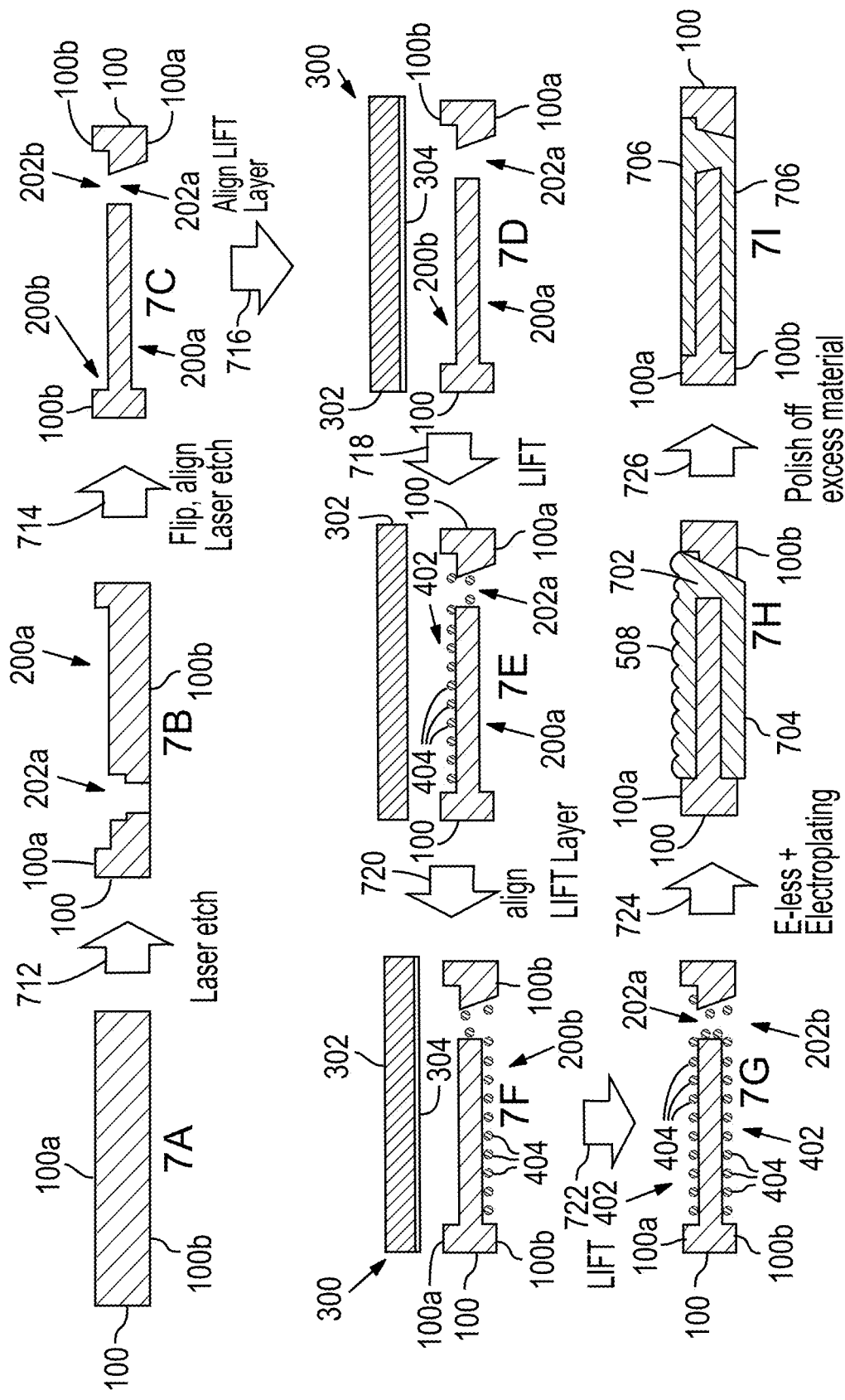
FIG. 7 is an exemplary process flow diagram for forming a structure having two-layers of conductive material in a single layer of a dielectric substrate.

If one or more features are formed in the second workpiece surface 100b, the workpiece 100 may be flipped over and the process described above may be repeated so as to form a layer of deposited material on the workpiece 100 (e.g., on one or more surfaces of a feature formed in the second workpiece surface 100b). (A simplified process flow diagram for two-side process is shown in FIG. 7.)

In an alternative embodiment for a LIFT process, instead of transferring material from the donor substructure 300 to form the layer of deposited material 402, a deposited material (e.g., an organometallic precursor material, copper or copper ions embedded in polymeric material, a film or paste containing cupric oxide (CuO), etc.) 402 may be deposited onto the substrate 100 (e.g., into the features formed in the first workpiece surface 100a) and thereafter be irradiated with laser energy having one or more characteristics sufficient to convert the precursor material into a barrier layer, a seed layer, or the like or any combination thereof. For example, a film or paste of an ink containing CuO (e.g., 100 nm-100 µm thick) can be printed onto, spin coated, painted on, or doctor-bladed to fill the workpiece features. The CuO ink can then be transformed to elemental copper in the presence of a liquid or gas-phase reducing agent, such as hydrogen gas, hydrogen/nitrogen mixtures, ethanol vapors, or methanol vapors. For example, hot ethanol vapors have been used to reduce thin CuO layers on copper (Satta et al., *J. Electrochem. Soc.* 2003, 150 (3), G300-G306). The reduction reactions may proceed through intermediate oxidation states of copper.

This print and convert process (which may also be referred to as photothermal plating) may be substituted for any of the LIFT steps described with respect to any of the embodiments. In some embodiments, this photothermal plating process may replace or supplement a LIFT step and/or a plating step described with respect to any of the embodiments. For example, this photothermal plating process may be performed instead of a plating process or instead of both the LIFT process and the plating process. It is also noted that when the chemical reactivity described above is promoted by a laser, the substrate material of the workpiece 100 may also be removed during the same step when the seed layer is created.

Figure 5A:
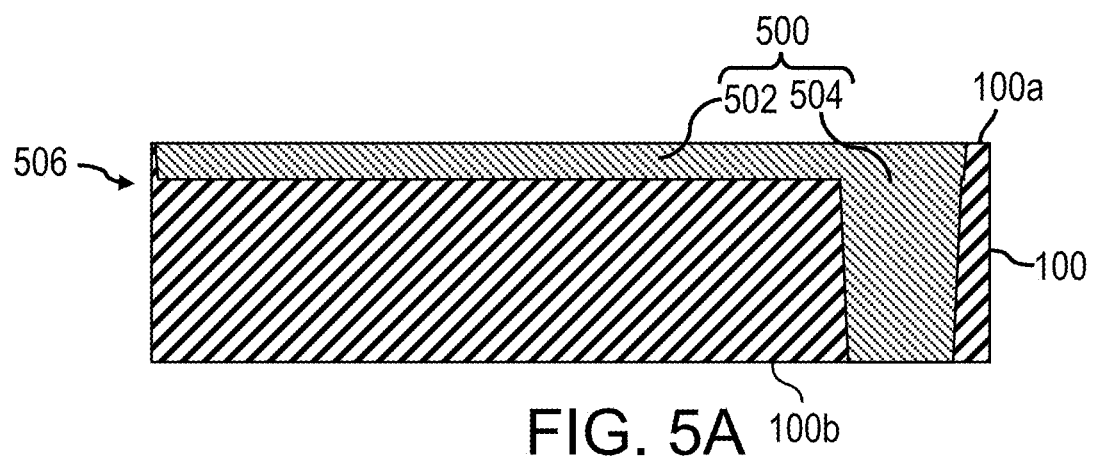
FIG. 5A is a cross-sectional view showing an exemplary result of a plating process conducted over the donor material formed on the surfaces of the features in the workpiece.

FIG. 5A is a cross-sectional view showing an exemplary result of a plating process conducted over the donor material formed on the surfaces 206, 208, and 210 of the features in the workpiece 100. Referring to FIG. 5A, the workpiece having the layer(s) of deposited material formed thereon is subjected to a plating process to form a conductive feature, such as conductive feature 500. As shown in FIG. 5A, conductive feature 500 includes a conductive line 502 disposed in the trench 200 and a conductive via plug 502 disposed in the via 202. The conductive feature 500 may be formed of the same material as any layer of deposited material 402. For example, the conductive feature 500 may be formed of the same material as a previously-deposited seed layer. The plating process may include an electroplating process, an electroless plating process, or the like or any combination thereof.

The upper surface of a conductive feature (e.g., conductive feature 500) formed as a result of the plating process can be recessed (e.g., relative to the first workpiece surface 100a), or be coplanar with the workpiece surface (e.g., the first workpiece surface 100a, as shown). In one embodiment, the upper surface of a conductive feature may, initially, protrude outside a feature such as a trench or via. In such an embodiment, etch-back or chemical-mechanical polishing (CMP) process may be performed to flatten or recess the conductive feature.

Figure 5B:
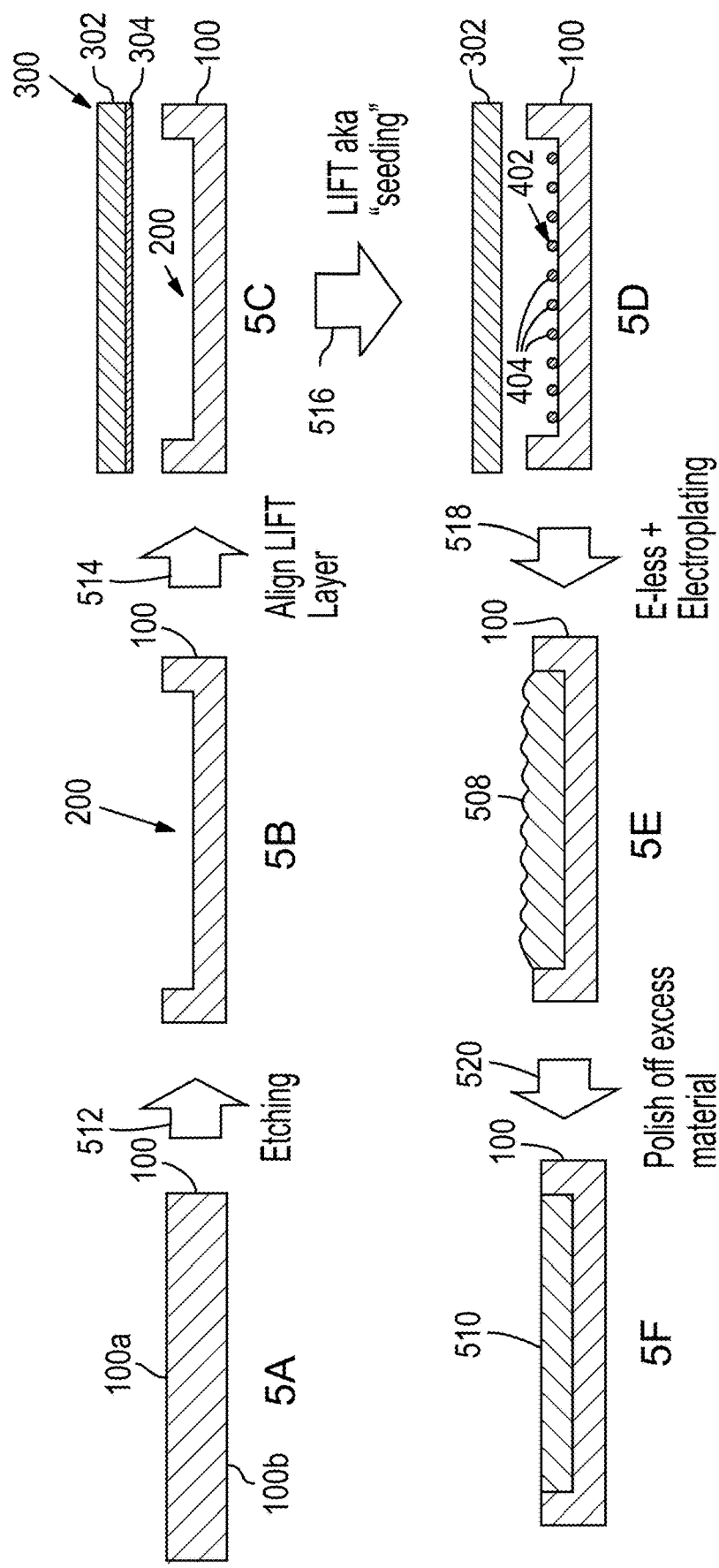
FIG. 5B is an exemplary process flow diagram for forming a wire in a substrate.

FIG. 5B is an exemplary simplified flow diagram for a process for forming and plating a trench 200 to form a conductive line (also referred to as a wire) in a substrate of a workpiece 100. With reference to FIG. 5B, an exemplary process initiation condition 5A shows the substrate of the workpiece 100 that can be any semiconductor manufacturing material, particularly any wafer or PCB workpiece material and especially any dielectric or glass material as previously discussed. The substrate of workpiece 100 can be rigid or flexible. In step 512, the workpiece 100 is etched to form one or more recessed features, such as one or more trenches 200. As previously discussed, the etching may be achieved by a "direct write" laser process without lithographic techniques or without lithographic masking layers, or the etching may be achieved by conventional techniques.

The laser process may be ablative or non-ablative, depending on the properties of the substrate material and the laser parameters.

An etched substrate is shown in process condition 5B. In some embodiments, the resulting features have bottom surfaces 206 and side wall surfaces 208 that are rougher than the primary surface 100a, especially if the substrate consists of glass. If the substrate is glass and is etched by conventional lithographic processes, the etching process may additionally employ a roughening step. The roughening step may employ a laser directed solely at the trench 200 with a mask on the primary surface 100a, or the primary surface 100a may be masked while the trench is treated by a laser beam (with a spot size larger than the trench width) or by chemical means.

In step 514, a donor structure for a LIFT process is aligned over the workpiece 100. In some embodiments, the donor film 304 may be a contiguous layer of donor material, such as copper foil. In such embodiments, alignment of the donor structure 300 need not be precise even though the alignment of the laser beam axis to the workpiece 100 and particularly to the features, such as the trenches 200, is precise. In other embodiments, the donor film 304 may be previously patterned by laser or lithographic processes to match the features, such as the trenches 200. In such embodiments, the alignment of the donor structure 300 and particularly the patterned traces of the donor film 304 are precisely aligned to the workpiece 100 and particularly the features, and these are also precisely aligned to the beam axis. Process condition 5C shows the donor structure 300 aligned to the workpiece 100.

In step 516, the LIFT seeding process is performed. Process condition 5D shows the seed material of the donor film 304 deposited onto the bottom surface 206 and side wall surface 208 of trench 200. In some embodiments, the globules 404 forming the layer of deposited seed material 402 are too sparse to function as a conductive line 502; however, the globules 404 can be utilized as seeds for the deposition of a plating material, such as copper, through typical electroless deposition methods.

Step 518 designates the electroless plating step. In many embodiments, the plating material is the same material as the donor film. It will be appreciated that the plating material can be a material that is different from that of the deposited material 402 as long as the plating material provides good adhesion to the deposited material 402. For example, the chemistry already exists for plating a metal onto a different seed metal. In particular, copper gold, and silver and alloys thereof can be plated onto a palladium seed material. In other embodiments, as later described, the deposited material may be sufficiently thick and contiguous to form a conductive feature, such as a conductive line 502. Process condition 5E shows a plated layer 508 of conductive material formed on the layer of deposited seed material 402. The plated layer 508 may contain excess material that resides above the level of the primary surface 100a. If such excess material is undesirable, the excess material can be removed in a polishing step 520, leaving the plating layer 508 in only the recessed features. The polished plated layer is shown as a conductive line 510 in process condition 5F.

In some embodiments, the process described above with respect to FIGS. 1-5B may be repeated for multiple workpieces 100. For example, after the workpiece 100 is processed as described above (e.g., yielding processed (or plated) workpiece 506, shown in FIG. 5A), a new workpiece 606 to be processed can be bonded to, welded to, adhered to, or otherwise fixed to the processed workpiece 506, and the processes described above with respect to FIGS. 1-5B may be performed to create a processed multiple stack workpiece 600 (FIG. 6) having one or more electrically conductive features electrically connected to one or more electrically conductive features of the processed workpiece 506. It will be appreciated that the individual workpieces 100 may be etched, seeded, and plated individually and subsequently attached to each other. However, the processes described herein, especially the laser-based processes, facilitate the ability to stack an unprocessed workpiece 100 over a processed workpiece 506 and then process the unprocessed workpiece 100 in place, already bonded to the processed workpiece 506.

Figure 6:
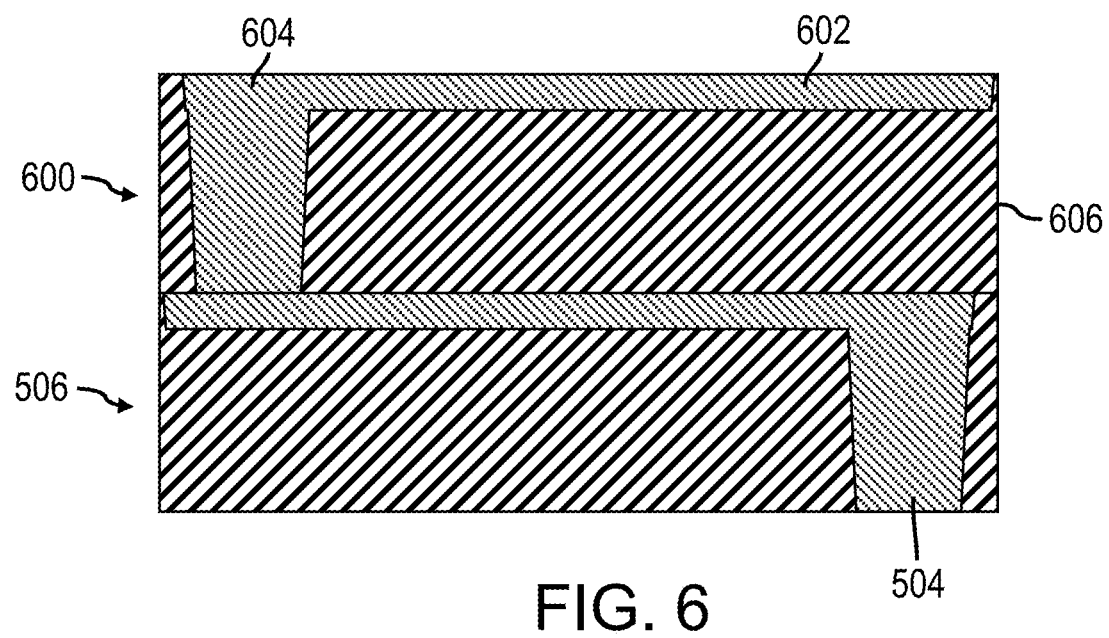
FIG. 6 is a cross-sectional view showing exemplary stacking of multiple processed workpieces formed by methods disclosed herein.
Figure 8:
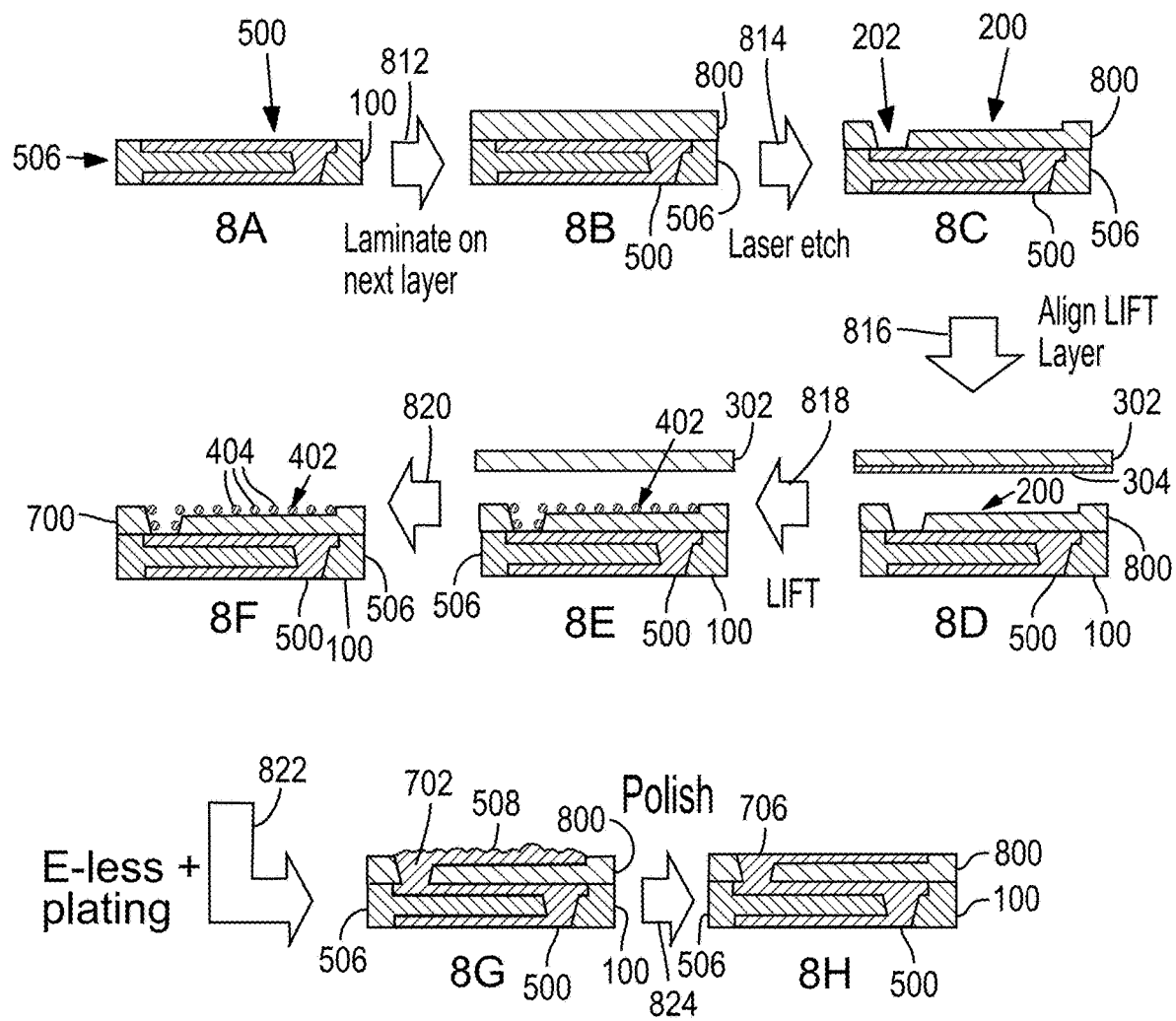
FIG. 8 is an exemplary process flow diagram for forming a multiple level structure of conductive features (such as after the process shown in FIG. 7).

FIG. 6 is a cross-sectional view showing exemplary stacking of multiple processed workpieces 100 and 606 to form the multiple stacked workpiece 600 in which a portion of the conductive feature in the workpiece 606 contacts and is contiguous with the conductive feature in workpiece 100. With reference to FIG. 6, the workpiece 606 may be identical to the workpiece 100 or may contain different substrate materials. The workpiece 606 may have the same or different etched features as those shown as 500 in FIG. 5A. Additionally or alternatively, the features, such as the trenches 200 and/or vias 202 (FIG. 2) used to form the conductive line 602 and/or the conductive via plug 604, may be positioned differently than those shown with respect to the conductive line 502 and/or the conductive via plug 504 in FIG. 5A. In other words, although the workpieces 506 and 606 can be identical in layout and material, the workpieces 506 and 606 can have different layout or use different materials. In some embodiments, the workpieces 506 and 606 have features of different dimensions, and/or the features may be plated with different materials. FIG. 8 is a flow diagram for an exemplary process for forming a multi-level structure of conductive features and is later described.

FIG. 7 is an exemplary process flow diagram for forming a multi-level structure, having two-layers of conductive material, in a single layer of a dielectric substrate of a workpiece 100. The steps shown in FIG. 7 are similar to the steps shown in FIG. 5B, so the details and variations concerning the similar steps will not be repeated. Process condition 7A shows the initial workpiece 100. The first workpiece surface 100a is etched in process step 712. Process condition 7B shows a trench 200a and a via 202a etched into first workpiece surface 100a of the workpiece 100.

In process step 714, the workpiece 100 may be flipped, aligned, and etched to form features in the second workpiece surface 100b. In particular, the workpiece 100 is flipped over so that side 100b is shown at the top. Skilled persons will appreciate, however, that the workpiece 100 can maintain its original orientation and that the laser beam may address the workpiece 100 from the bottom side to address the second workpiece surface 100b. In particular, the laser head from which the laser beam originates may be repositioned so that the laser beam processes the workpiece 100 from the bottom. Alternatively, a second laser may be positioned to process the workpiece 100 from the bottom side, or fold mirrors can be employed to direct a beam from a top mounted laser head to pass around the side of the workpiece 100 to impinge the workpiece 100 from the bottom.

However, in some embodiments in which the substrate of the workpiece 100 is transparent, the laser parameters (particularly the elevation of the focal point of the laser beam) in some cases can be adjusted to etch the second workpiece surface 100b by first passing through the first workpiece surface 100a without adversely affecting it. In some of these embodiments, the focal point of the laser beam can be positioned at or beyond the elevation of material to be etched. Thus, the flipping and alignment steps can be optional.

In an alternative embodiment that maintains the original orientation of a transparent workpiece 100 for both etching steps, the second workpiece surface 100b may be etched first by first passing through the first workpiece surface 100a without adversely affecting it, such as by advantageously selecting the focal point elevation and other laser parameters. Then, the focal point elevation and other laser parameters can be adjusted to etch the first workpiece surface 100a without flipping or re-aligning the workpiece 100. An advantage of laser etching both of the first and second workpiece surface from the same relative orientation of the laser beam to the workpiece 100 is that time-consuming flipping and alignment steps can be eliminated to enhance throughput. Process condition 7C shows a trench 200b and a via 202b etched into the second workpiece surface 100b.

Process step 716 aligns the donor structure 300 over the trench 200b and via 202b of the second workpiece surface 100b. (Skilled persons will appreciate that if all the etching is accomplished with the workpiece in a single orientation with respect to the laser beam, then first workpiece surface 100a would be subjected to the LIFT procedure first.) The aligned donor structure 300 is shown in process condition 7D. Process step 718 involves a first LIFT procedure. Process condition 7E shows a seed layer of deposited material 402 in the trench 200b and via 202b. In process step 720, the workpiece 100 is flipped over, and a second donor structure 300 is aligned over the trench 200a and via 202a of the first workpiece surface 100a. (Skilled persons will appreciate that if all the etching is accomplished with the workpiece in a single orientation with respect to the laser beam, then second workpiece surface 100b would be subjected to the LIFT procedure second.)

Process step 722 involves a second LIFT procedure, and process condition 7G shows a seed layer of deposited material 402 in the trench 200a and via 202a so that there is a layer of seed material 402 deposited into the features on both the first and second surfaces 100a and 100b of the workpiece 100. Process step 724 provides electroless plating. The plating can be performed simultaneously over the deposited seed material 402 on both the first and second surfaces 100a and 100b of the workpiece 100. Alternatively, the plating process can be performed on one side at a time. Process condition 7H shows a plated layer 508 of conductive material formed on the layer of deposited seed material 402 on both sides of the workpiece 100. Any excess material can be removed in a polishing step 726, leaving the plating layer 508 in only the recessed features on both sides of the workpiece 100. The polished plated layer is shown as conductive features 706 on both sides of the workpiece 100 in process condition 7I.

FIG. 8 is flow diagram for exemplary process for forming a multiple level structure 800 of conductive features. Some of the steps shown in FIG. 7 are similar to the steps shown in FIGS. 5B and 7, so the details and variations concerning the similar steps will not be repeated. The process condition 8A shows an initial processed workpiece 506, which may resemble the workpiece 506 shown at the end of the process shown in FIG. 7. In process step 812 a new layer 800 of substrate material is laminated over the workpiece 506. As discussed with respect to FIG. 6, the layer 800 may be the same material as, or different material from, the substrate material in the workpiece 506. Process condition 8B shows the layer 800 attached to the workpiece 506. In process step 814, the layer 800 is etched as previously described, and the etched layer 800 is shown in process condition 8C. Process step 816 aligns the donor structure 300 over the trench 200 and via 202 of the workpiece surface 100a, and process condition 8D shows the donor structure aligned over the layer 800. Process step 818 involves a LIFT procedure, and process condition 8E shows a seed layer of deposited material 402 in the trench 200 and via 202 in the layer 800. Process step 820 removes the carrier substrate 302, and process condition 8F shows that the layer of deposited seed material 402 is ready for plating. Process step 822 provides electroless plating, and process condition 8G shows a plated layer 508 of conductive material formed on the layer of deposited seed material 402 in the trench 200 and via 202 in layer 800. Any excess material can be removed in a polishing step 824, leaving the plating layer 508 in only the recessed features in the substrate layer 800. The polished plated layer is shown as a conductive features 706 in the substrate layer 800 in process condition 8H.

Figure 9:
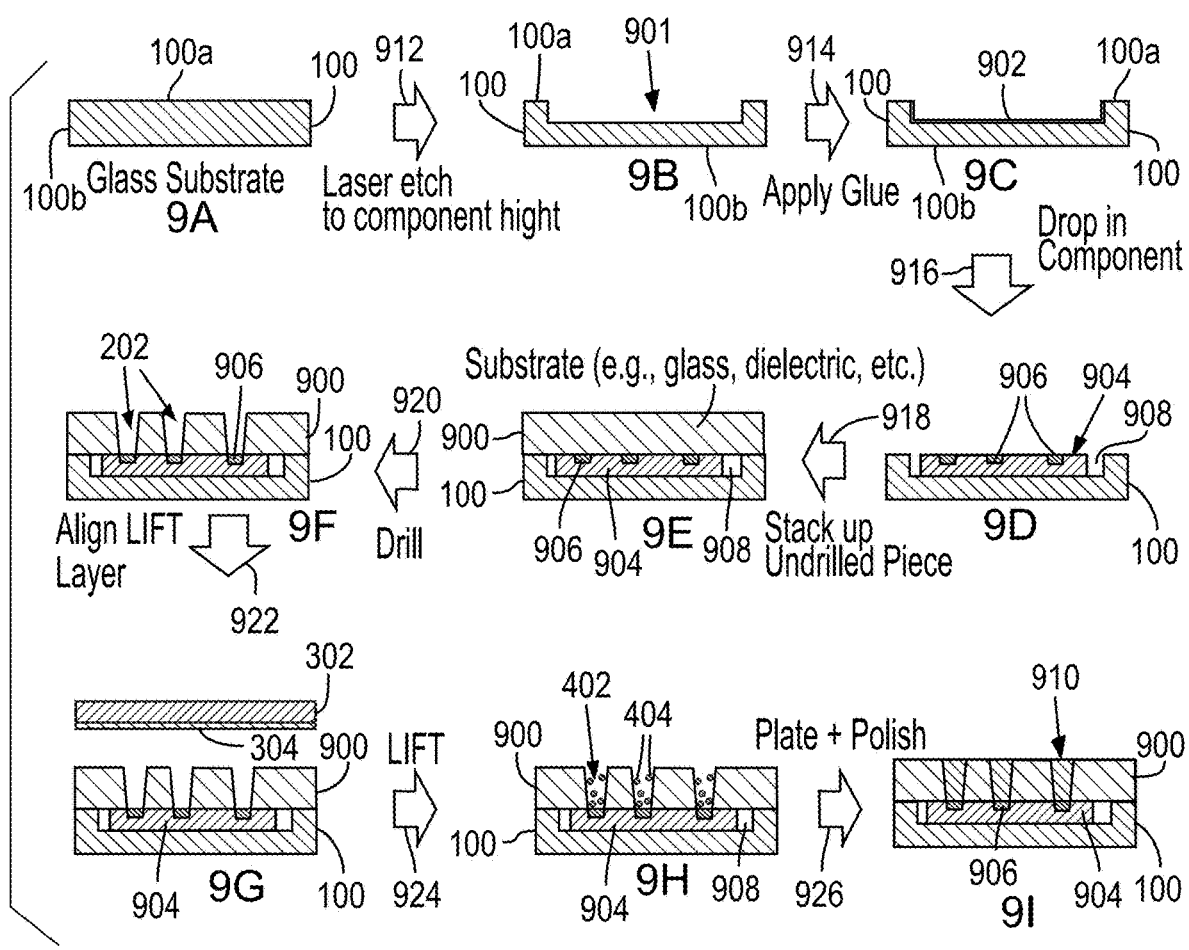
FIG. 9 is an exemplary process flow diagram for forming electrically conductive vias electrically connected to a component embedded within a substrate.

FIG. 9 is an exemplary process flow diagram for forming electrically conductive vias (also called electrically conductive via plugs) 910 that are electrically connected to a component embedded within a substrate such as a glass substrate. Some of the steps shown in FIG. 7 are similar to the steps shown in FIGS. 5B, 7 and 8, so the details and variations concerning the similar steps will not be repeated. Process condition 9A shows a workpiece 100 having a substrate of glass composition, which is etched in process step 912. Process condition 9B shows a feature 901 etched into the workpiece surface 100a of the workpiece 100. In many embodiments, the feature 901 has length, width, and height dimensions suitable to receive a drop-in component 904. In other words, the length and width of the feature 901 will be greater than or equal to the respective length and width of the drop-in component 904. In many embodiments, the depth of the feature 901 will be greater than or equal to the height of the drop-in component 904. In some embodiments, depth of the feature 901 will be smaller than the height of the drop-in component so that its upper surface will be elevated above the first workpiece surface 100a.

In process step 914, the feature 901 may be treated to be adhesive. In some embodiments, the surfaces of the feature 901 may be made to be adhesive by chemical means. In some embodiments, glue 902 may be applied to the surfaces of the feature 901. In alternative embodiments, the bottom surface of the drop-in component 904 may be chemically treated to be adhesive, or glue may be applied to the bottom surface of the drop-in component 904. In some embodiments, a combination of these attachment means may be employed. The process condition 9C shows a layer of glue 902 coating the feature 901.

The drop-in component 904 can include a substrate of any semiconductor manufacturing material, such as a dielectric, ceramic, or glass. The drop-in component may include simple conductive features 906 or pre-fabricated circuit elements. The drop-component 904 can be a pre-fabricated circuit element or chip.

The drop-in component 904 is placed into the recessed feature 901 in process step 916 and process condition 9D shows the drop-in component 904 adhered to the feature 901 in the workpiece 100. Depending on the size of the drop-in component 904 with respect to the size of the feature 901, gaps 908 may occur between the side wall surfaces of the feature 901 and the exterior walls of the drop-in component 904. In some embodiments, excess glue and/or spacers may be introduced into the gaps 908. In some embodiments, the gaps 908 may be maintained to serve some other purpose. In some embodiments, the gaps 908 are filled during a subsequent layering of a substrate 900.

Process step 918 may include the stacking of a substrate 900 or the laying of a substrate 900 onto the workpiece 100 (and onto the top of the drop-in component 904). Process step 918 may seal in the drop-in component 904. The stacked substrate 900 is shown in process condition 9E. In process step 920, the workpiece 100 may be aligned with the beam axis of the laser beam so the vias 202 are drilled through the stacked substrate 900 to reach the conductive features 906. The drilled substrate 900 is shown in process condition 9F with the vias 202 aligned with and reaching the conductive features 906.

Process step 922 aligns the donor structure 300 over the vias 202 in the substrate 900, and process condition 9G shows the donor structure 300 aligned over the substrate 900. Process step 924 involves a LIFT procedure, and process condition 9H shows a seed layer of deposited material 402 in the vias 202. Process step 926 provides electroless plating and polishing. The polished plated layer is shown as a conductive features 910 in the substrate 900 in process condition 9I, providing a conductive path to the conductive features 906.

The previously discussed techniques offer several advantages over traditional PCB manufacturing processes. For example, the processes described above eliminate the need for a photolithography process, work for novel and hard-to-handle dielectric materials (such as glass), and allow for rapid prototyping. For electroplating, the process described herein is much simpler than traditional plating processes that use tin/palladium. The size of the features made in this process is limited only by the laser beam spot size. The spot sizes can be very large to accommodate large features, and the small sizes can be made almost as small as the wavelength to provide feature of minimum size. The process can be integrated into existing fabrication lines through the use of existing machines/processes.

The techniques described herein offer advantages compared to conventional processes. For example, the processes described herein are much faster than the method disclosed in Chinese Patent Publication No. CN 101121575B, which uses 1-100 µm/s velocity for glass etching and silver deposition. Furthermore, the processes in the embodiments described herein require no chemical pre-treatment or coating and no handling in the dark, which is required for working with $AgNO_3$. Moreover, the processes described herein can create conductive features having no discernable voids and result in conductive features with less resistivity.

In another conventional process, International Patent Publication No. 2011/124826A1 is understood to describe a process that involves doping glasses with metal ions, followed by irradiation in an electroless bath, to deposit metal onto the glass: an intensive process, involving production of sol-gels, doping the gels, and baking steps in high temperature ovens. The processes in the embodiments described herein, by contrast, do not require any special glass chemistry, baking, or chemical doping.

Moreover, in some embodiments, the techniques described herein can be performed on a "naked" surface of a workpiece 100. In some embodiments, a naked surface includes a surface of a workpiece substrate that is not coated by an additional material such as an adhesive, i.e. an uncoated workpiece substrate. In some embodiments, a naked surface includes a surface of a workpiece substrate that is not doped with metal ions for purposes of direct metal plating. In some embodiments, a naked surface includes a surface of a workpiece substrate that has been etched to from recesses and the surfaces of the recesses are uncoated and are not doped with metal ions for purposes of direct metal plating.

III. EXAMPLES

A. Example 1

For a demonstration of an exemplary LIFT procedure for an enhanced plating process, a donor film 304 provided as a copper foil with a thickness in a range to 3 µm to 7 µm was mounted on a soda lime glass carrier substrate 302 using a thin layer of adhesive. The copper foil was placed in contact with the surface of a dielectric material having a trench 200 formed therein and, over a series of experiments, a focused beam of laser energy 400 was directed through the carrier substrate 302 to irradiate the donor film 304. The directed beam of focused laser energy ablated the copper foil, and the glass substrate and adhesive contained the ablated material such that it only flowed into the workpiece feature. In these experiments, the directed beam of laser energy 400 had a wavelength of 532 nm, a pulse duration in a range from 5 ns to 20 ns, a pulse energy in a range from 40 µJ/pulse to 300 µJ/pulse, and a spot size of 40 µm at the beam waist. The pulse repetition rate for the parameters specified above is influenced by speed (beam velocity) with which the beam of laser energy can be deflected to move a spot illuminated at the workpiece 100 by the beam of laser energy. For example, when operating at a pulse repetition rate of 30 kHz, beam velocities of 500-1000 mm/s provide good coverage of the donor film 304 without damaging the carrier substrate 302. Higher pulse repetition rates could be employed with faster beam velocities.

B. Example 2

Instead of forming a layer of deposited material using the donor structure 300, a "print" and convert method was demonstrated to seed the trenches 200. In experiments, a black copper(II) oxide (CuO) ink was deposited into the workpiece features of a workpiece provided as a PCB and, over a series of experiments, a focused beam of laser energy was scanned over the ink to drive a chemical reduction reaction that yielded elemental copper. The ink included CuO particles having a diameter of about 50 nm, dispersed in a solution containing 1-dodecanol and methanol. The ink was brushed over the workpiece 100, and excess ink was removed from the first workpiece surface 100a, leaving ink to remain within the workpiece features. In these experiments, the directed beam of laser energy had a wavelength of 532 nm, a pulse duration in a range from 5 ns to 20 ns, a pulse energy in a range from 10 µJ/pulse to 100 µJ/pulse, and a spot size of 40 µm at the beam waist. When operating at a pulse repetition rate of 30 kHz, beam velocities of 20-100 mm/s provided large overlap between successively illuminated spots at the workpiece 100. It should be recognized, however, that the chemical reaction can be carried out at faster beam velocities using a pulse repetition rate greater than 30 kHz. For example, effective seeding has been demonstrated using a beam of laser energy having a wavelength of 1060 nm, a pulse repetition rate of 1 MHz, a pulse energy in a range from 10 µJ/pulse to 20 µJ/pulse and a beam velocity in a range from 500 mm/s to 2000 mm/s, for 50 µm spot size.

C. Additional Examples

Methods of forming the seed layer of deposited material 402 can be carried out on smooth (unfeatured) flat or curved glass substrates, but the conductive features ultimately formed on these surfaces are not as mechanical stable and/or dimensionally controlled as well as conductive features made within etched recesses. So, laser etching of the glass substrate has been employed to produce workpiece features (e.g., which, when plated, form conductive structures such as pads, wires, vias, etc.), followed by formation of one or more seed layers (e.g., by performing a suitable seeding method, such as a LIFT method or a print and convert method). Laser ablation (also referred to herein as laser etching) of glass was carried out on an ESI LODESTONE™ system, employing an EOLITE CHINNOOK™ laser operating at 515 nm with pulse duration of about 800 fs. Laser etching parameters used include a 1 MHz pulse repetition rate, 3 µJ/pulse and a beam scan rate of 1000 mm/s for a spot size of 12-15 µm. (Slower scan rates could be used such as 500-1000 mm/s.) When operating with the focus at the top of the glass substrate, trenches 200 were made in borosilicate glass using these parameters that were ~7 µm wide and 5 µm deep in a single pass. It is noted that additional passes could have been employed to deepen the trench 200 without significantly affecting the width. Narrower and shallower features could also have been made by lowering the pulse energy or defocusing the beam. The same parameters could have been used for producing pads and vias 202 by utilizing a pattern of fill lines with a 7 µm pitch. The fill lines could also have been cross-hatched. Vias 202 could have been produced by applying the pattern multiple times, and by scanning the Z range of the substrate while undertaking this process the shape of the vias 202 could be improved. Larger pulse energies may have been employed as the via diameter approached the thickness of the glass piece (i.e., the aspect ratio neared 1). Blind vias could also have been drilled using either the LODESTONE™ system (described above), or ESI's NVIANT™ $CO_2$-based microvia platform, employing a 9.3 µm Coherent™ J5 $CO_2$ laser.

Laser seeding for electroless plating was carried out as follows. A Spectra-Physics HIPPO™ green laser (532 nm) operating at 30 kHz and 40-200 µJ/pulse, with ~11 ns pulse width, was focused to a 30-40 µm diameter spot onto a thin copper foil laminated onto a glass slide, ablating the copper and directing the ablated material toward the desired substrate. To prepare the carrier substrate 302 for this donor structure 300, a 4% aqueous solution of poly(vinyl alcohol) (PVA) was spin coated onto a 1 mm thick borosilicate glass slide and the film allowed to dry for several hours to produce a uniform coating about 1 µm thick. The foil, as received from Oak-Mitsui, consisted of a 10-µm thick copper foil bound to a 35-µm "carrier" layer of copper. The thin foil was laminated onto the PVA layer using a hot press operating near the melting point for PVA for several minutes. For this lamination process, the 10-µm copper layer was placed in contact with the PVA layer, and the carrier side was facing out. After lamination, the carrier layer was easily peeled away leaving the thin layer adhered to the glass supporting carrier substrate 302. Optimum laser processes utilized bite sizes (beam displacement between pulses) that were 50-75% of the focused spot diameter.

Figure 10:
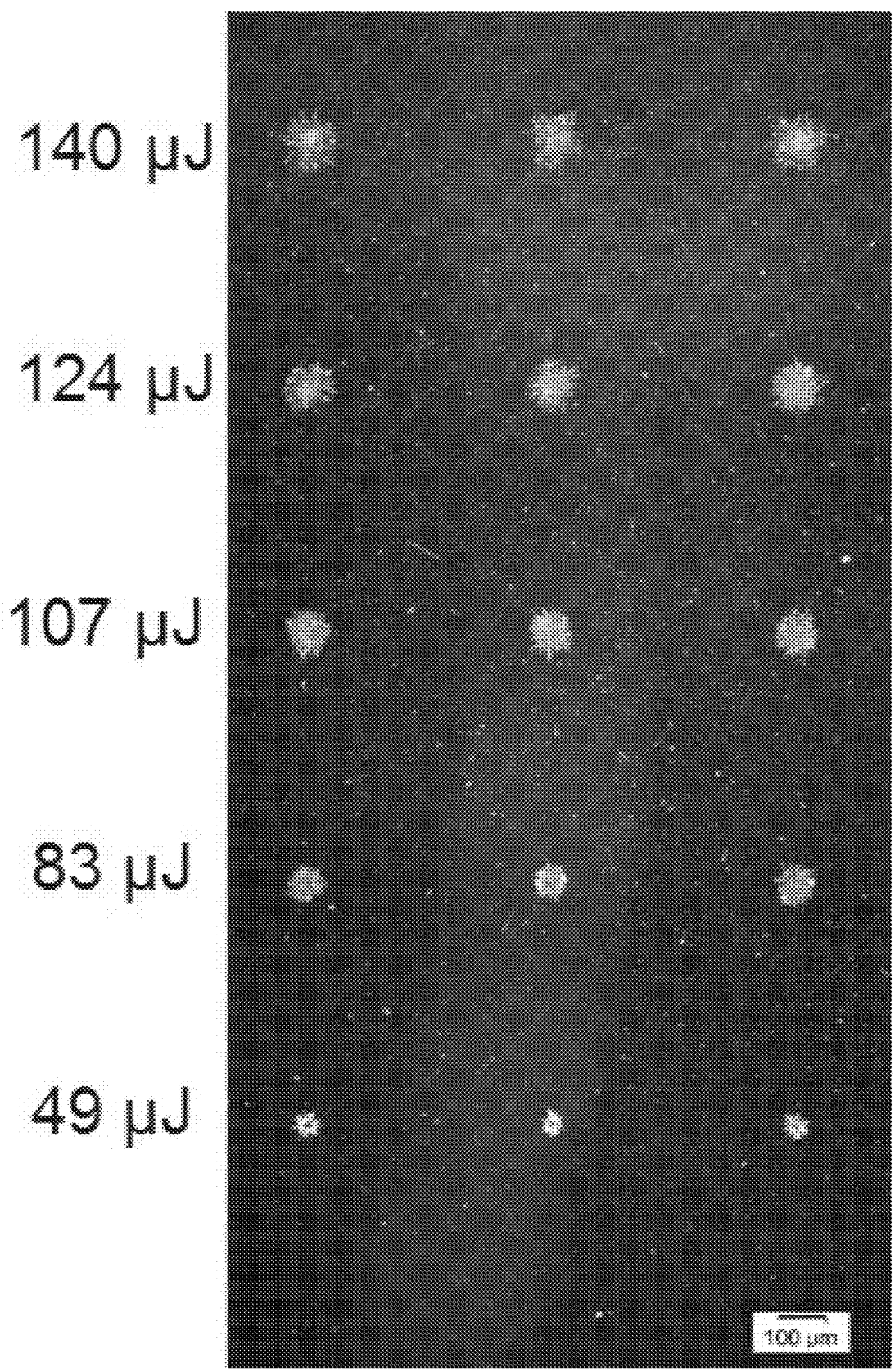
FIG. 10 is a micrograph showing deposited copper on a flat glass surface using different pulse energies.

FIG. 10 is a micrograph showing deposited copper on a flat borosilicate glass surface using the method described above, with no offset between the forward transfer donor structure 300 and the receiving substrate of the workpiece 100. The process utilized the parameters described above with a single laser pulse with 30-µm focused spot at the work surface with variable pulse energies shown in the FIG. 10. The scale bar is 100 µm. FIG. 10 shows that the method has a resolution (deposited spot diameter) of ~50 µm at low pulse energies; at higher pulse energies the feature size increases. The transferred copper was strongly anchored, and conductive patterns could be made directly from this technique using multiple passes and/or the proper pitch, although these multiple deposits are not structurally strong on smooth glass surfaces. FIG. 10 also shows that there was unbound copper dust between the anchored features. This dust was easily be removed by gently wiping the surface. FIG. 10 was presented in a paper at the IPC Apex Conference in Feb. 14-17, 2017.

An ESI 5335™ micromachining platform was utilized for copper LIFT in instances that required precise alignment of the donor substrate. The system utilized a third-harmonic Nd:YAG laser (355 nm) with pulse repetition frequencies up to 90 kHz, pulse duration ~100 ns, ~12 µm focused beam diameter, and maximum average power of around 11 W. The same donor structure 300 and donor film 304 described above were utilized with proper laser dosing conditions, i.e., using sufficiently large bite sizes to minimize damage to the receiving substrate of the workpiece 100 and sufficiently low pulse energies to maintain good resolution of the deposited copper. Other forward transfer processes that employ different lasers, different process parameters (including laser wavelength, pulse duration, energy, pulse repetition rate, as well as offset of the substrates), and different forward transfer substrates, particularly different donor film materials of different thicknesses have also been successfully implemented for this approach and can offer seeding resolution below 10 µm.

The copper deposits may act as seeds for the electroless plating of copper. If there is mismatch in resolution between the etched features and that of the copper seeds, then a step of polishing of the surface may be employed after forward transfer such that copper seeds remain only within the etched features. A second polishing step can be applied after copper plating to eliminate any unwanted connections or growth of the copper outside of the laser-etched boundaries. A representative flow diagram of the process is shown schematically in FIGS. 7 and 8. After a thin copper layer is deposited from the electroless plating process, copper electroplating, which offers much faster plating rates than electroless plating, can be carried out to build up thicker copper layers. In alternative embodiments as later described, the LIFT process can be modified to deposit thicker layers of conductive material suitable for direct electroplating, skipping the electroless plating step.

After plating, polishing can be carried out to prepare a smooth surface with recessed conductive features, suitable for further layer build up. The process can be repeated, drilling blind vias instead of through holes, to build up layers to prepare all-glass or mixed-material multilayer structures. Modified methods can be used for making structures with embedded components in all-glass structures.

The methods described above (laser etching followed by laser forward transfer of a thin metallic foil and then plating) can also be applied to traditional and high performance dielectric materials, as well as to the plating of various metals.

Figure 11A:
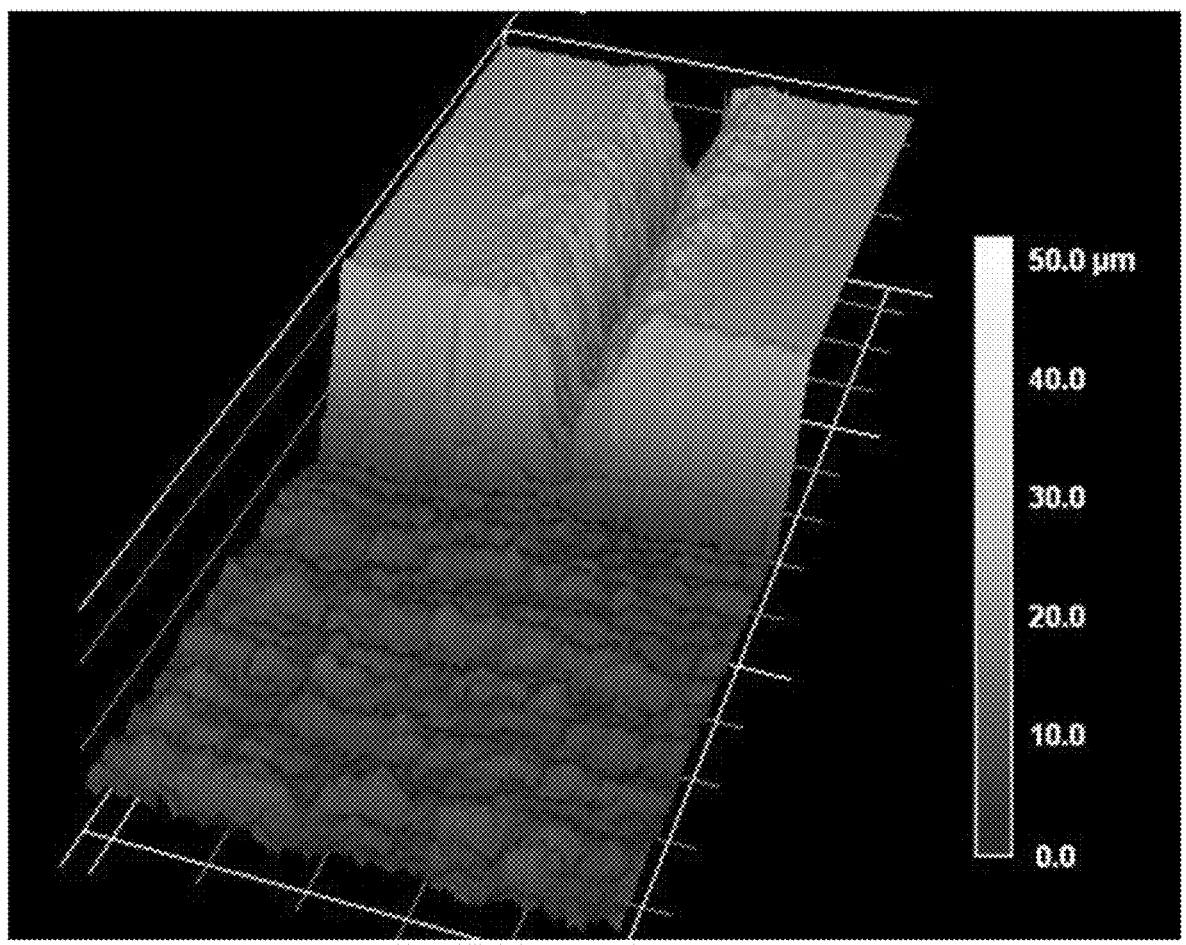
FIG. 11A is a UV laser scanning micrograph of a height measurement of recessed features created by laser ablation of a substrate, prior to seeding and plating.
Figure 11B:
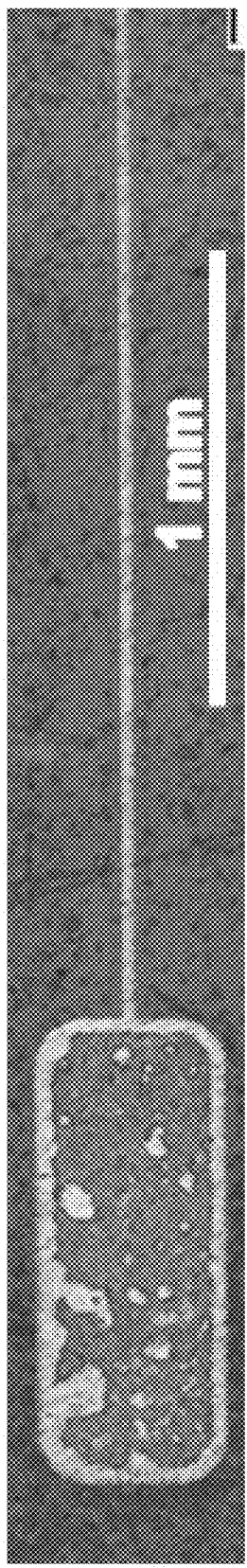
FIG. 11B is a photograph of a plated wire and pad produced by processes disclosed herein.
Figure 11C:
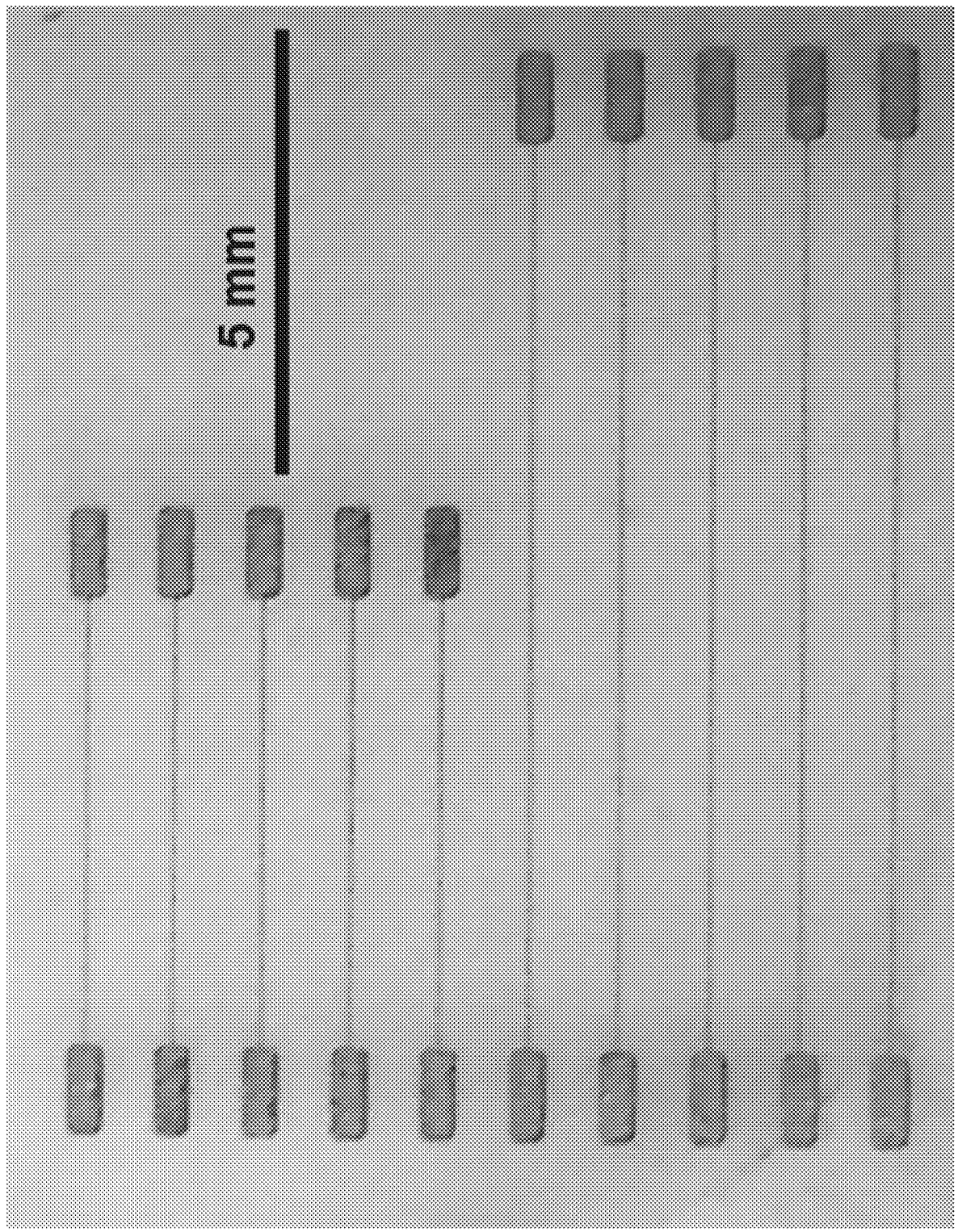
FIG. 11C is micrograph of 5 mm and 10 mm wires connected to pads for resistivity testing.

A simple design of two 1000×400 µm pads connected by a 5 mm or 10 mm long wire 25 µm wide was created on a borosilicate glass substrate and used to conduct resistivity measurements. Prior to plating, the areas of the cross sections of the wires were determined using a scanning laser microscope. FIG. 11A is a UV laser scanning micrograph of a height measurement of recessed features created by laser ablation of a borosilicate glass substrate, prior to seeding and plating. FIG. 11B is a micrograph of a plated wire and pad produced by the processes disclosed herein. FIG. 11C is a photograph of 5 mm and 10 mm wires connected to pads that were used for resistivity testing.

Resistivity measurements of the copper deposits after electroless plating were done using four-point probe measurements. The resistivity was calculated according to Equation 1:

$$\rho=(V*\sigma)/(I*L) \qquad (1)$$

where V is the measured voltage across the wire, $\sigma$ is the cross sectional area of the wire, I is the applied current, and L is the length of the conductive feature. The wires had a cross section that is an isosceles triangle approximately 25 μm wide and 25-30 μm deep, with a measured cross section of $3.53\pm0.38\times10^{-10}$ m$^2$. Four-point probe measurements were carried out at different applied currents for each sample to gauge the error in the resistance measurements; standard deviations of the resistance were less than 1% of the average (Table 1). The calculated resistivity values are between 1-1.5× the bulk copper value of $1.68\times10^{-8}$ Ωm (at 20° C.). The majority of the error in the resistivity measurements arose from uncertainty in the area of the wire's cross section.

TABLE 1

Resistivity measurements of 10 mm and 5 mm wires embedded in glass.

| Sample | Wire Length (mm) | Resistance Ω | Resistivity Ω · m × 10$^{-8}$ | % bulk value |
|---|---|---|---|---|
| 1 | 10 | 0.593 ± 0.003 | 2.08 ± 0.23 | 124 |
| 2 | 10 | 0.723 ± 0.005 | 2.55 ± 0.28 | 152 |
| 3 | 5 | 0.284 ± 0.003 | 2.01 ± 0.22 | 119 |
| 4 | 5 | 0.279 ± 0.002 | 1.97 ± 0.22 | 117 |

Figure 11D:
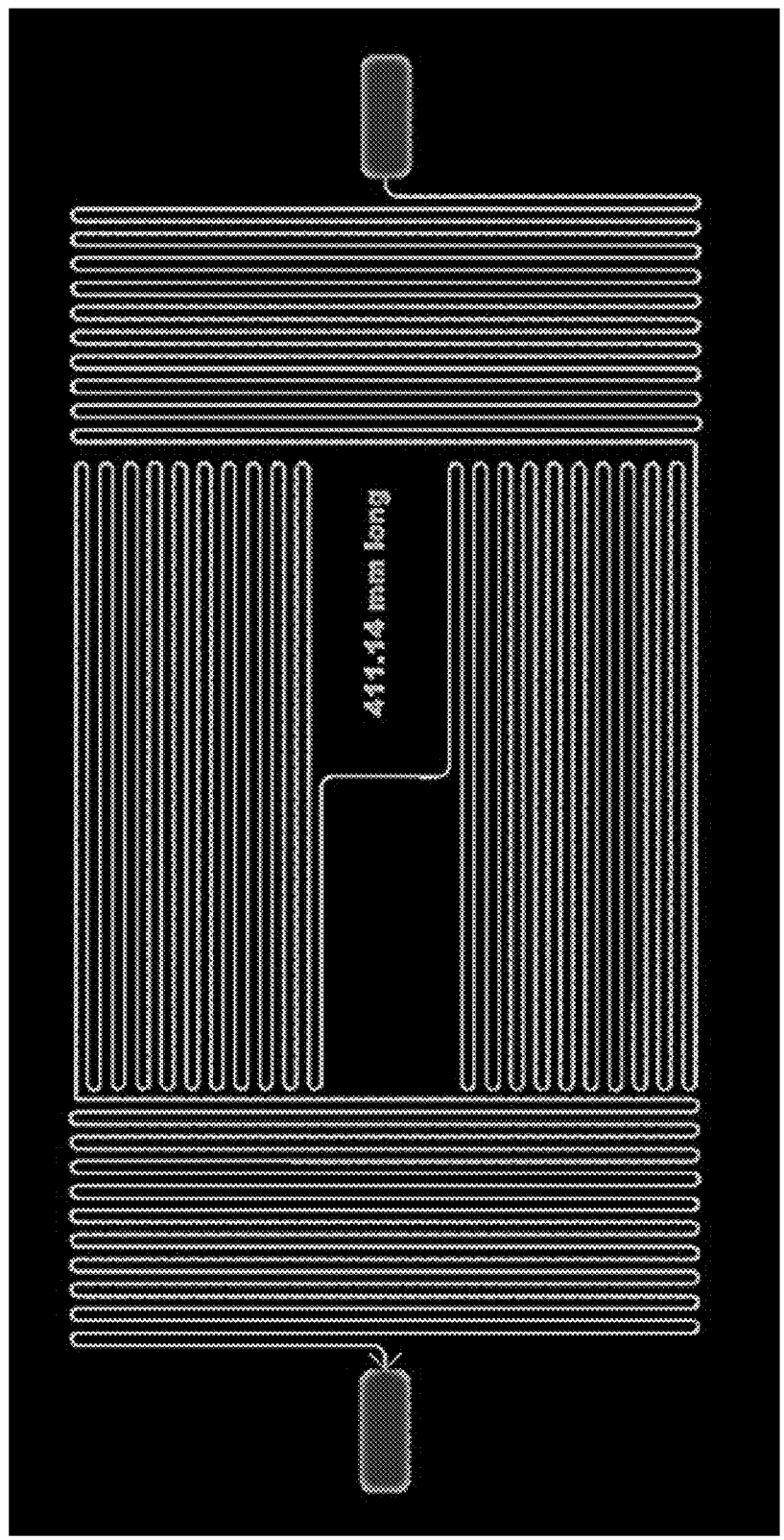
FIG. 11D is a CAD drawing design of a long wire pattern used to produce a long wire pattern by processes disclosed herein.
Figure 11E:
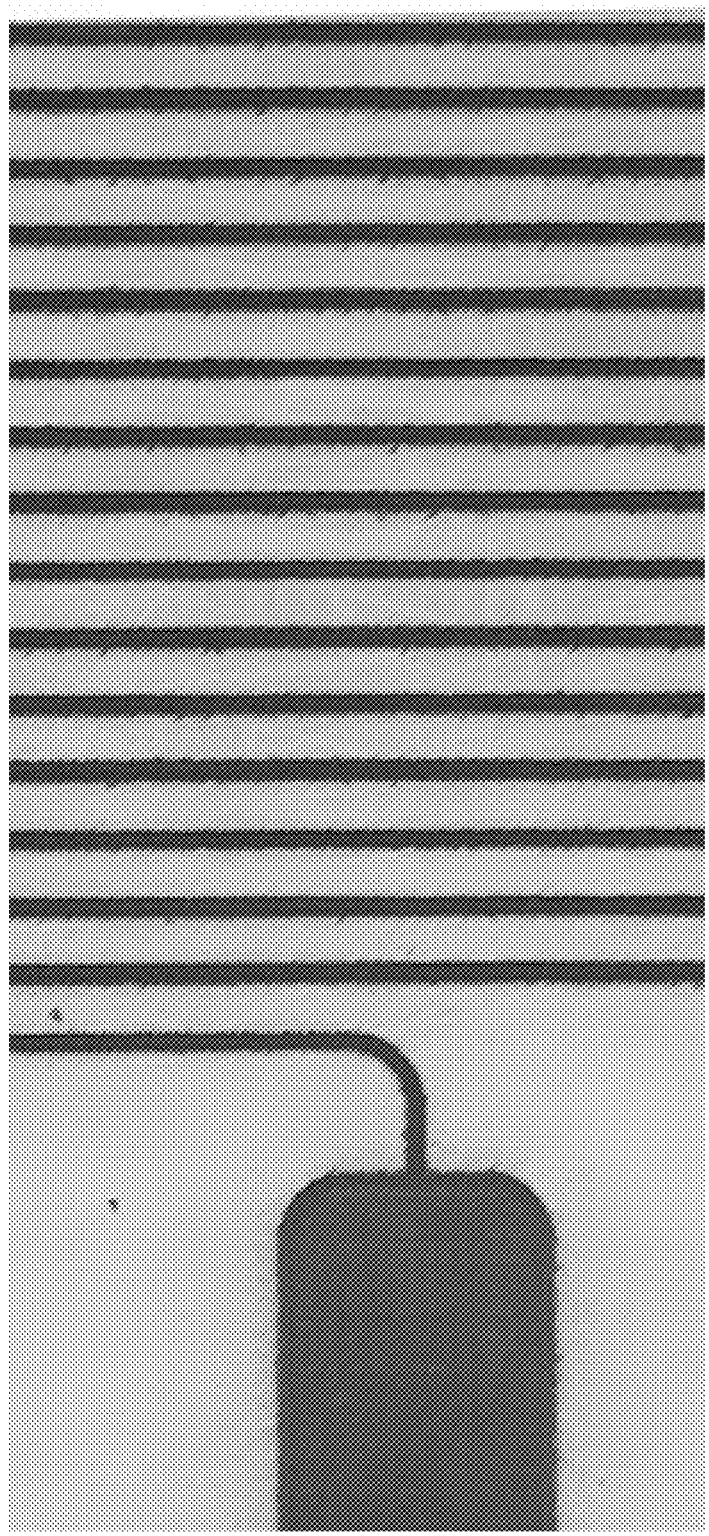
FIG. 11E is a micrograph of a portion of the long wire pattern, based on the design from FIG. 11D, etched into borosilicate glass.

A second pattern, employed for resistivity testing, also on glass, contained connected 5 mm lengths of wire separated by 100 μm pitch with a total length of a 411.14 mm. FIG. 11D is a CAD drawing used to make this long wire pattern, which was produced by processes disclosed herein, and FIG. 11E shows a micrograph of a portion of this pattern etched into a glass substrate. The dimensions of the wire were measured at 10 different positions, yielding a width of 24.3±2.2 μm, depth of 38.9±2.9 μm and cross sectional area of $6.08\pm0.51\times10^{-10}$ m$^2$. For these dimensions a pattern consisting of bulk copper would have a resistance of 10.7±0.9Ω. Resistance measurements using a multimeter for four of these patterns gave a value of 24.1±0.6Ω, about 2.25 times the value expected for bulk copper in this geometry. FIGS. 11A-11E were presented in a paper at the IPC Apex Conference in Feb. 14-17, 2017.

One advantage to having wires embedded in a dielectric material is the ability to finely control the geometry of individual wires and the pitch between wires, thereby enabling a more predictable total material (copper) volume for any given pattern.

Figure 12A:
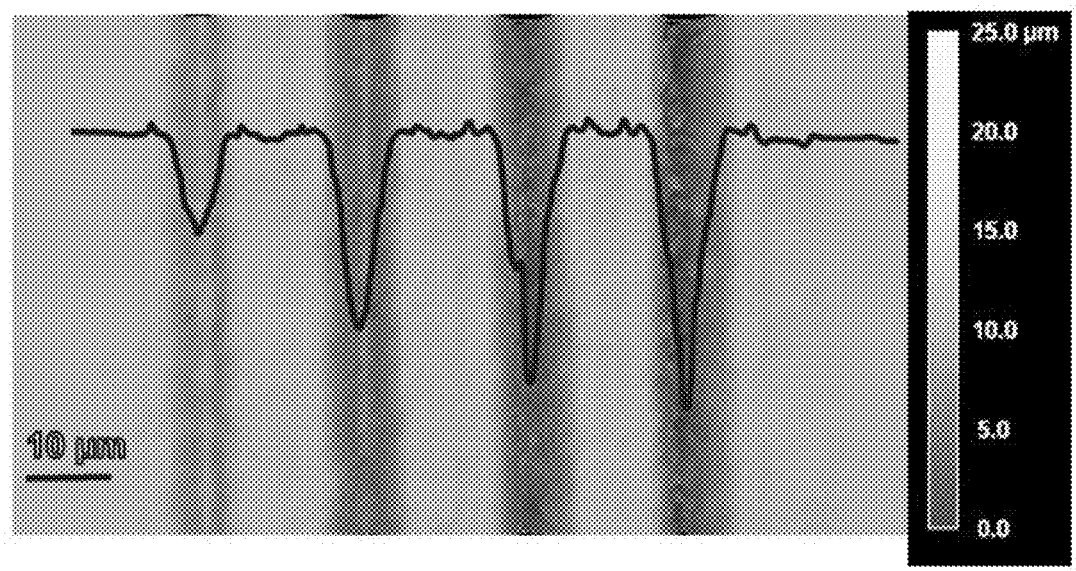
FIG. 12A shows superimposed depth measurements over a UV laser scanning micrograph of laser-etched trenches in a glass substrate.
Figure 12B:
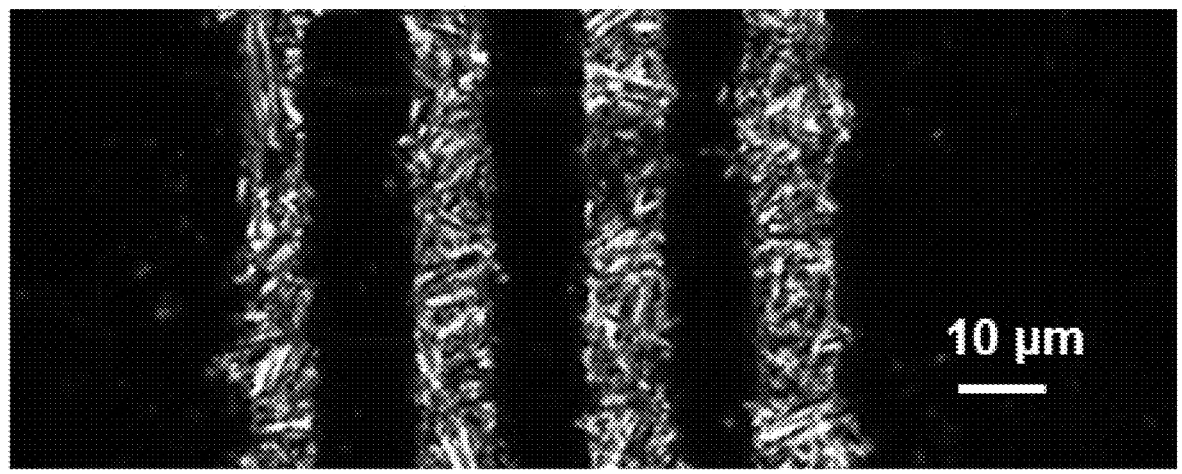
FIG. 12B is a dark-field micrograph of the trenches shown in FIG. 12A that have been plated to from wires through processes describe herein.
Figure 12C:
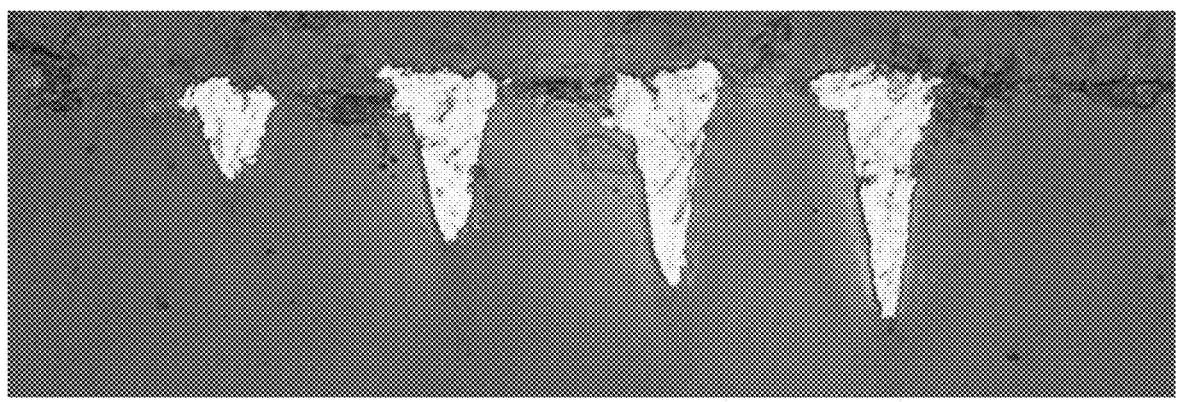
FIG. 12C is a micrograph of cross-sections of the plated wires shown in FIG. 12B.

FIGS. 12A-12C demonstrate wires having a very fine pitch and controllable depth. FIG. 12A shows superimposed depth measurements over a UV laser scanning micrograph of laser-etched trenches 200 in a glass substrate. The trenches 200 were produced by are 1-4 passes of a laser-machining beam using 3 μJ, 1 MHz, and 500 mm/s laser parameters on the LODESTONE™ system. After one pass of the beam axis, the first trench was about 8 μm wide and 7 μm deep. The second trench 200 was made with two passes of the beam axis, the third trench 200 with three passes of the beam axis, and the fourth trench with four passes of the beam axis. The width of the trenches 200 increased upon subsequent passes, and the increase in depth diminished with the number of passes, such that at the fourth pass, the trench was 9.5 μm wide and 20 μm deep. The trenches 200 were separated by about 10 μm. FIG. 12B is a dark-field micrograph of the trenches shown in FIG. 12A that have been plated to from wires through processes describe herein. FIG. 12C is a micrograph of cross-sections of the plated wires shown in FIG. 12B. FIGS. 12A-12C were presented in a paper at the IPC Apex Conference in Feb. 14-17, 2017.

Figure 13A:
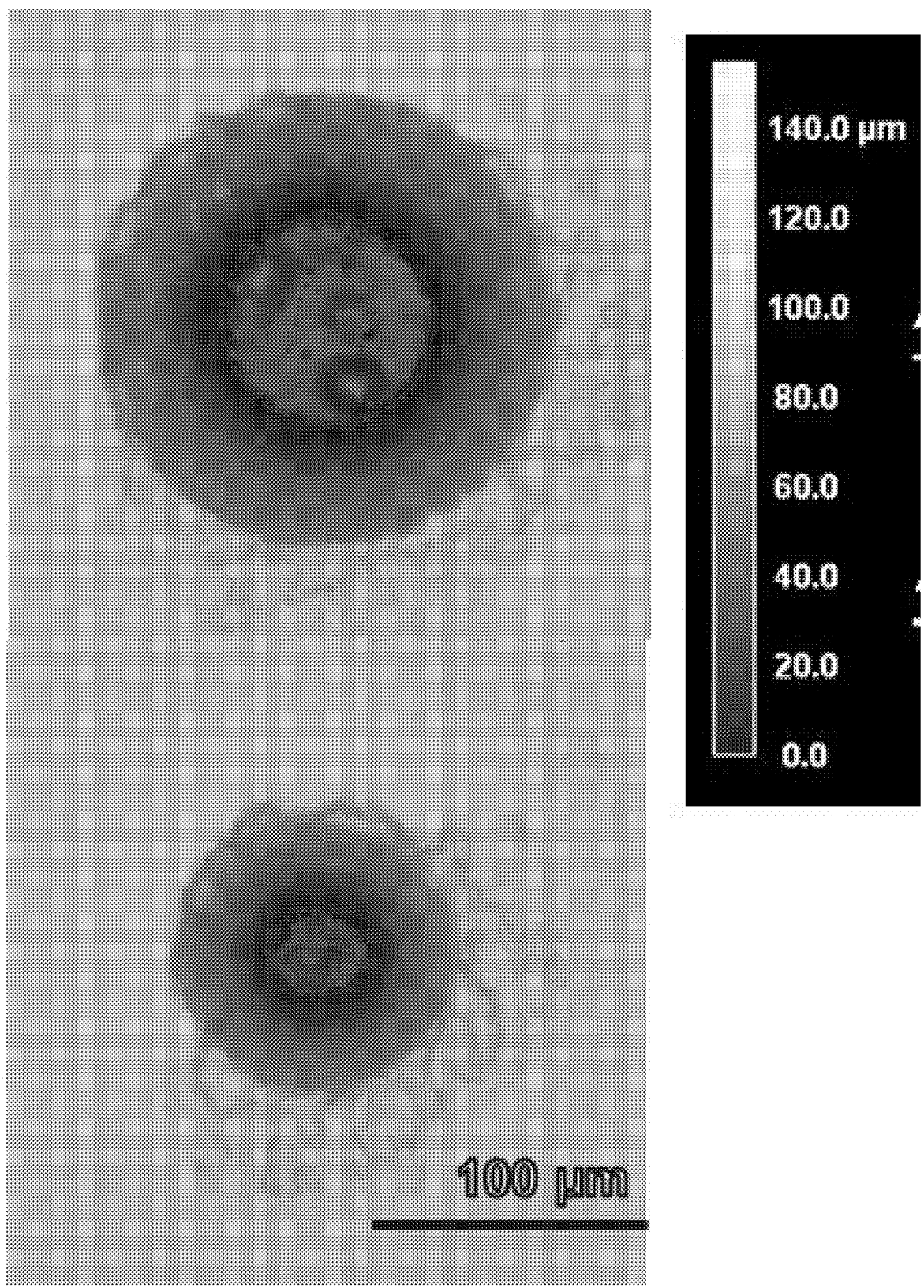
FIG. 13A is a micrograph of laser-etched through hole-vias in a glass substrate.
Figure 13B:
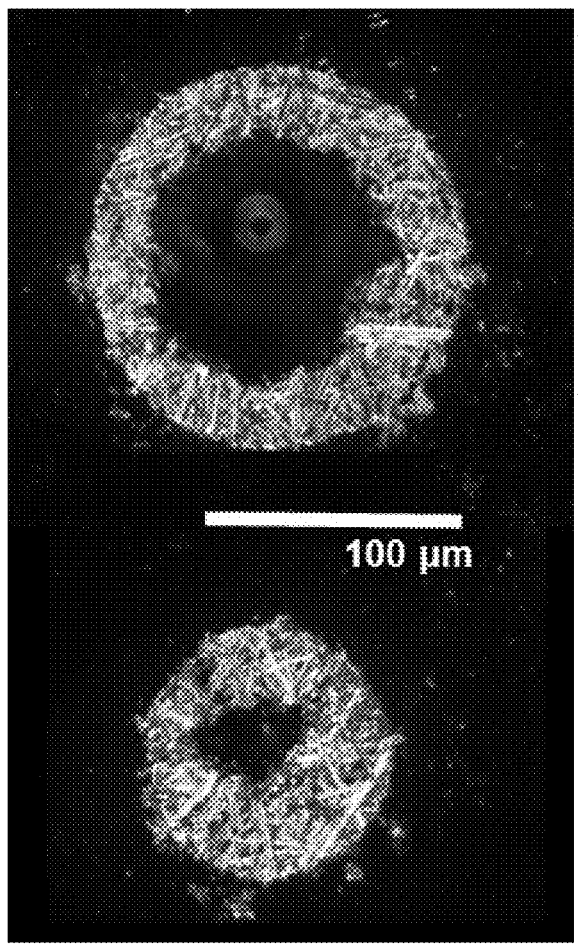
FIG. 13B is a dark-field micrograph of the through-hole vias shown in FIG. 13A that have been plated through processes describe herein.
Figure 13C:
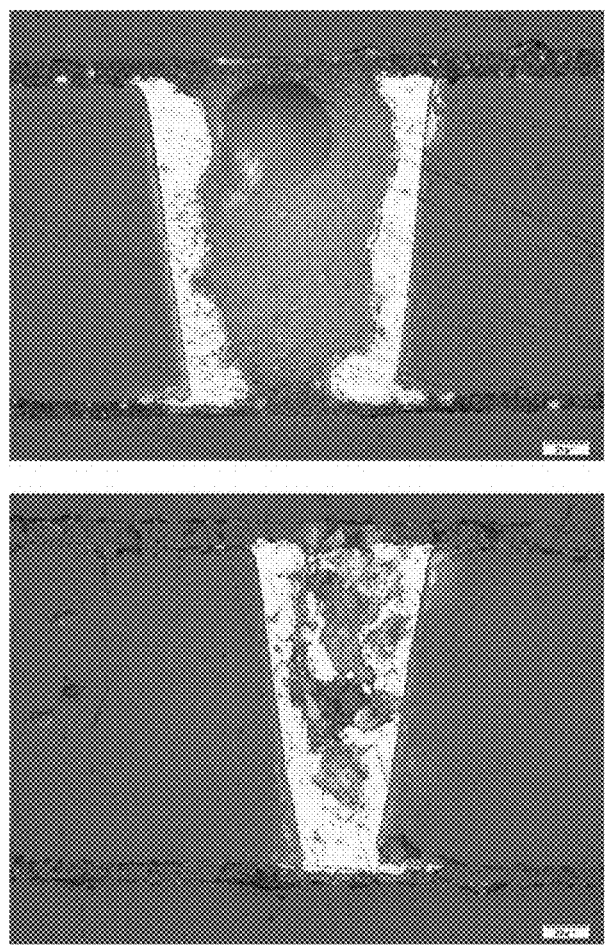
FIG. 13C is a micrograph of cross-sections of the plated through-hole vias shown in FIG. 13B.

FIGS. 13A-13C demonstrate plated through-hole vias 202 of 133 μm and 87 μm diameter (at the laser entrance (larger) side) in 150 μm thick borosilicate glass. In both cases, the sidewall angle is around 82°, such that at the exit the diameters were 85 μm and 41 μm, respectively. FIG. 13A is a UV laser scanning micrograph of laser-etched through hole-vias in the glass substrate. FIG. 13B is a dark-field micrograph of the through-hole vias shown in FIG. 13A that have been seeded and plated through processes describe herein. FIG. 13C is a micrograph of cross-sections of the plated through-hole vias shown in FIG. 13B. Through-hole vias have also been drilled in 50-μm thick Schott AF32 Eco glass (not shown), the drilled vias 202 having a top diameter of 40 μm and an exit diameter of 16 μm using the LODESTONE™ laser-processing system. FIGS. 13A-11C were presented in a paper at the IPC Apex Conference in Feb. 14-17, 2017.

Figure 14A:
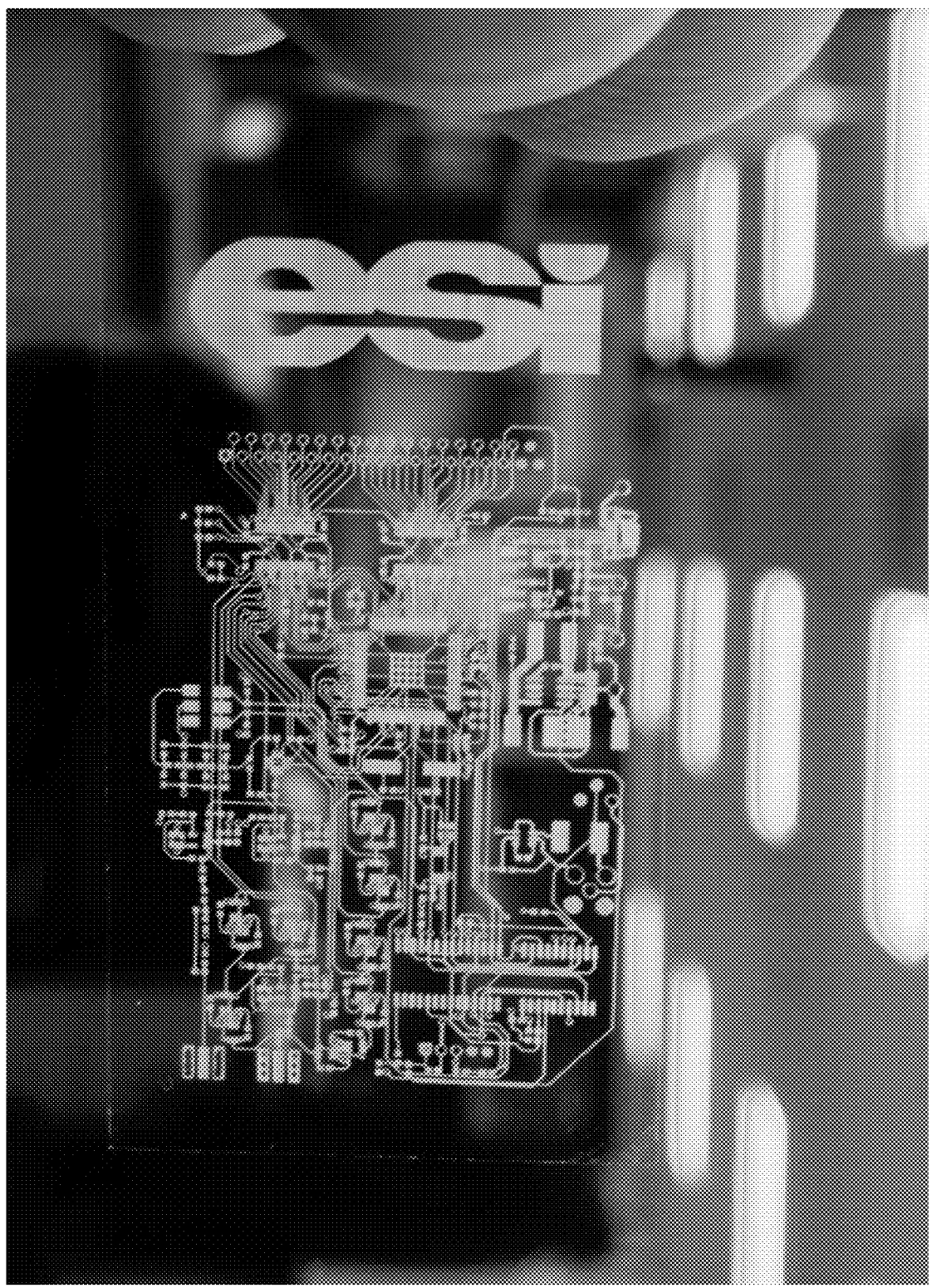
FIG. 14A is a photograph of a two-sided PCB pattern laser etched into an 150 micron thick glass substrate, prior to seeding and plating.
Figure 14B:
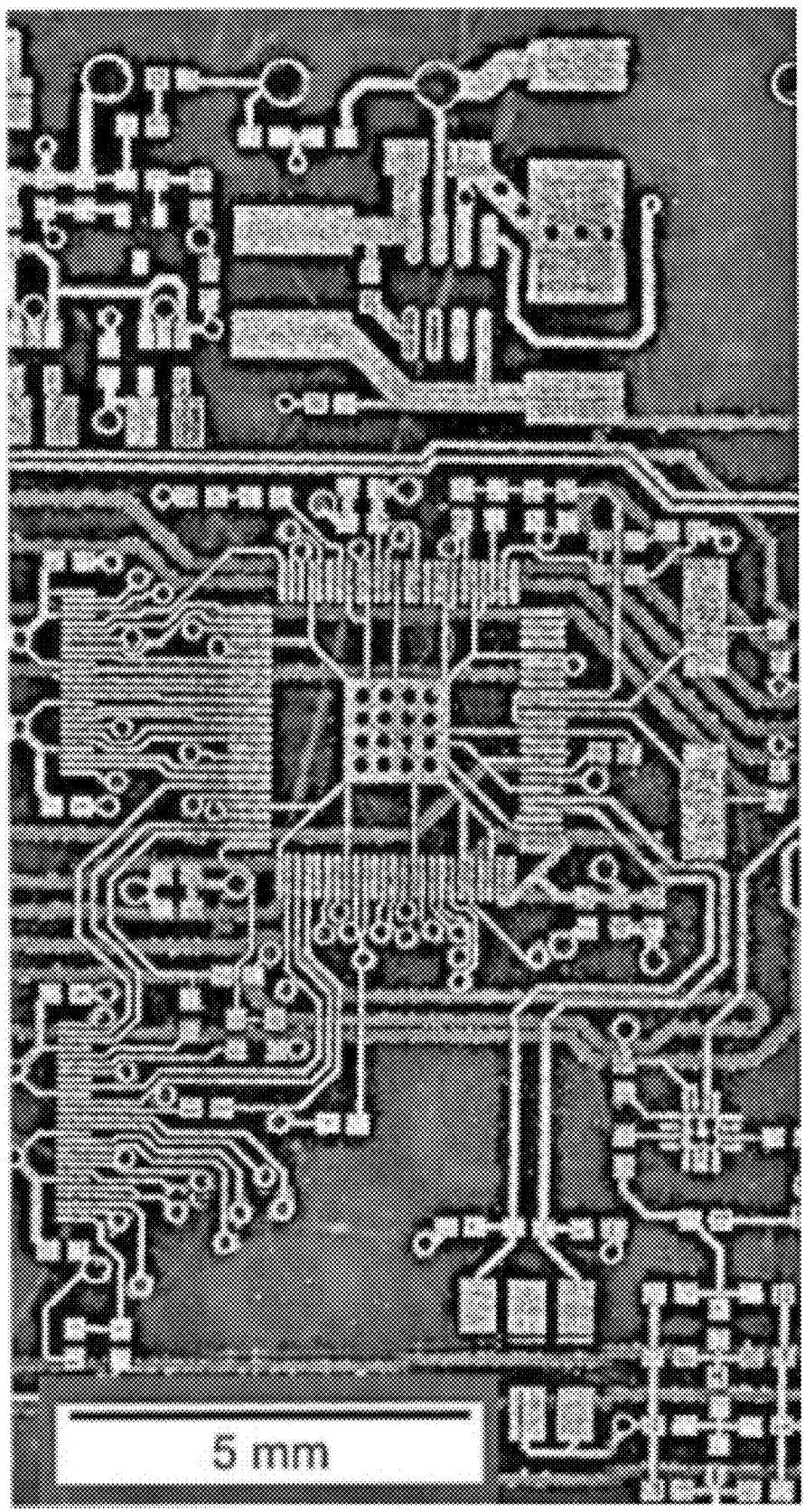
FIG. 14B is a composite micrograph detailing a portion of the design in FIG. 14A after plating.

Applying the laser-based glass etching and copper seeding methods described above, a two-sided PCB pattern measuring 20×35 mm was prepared. The pattern was an actual circuit design, albeit scaled down to ~25% of the original size so that it would fit on a 22 mm×50 mm borosilicate glass coverslip, 150 μm thick. FIG. 14A is a photograph of a two-sided PCB pattern laser etched into an 150 micron thick glass substrate, prior to seeding and plating. The smallest features in this design are ~35 μm wide. The ESI logo, pads, wires, and alignment points of the design were machined into the glass using a single set of laser parameters, utilizing a 7 μm crosshatch pattern within the individual polygons. Next, the vias were drilled using a different set of parameters. The workpiece 100 was flipped over and aligned using alignment marks made on the top of the glass piece; and the wires, pads, and additional text on the bottom were machined. After the forward transfer process, both the top and bottom surfaces were gently polished to remove excess copper from the surface, leaving only copper seeds in the laser-machined areas. Plating was carried out in an electroless-plating bath. FIG. 14B is a composite micrograph detailing a portion of the design in FIG. 14A after plating. In FIG. 14B the lighter-colored features are on the near side of the substrate while the darker features are on the other side. FIG. 14B was presented in a paper at the IPC Apex Conference in Feb. 14-17, 2017.

Figure 15A:
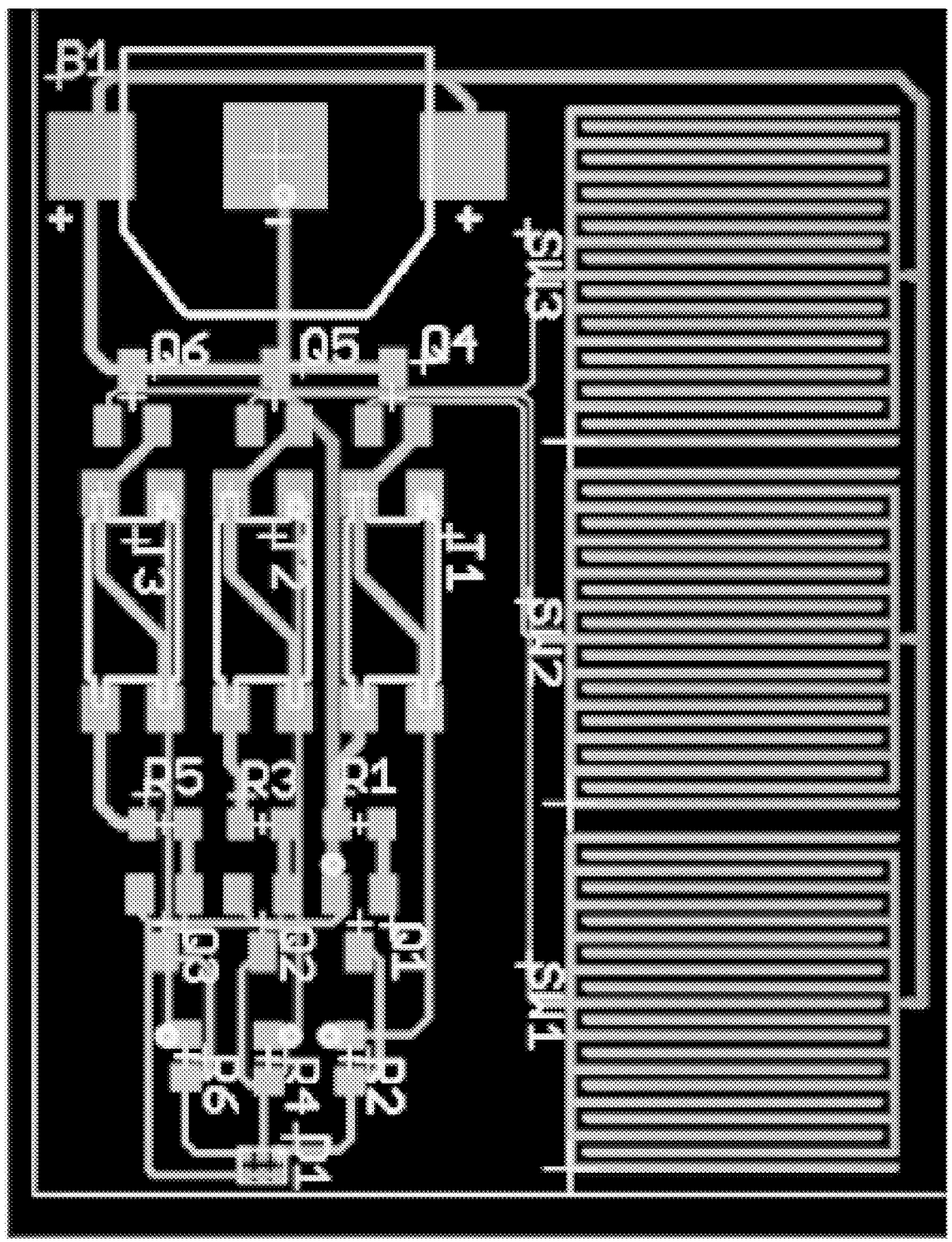
FIG. 15A is a CAD drawing of a three touch-pad (RGB) LED demonstrator.
Figure 15B:
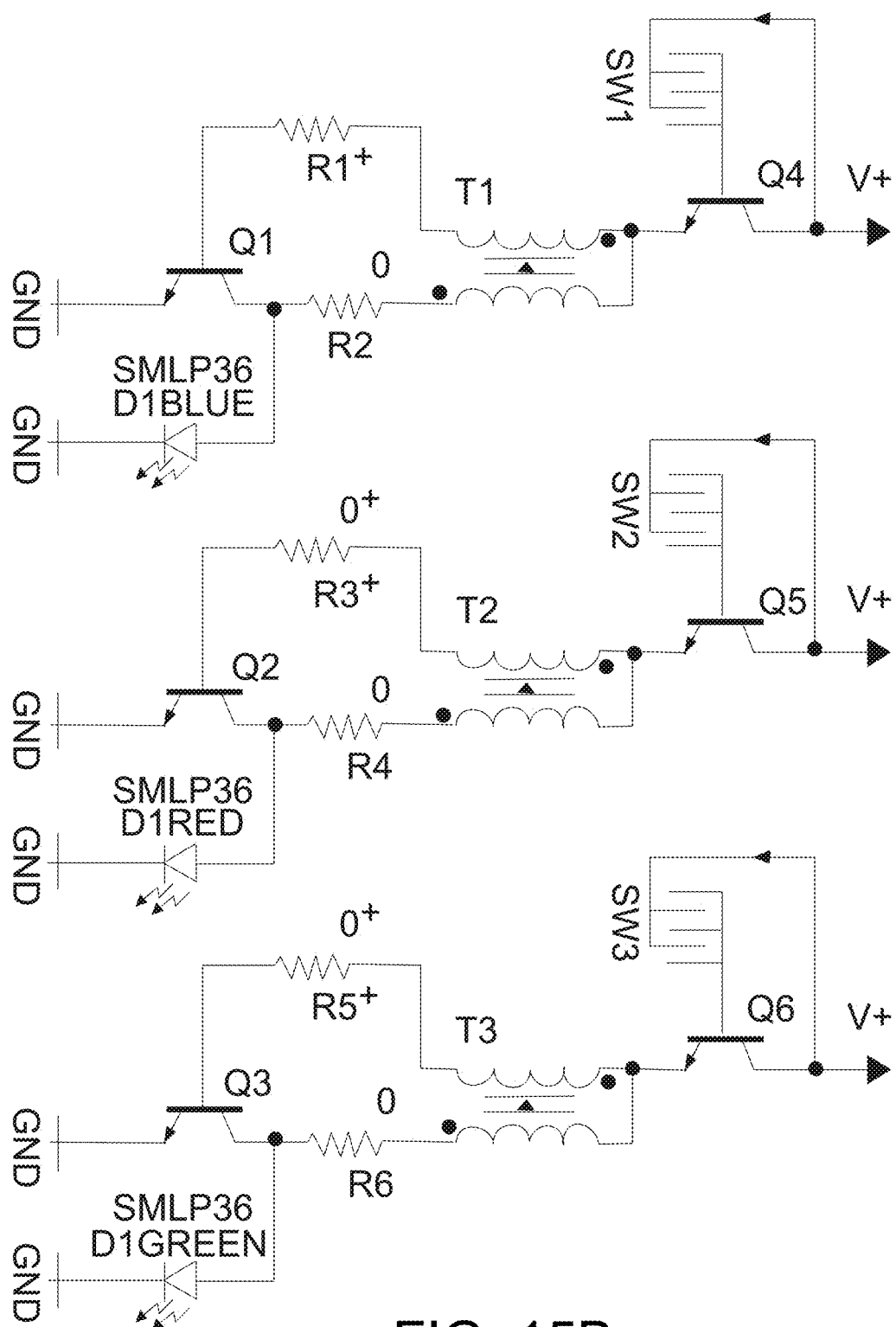
FIG. 15B is a simplified wiring diagram of the touch-pad LED demonstrator shown in FIG. 15A.

To illustrate the capabilities and gain insight as to whether the adhesion of copper to a glass substrate holds up to direct heat from a soldering iron, a two-layer circuit board was designed and built. A CAD drawing of a three touch-pad (RGB) LED demonstrator of the resulting circuit board design is shown in FIG. 15A. In FIG. 15A, certain features are on the front side of the board, the circles are through holes, and some of the long straight conductive lines are on the back side of the board. FIG. 15B is a simplified wiring diagram of the touch-pad LED demonstrator shown in FIG. 15A. This circuit, known as a "Joule Thief," operates in a similar way to a boost converter, in that it takes a smaller DC voltage and uses inductive spiking to generate a larger voltage via a transistor used for switching and a transformer.

The design has three parallel circuits, which control an individual color of a common cathode RGB LED, and a resistive touch pad activates each circuit. A 1.5 V button cell battery was used to power the circuit, and the switching frequency was measured to be approximately 400 kHz. Although the circuit itself has a relatively low parts count and does not require a two-layer PCB design, a two layer board was designed to demonstrate the capabilities of creating plated through-holes. Trace widths on the board range from 100-400 μm (4 mils to 16 mils), which were created without issue using the methods described above.

Figure 15C:
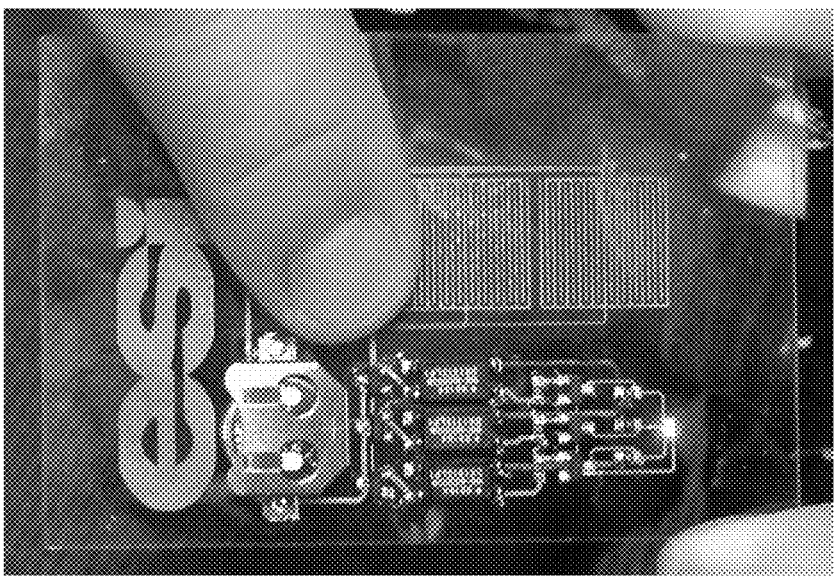
FIG. 15C, FIG. 15D, and FIG. 15E are photographic images of respective touch pads of the LED demonstrator of FIG. 15A, made by processes described herein, being touched by a finger to light the respective LEDs.
Figure 15D:
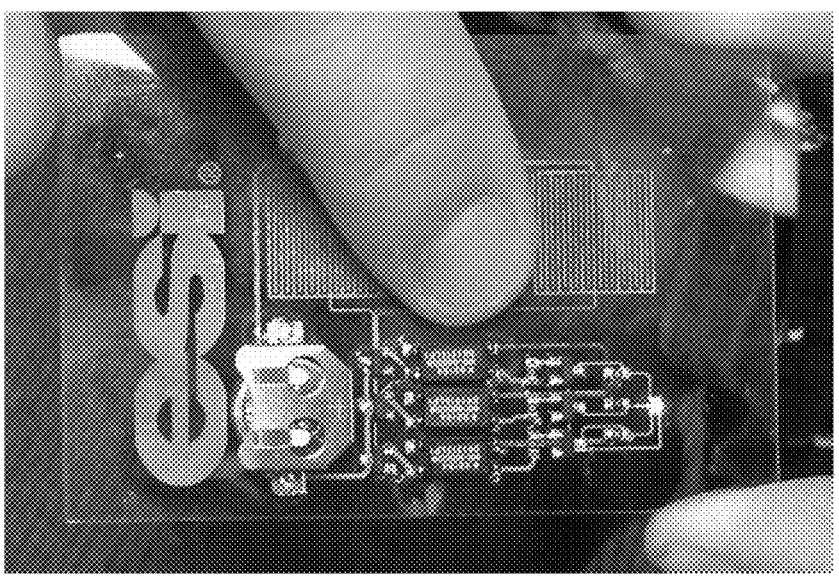
Figure 15E:
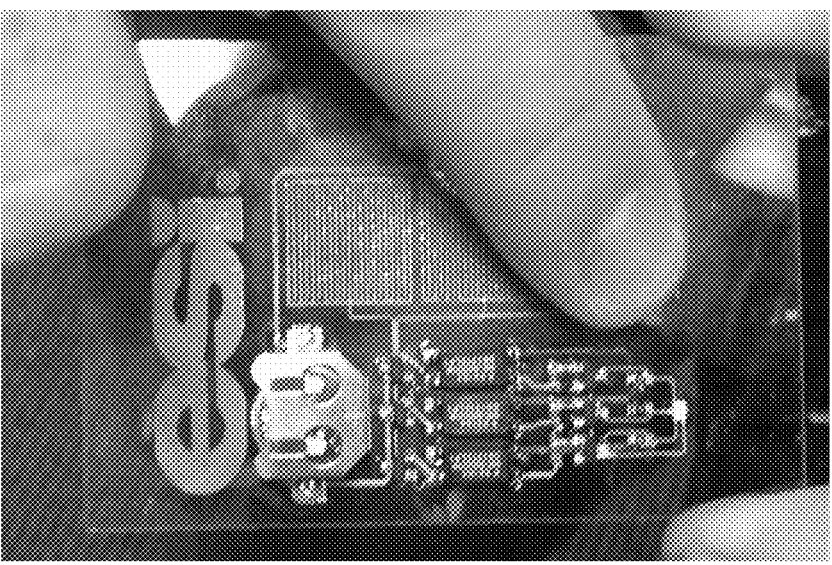

During the assembly of the circuit board, the quality of the adhesion of copper to the glass substrate was observed to be similar to that of copper on FR4. There were no traces or pads that peeled off, and some pads went under multiple temperature cycles (up to approximately 300° C.) with no issues. FIG. 15C, FIG. 15D, and FIG. 15E are photographic images of respective touch pads of the LED demonstrator of FIG. 15A, made by processes described herein, being touched by a finger to light the respective LEDs. The series of photographs shows that each touch pad activates a single LED. FIGS. 15A-15E were presented in a paper at the IPC Apex Conference in Feb. 14-17, 2017.

Figure 16A:
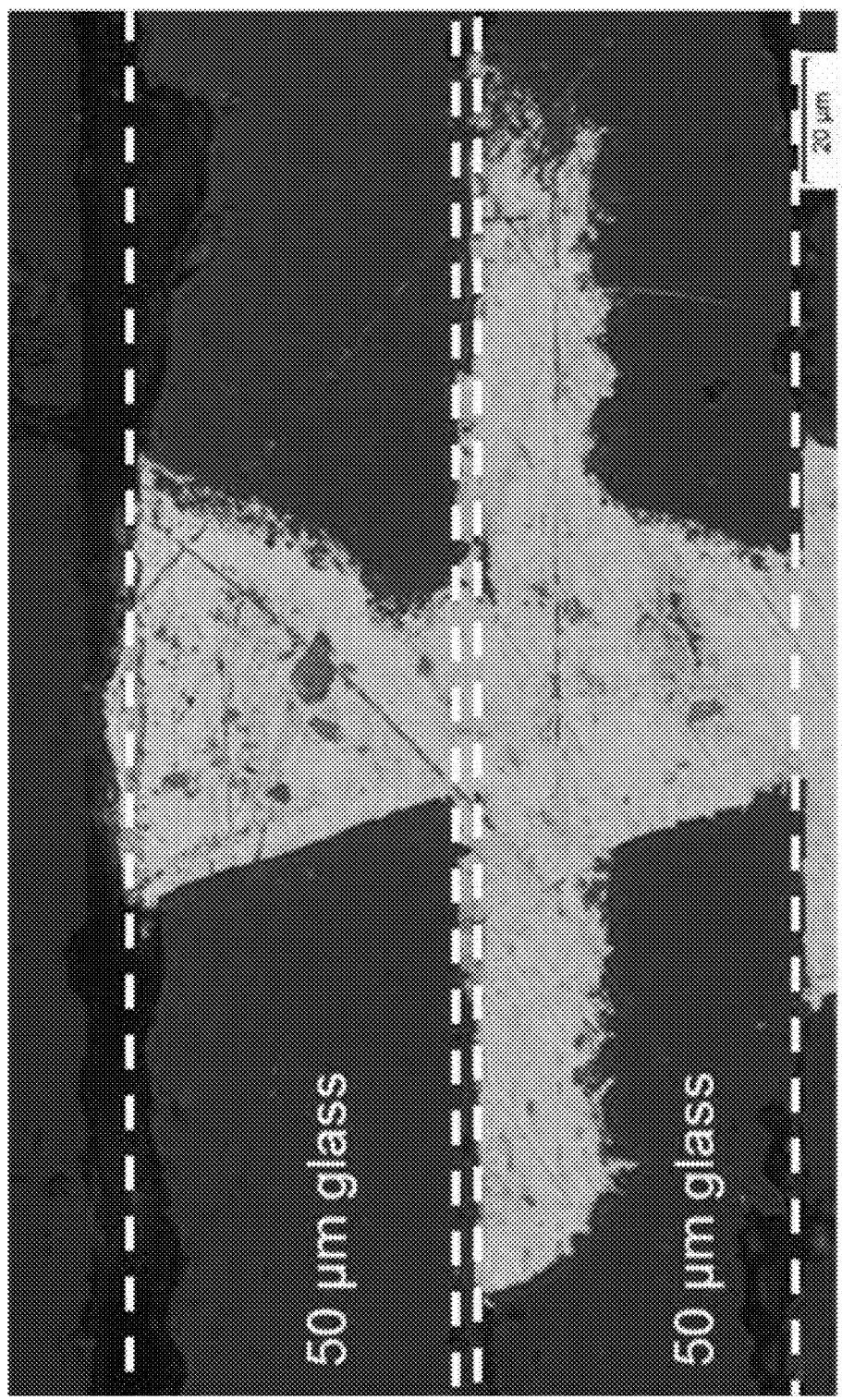
FIGS. 16A and 16B are micrographs of cross sections of a multiple layer structure of through and blind vias drilled by different laser systems and then plated by processes disclosed herein.
Figure 16B:
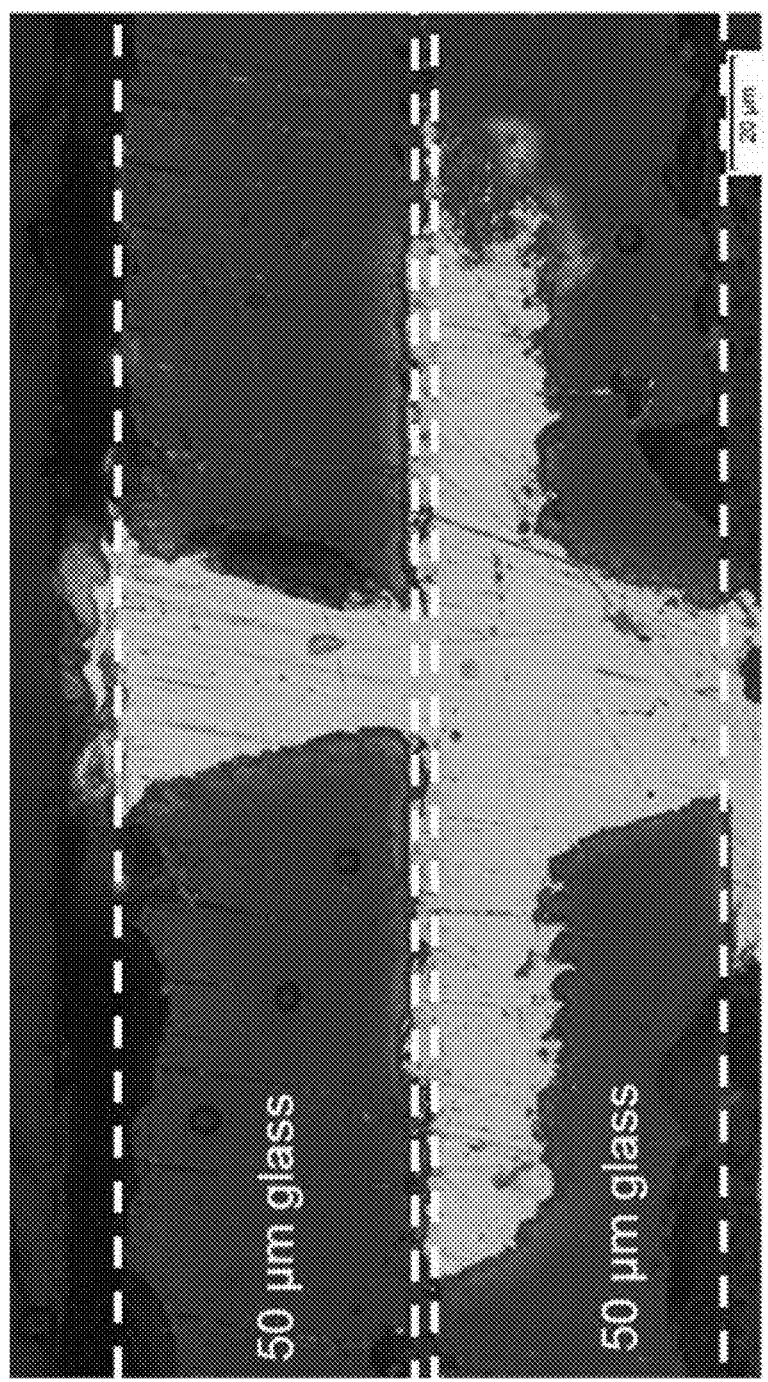

Multilayer PCB architectures can be built up by aligning and gluing additional layers of glass onto plated glass layers and repeating the methods outline above. FIGS. 16A and 16B demonstrate drilling, seeding, and plating of blind vias in order to build up multiple glass layers. FIGS. 16A and 16B are micrographs of cross sections of the multiple layer structure of through and blind vias drilled by different respective laser systems and then seeded and plated by the processes previously discussed. In particular, with reference to FIGS. 8, 16A, and 16B, a pattern with a 20 μm deep, 200 μm diameter pad with 50 μm diameter through via was made in Schott AF32-ECO glass workpiece 100 using the LODESTONE™ laser-micromachining system operating at 1 MHz, 3-4 μJ at 1 m/s. The laser-etched workpiece 100 was then seeded and plated as previously described, such as with respect to FIG. 8. The seeded and plated workpiece 506 is depicted as the bottom substrate in FIG. 16A. Optical glue was spin coated onto a second workpiece 800 of glass such that the thickness of the glue was less than 5 μm, and this workpiece 800 (FIG. 8) of glass was then affixed to the plated workpiece 506. The pattern was aligned (such by aligning the beam axis to the features of the plated workpiece 506), and blind vias drilled all the way through the workpiece 800 such that the glass was removed without damaging the copper pad underneath in the plated workpiece 506. The LODESTONE™ laser-micromachining system was used to perform the blind via drilling using parameters similar to those used for the through holes in the workpiece 100. The cross section of the seeded and plated multiple layer structure drilled by the LODESTONE™ laser-micromachining system is depicted in FIG. 16A. Alternatively, the high reflectivity of copper and the high absorption cross section of glass to mid-IR wavelengths makes ESI's NVIANT™ system an ideal solution for blind via drilling in this application. Vias with a 50 μm top diameter and 35 μm bottom diameter were drilled using the NVIANT™ laser-micromachining system. The cross section of the seeded and plated multiple layer structure drilled by the NVIANT™ laser-micromachining system is depicted in FIG. 16B. FIGS. 16A and 16B were presented in a paper at the IPC Apex Conference in Feb. 14-17, 2017.

IV. ADDITIONAL DISCUSSION

Besides describing a unique method for creating PCBs and IC packaging with few of the constraints of current lithographic and wet processes, the process described in the disclosed embodiments represents a facile method for the introduction of glass dielectric materials into traditional PCB fabrication lines. As an example, a multilayer board with a high-frequency glass layer could be built up by first applying the etching, seeding, and plating techniques described herein to a thin glass substrate, followed by lamination of additional glass or more traditional dielectrics onto the glass layer. The laminated layers could then be etched, drilled, and plated using typical processes. Furthermore, the methods disclosed herein can be modified to prepare embedded components in all-glass structures.

One point of comparison between the methods described herein and typical PCB fabrication techniques is that unlike typical processes, the methods described herein do not require photolithography steps, a catalyst for electroless plating, and copper etching steps.

For example, rather than undertaking photolithographic steps, the pattern of wires, pads, and vias can be directly etched by a laser into the dielectric material. The line width and spacing of the features is limited only by the processing laser, parameters, and the physics of the laser-material interaction. Rather than developing an entirely new chemical/material set for further advancing the miniaturization of PCB features, advances in laser technology, pulse shaping, and beam positioning can drive this trend. Moreover, tin and palladium chemistry can be removed from the electroless plating process. Cleaning, conditioning, micro-etching, catalyst pre-dip, catalyst activation, and acceleration steps are all eliminated from the electroless plating process line. Hazardous and costly chemicals are also removed from the process stream. Finally, there is no copper etching required. The copper that is deposited by the seeding techniques and the plating techniques disclosed herein represents all of the copper in a particular layer of the PCB.

The disclosed processes, therefore, represent a "green chemistry" approach, i.e., an approach that aims to minimize both the use and disposal and hazardous materials (the best green chemistry approaches are those that avoid hazardous materials altogether). The disclosed processes also present the opportunity for substantial base material savings, with glass being up to 100-fold more affordable than current high frequency dielectrics, and energy savings through the absence of thermal photolithographic lamination processes. Even without a total life cycle analysis for an all-glass or glass core PCB that explores the process rates, throughput, and energy and material requirements for the laser seeding process compared to those of typical PCB fabrication, a big difference between the two processes is readily apparent: there are currently no conventional methods for incorporating glass dielectrics into traditional PCB fabrication lines, and the methods described herein offer a pathway to permit such fabrication.

PCB applications that would benefit include any component having a long trace requiring controlled impedance, high-frequency components including antenna for mobile phones.

V. GENERAL CONDITIONS OF MANY OF THE EXPERIMENTS UNLESS OTHERWISE SPECIFIED

Unless otherwise specified, many of the experiments employed the following equipment and materials. Much of the laser etching of glass was carried out on an ESI LODESTONE™ laser-micromachining system. Typical glass substrates for many of the experiments were microscope cover slides (either soda lime or borosilicate glass), cleaned by rinsing with methanol and wiped dry using a lens wipe, and handled only with gloved hands. For many experiments, a 90° crosshatch pattern with 7 µm pitch was used for filling in polygons in the laser etch patterns. Some vias were made by repeating the crosshatch pattern a number of times or by application of a racetrack pattern. The 150 µm thick glass slides used as demonstrators for some of the experiments were Schott D263M glass coverslips, a borosilicate glass with low iron content, sold by Ted Pella, Inc. The 50 µm glass was kindly provided by Schott and was AF32 ECO, which is an alkali-free glass with a thermal expansion coefficient matching that of silicon for chip packaging applications.

All solvents and plating chemicals used were reagent grade. Copper sulfate pentahydrate, potassium sodium tartrate, formaldehyde, and sodium hydroxide were purchases from Sigma-Aldrich. Copper seeding was carried out by laser irradiation of copper foils mounted on a 1 mm thick microscope slides. Copper foils for the experiments were provided by Oak-Mitsui. The foils were 10 µm thick with a 35 µm carrier layer. The foil was kept flat and supported by laminating it onto a glass slide with a 1 µm thick poly(vinyl alcohol) layer, and the carrier layer was removed just prior to carrying out forward transfer. Electroless copper plating was carried out after seeding using standard recipes. A typical electroless copper plating recipe utilizes distilled water as the solvent, copper(II) sulfate pentahydrate as the copper source, potassium sodium tartrate as a chelator, and formaldehyde as a reductant. The pH of the aqueous solution was raised with sodium hydroxide to tune the reduction potentials to drive the plating reaction. The plating was carried out at room temperature in a 200 ml pyrex beaker with magnetic stirring at 200 rpm.

Profile measurements were carried out on a Keyence VK9700 scanning laser microscope. Cross sections of the engraved features were analyzed using the VK Analysis Application, version 3.1.0.0. For the resistivity measurements, cross sectional areas were measured at 10 different locations in the wire to obtain an average value, which is reported with ±1σ. Four-point probe measurements employed an Agilent E3612A DC power supply for both establishing currents from 50-200 mA across the plated features and recording the voltage drop. The reported resistivity values are the average of four measurements at different applied currents for each plated feature.

VI. YET MORE ADDITIONAL DISCUSSION

For some embodiments, the donor film 304 can have a thickness of less than 1 µm, which can be facilitate precise control during the seed layer deposition process. However, the use of such thin donor films 304 limits the amount of seed material that can be deposited from a single place on the donor structure 300. Thus, multiple passes can be carried out to build up a sufficient amount of material onto the workpiece 100.

In some embodiments, the LIFT techniques discussed above employ a single laser pulse to transfer material from the donor structure 300 to the workpiece 100. Without being tied to any particular theory, it is believed that the laser pulse is absorbed by the donor structure 300 at the interface between the donor film 304 and the carrier substrate 302, and within several nanoseconds the energy is transferred into heating the material of the donor film 304. A melt front begins to propagate through the donor film 304 and, if the donor film 304 is thin enough (or if the laser fluence large enough), the melt front will reach the front side of the donor film 304 before heat diffusion drops the temperature below the melting point of the donor film 304. Once the melt front reaches the front of the donor film 304, liquid droplets of material of the donor film 304 can be expelled from the carrier substrate 302. Often, the expulsion of donor material is aided by a large pressure build-up at the interface between the donor film 304 and the carrier substrate 302 that results from the evaporation of material of the donor film 304, the optional or dynamic release layer, or other sacrificial layer. At an undesirably high laser fluence, an undesirable amount of the donor material can be undesirably expelled from the donor film 304 as vapor rather than as a liquid, and the geometry of the deposited material can become more difficult to control. At an undesirably low laser fluence, the melt front will not propagate to the front of the donor film 304, and no material will be transferred to the workpiece 100. As the thickness of donor films increases to more than 1 µm (or thereabout), the laser fluence associated with a delivered laser pulse will be correspondingly increased, which can result in reduced resolution of the deposited seed material on the workpiece 100, as well as higher pressures at the interface between the donor film 304 and the carrier substrate 302.

In another embodiment, the LIFT techniques discussed above may employ multiple laser pulses or multiple laser sources to achieve sub-spot size resolution of the deposited material. For example, one laser source can be used to melt a spot of the donor film, and a second source employed to transfer the melted donor material.

In yet another embodiment, the LIFT techniques discussed above may employ quasi-continuous wave (QCW) laser means for controlled LIFT of donor films thicker than 1 µm (or thereabout). QCW lasers employ pulse repetition frequencies (PRF) of 10s-100s of MHz. Recently, QCW green lasers with average powers of >100 W have become available. With QCW LIFT, individual pulses from the QCW laser are insufficient to trigger a forward transfer event, but the PRF is large enough that the thermalized pulse energy is unable to fully diffuse within the donor film 304 before the next pulse arrives. Thus, there is a buildup of thermal energy with each subsequent pulse such that, after a sufficient number of pulses have been delivered, the melt front will reach the front side of the donor film. Unlike single pulse LIFT, the multiple pulses of QCW LIFT represent a gentler and more controlled heating of the donor film 304, thus allowing for greater control of the forward transfer process. For example, the pulse energies can be dynamically changed during irradiation to finely tune the process. This level of control is not available with single pulse LIFT. Thus, the ejection speed, temperature, and composition of the material ejected from the donor film 304 can be controlled, which ultimately affects the geometry of the deposited material. Furthermore, because QCW lasers operate at a relatively high average power, the QCW LIFT processes can be scaled up to speeds appropriate to polygon scanners for the production of large fill factor patterns.

In one embodiment, a QCW LIFT process can involve applying a sufficient or other predetermined number of pulses to heat the donor film 304 close to the forward transfer condition (e.g., close to the point at which the melt front propagates to the front of the donor film 304), and then changing the pulse energy during (or right before) the time when the material of the donor film 304 is starting to flow forward. This would change the temperature and velocity of the material and affect the geometry of the deposited material. Acousto-optic devices can be driven to position a laser pulse to a unique location every 1 µs (or thereabout) or less (e.g., every 100 s of nanoseconds, e.g.,). The actual duration for the deposit of each voxel depends on the laser parameters, material characteristics, and material geometry.

Figure 17A:
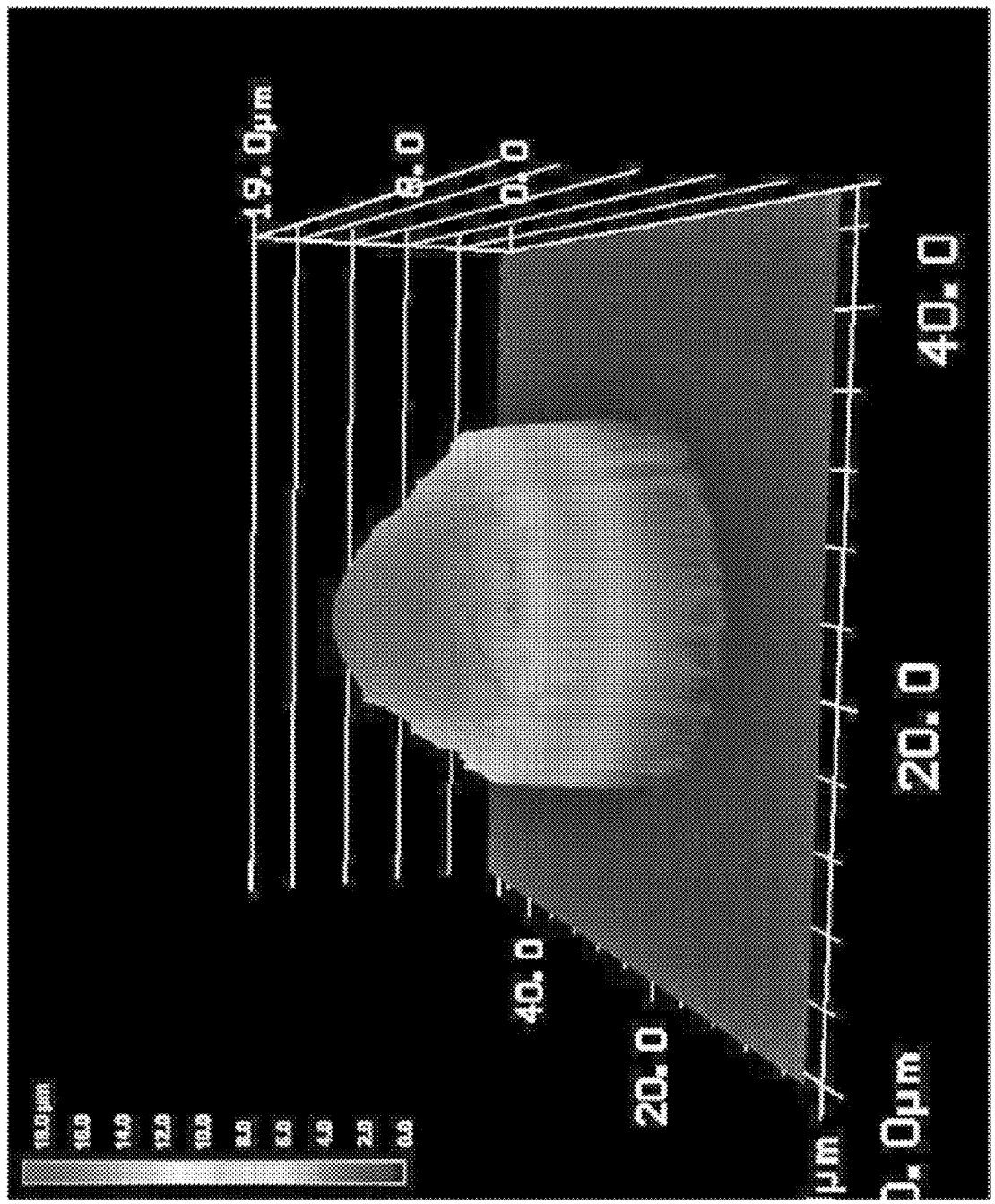
FIG. 17A is a UV scanning micrograph of a height map of copper deposited by a LIFT process modified to deposit more discrete and/or larger amounts of transferred material.
Figure 17B:
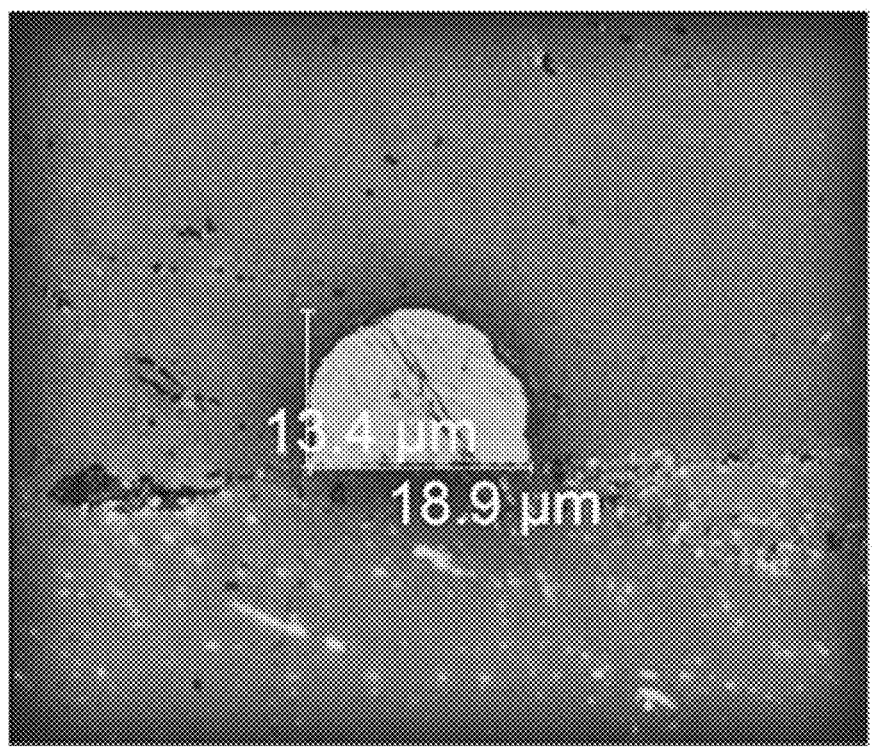
FIG. 17B is a micrograph of a cross-section of copper deposited by a LIFT process modified to deposit more discrete and/or larger amounts of transferred material.
Figure 17C:
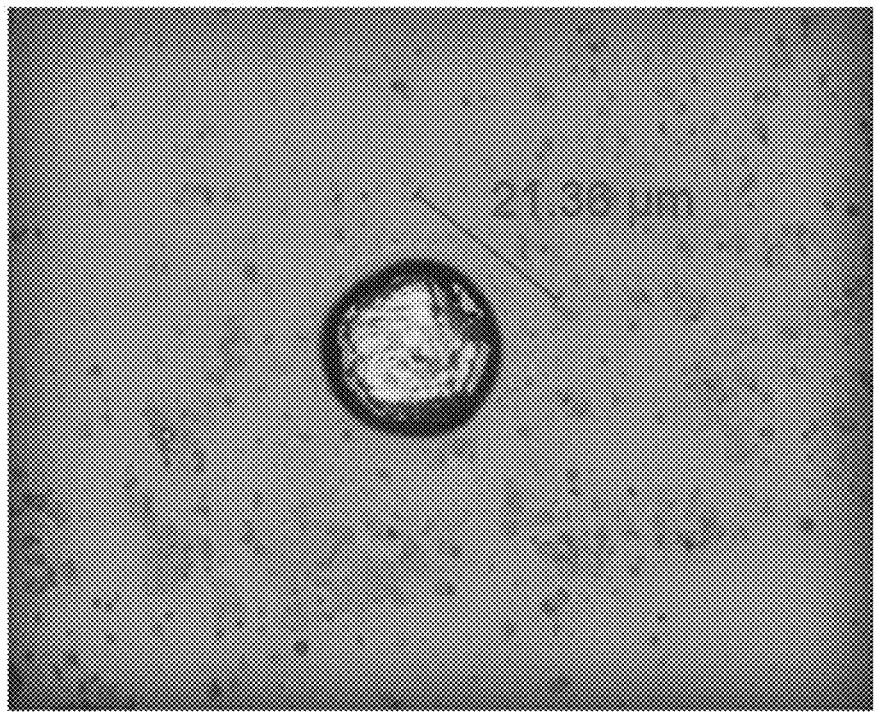
FIG. 17C is a micrograph of a top view of copper deposited by a LIFT process modified to deposit more discrete and/or larger amounts of transferred material.

In an effort to increase the amount of seed material delivered, preliminary experiments for enhanced copper forward transfer were carried out using a beam of laser energy 400 from an IPG 200 W QCW laser operating at 50 MHz, 1.4 ns pulse duration, 140 W average power, and focused to a beam waist of 30 µm diameter. Results of these experiments are shown in FIGS. 17A-17C. In particular, FIG. 17A is a UV laser scanning micrograph of a height map of copper deposited by a LIFT process modified to deposit more discrete and/or larger amounts of transferred material; FIG. 17B is a micrograph of a cross-section of copper deposited by a LIFT process modified to deposit more discrete and/or larger amounts of transferred material; and FIG. 17C is a micrograph of a top view of copper deposited by a LIFT process modified to deposit more discrete and/or larger amounts of transferred material. Single splash-free voxels were deposited from a 10 µm thick donor film that were ~20 µm wide and 10-20 µm tall. The total irradiation time per feature was 2 µs. Cross sections of the deposits show that they consist of solid copper, with no voids observed. A skilled person will note that the height of the features is greater than that of the film thickness, and the width of the feature smaller than that of the focused spot diameter. This circumstance may be a result of the geometry of the melted region of the donor film when the melt front reaches the front side of the donor film (a wide melt region is observed at the carrier substrate/donor film interface and a narrow opening where the melt front reaches the front side of the donor). Based on these results, this approach could be used to fully print copper for circuit board patterns and fill vias without the need for any copper plating processes.

Scaling up the process from single voxels to lines and more complex features can be broadly carried out in two different ways. In a first method, individual voxels are printed next to each other, and the laser is gated off in-between voxels while the sample and/or beam is repositioned for the next voxel. The voxels can be placed in contact to create conductive features. FIG. 18 is a flow diagram of such an exemplary alternative LIFT process, demonstrating laser gating for depositing a pattern voxel by voxel. With reference to FIG. 18, process condition 18A shows an "on" condition of the beam of laser energy 1800, in which one or more laser pulses are permitted to propagate through the carrier substrate 302 to impinge the donor film 304 and cause transfer of the donor film material to the workpiece 100 in process step 1812. Process condition 18B shows the deposited voxel 1802 of donor material with the laser in an "off" condition, in which one or more laser pulses are blocked (such as by and acousto-optic device) and are prevented from impinging the donor material. (The laser can actually be turned off during the "off" condition, but is rarely done conventionally.) In process step 1814, the beam axis, donor structure 300, and/or the workpiece 100 are moved in relation to one another so the beam of laser energy is aligned to impinge a new location on the donor film. This beam alignment is shown in process condition 18C. In process step 1816, laser pulses impinge the donor film and transfer donor material to form a voxel 1802a that is adjacent to the previously deposited voxel 1802 to create an elongated conductive feature. Skilled persons will also appreciate that the transfer of voxel 1802a could be positioned to add donor film material on top of previously deposited voxel 1802 to increase its height and cross-sectional area instead of extending its length. This height extension can be done before a subsequent voxel transfer to extend its length. Although the height extension can be accomplished through a second pass of the laser beam axis over a first pass of deposited voxels, adding to the height during a single pass may benefit throughput when higher deposits are desired. Process condition 18D shows the voxel 1802a deposited adjacent to and joined with the voxel 1802. The relative movement of the beam axis, carrier structure 300, and/or workpiece 100 can be carried out with stages alone (with long positioning times), or with stages plus galvos yielding 1000s of spots per second, or incorporating an acoustic-optic deflector to further increase the bandwidth.

In a second method, the laser is gated on, and fast beam steering is utilized. Maintaining the same dose as applied in connection with FIGS. 17A-17C could require moving the beam at around 15 m/s, perhaps mandating a polygon scanner. One possible scenario in this case is that individual voxels are not transferred, but a steady stream of molten material is transferred from the donor structure 300 to the workpiece 100. FIG. 19 is a flow diagram of an exemplary alternative LIFT process, demonstrating continuous relative motion of a beam axis for depositing a pattern. With reference to FIG. 19, process condition 19A shows an "on" condition of the beam of laser energy 1900, in which the laser pulses are permitted to propagate through the carrier substrate 302 to impinge the donor film 304 and cause transfer of the donor film material to the workpiece 100 in process step 1912. Process condition 19B shows the deposited material 1902 of donor material with the laser still in the "on" condition. In process step 1914, the beam axis, donor structure 300, and/or the workpiece 100 are moved in relation to one another so the beam of laser energy 1900 is aligned to impinge a new location on the donor film 304. This beam alignment is shown in process condition 19C with additional donor material added to the deposited material 1902a. In process step 1916, laser pulses continue to impinge the donor film 304 at yet another location and transfer more material of the donor film 304 to form a continuous elongated conductive feature. Skilled persons will also appreciate that the transfer of donor material could be positioned to add donor film material on top of previously deposited material to increase its height and cross-sectional area instead of extending its length, as previously discussed.

The QCW LIFT process described above is scalable to much higher beam positioning velocities than what is possible using lasers with PRFs in the 10s-100s of kHz regime. The QCW LIFT approach also appears to facilitate the use of relatively thick donor films (e.g., having thickness greater than 1 µm), and allows for thicker deposits. Dynamic control of the average power during irradiation provides a level of control to the process that is not available with single pulse LIFT methods. The QCW LIFT method also enables the formation of deposited features that are taller than the thickness of the donor film, which seems (without being tied to any particular theory) to be a result of the unique geometry of the melt region—due to the buildup of thermal energy at the carrier substrate/donor film interface from multiple pulses—as the melt front reaches the front side of the donor film 304.

VI. YET EVEN MORE ADDITIONAL DISCUSSION AND EXAMPLES

Transparent conducting electrodes (TCE) are used in a variety of electronic applications, including displays, touch screens, solar cells, photodetectors, and anti-fogging devices. The most widely used TCE is tin-doped indium oxide (ITO). The material is typically vacuum sputtered onto a transparent substrate, typically glass, and the popularity of this material arises from ITO thin films having sheet resistances of ~10 $\Omega\square^{-1}$ (ohms per square) and transmittance of over 90%. The price of the material is tied to the price of indium, a relatively scarce element at 0.05 ppm in the Earth's crust, and produced at only about 400 tons/year as of 2007. The Royal Society of Chemistry has stated that supply of indium may be run dry by the end of the century. Furthermore, the films are brittle and not amendable toward flexible applications. Therefore, a number of research groups are currently working on alternative strategies for producing transparent conducting materials that employ earth abundant and flexible materials.

There are several strategies for replacing ITO with more earth abundant materials: micro- and nanowire metallic mesh, notably of copper or silver, graphene films, carbon nanotube networks, and conductive polymer films (such as PEDOT:PSS). Of these, metal mesh and nanowire films, collectively called conducting networks, present some of the best transmittance and sheet resistance values while offering the lowest process and materials costs. These processes can be divided into template and non-template based processes, with the template-based methods relying on lithography and the non-template methods having random alignment of the constituent moieties, using spin coating, dip coating, or spray coating.

Several laser-based methods have been employed for preparing transparent conducting networks. A laser direct writing approach was employed by Paeng et al. for the fabrication of thin copper transparent conductors (*Adv. Mater.* 2015, 27, 2762). Selective laser ablation of a thin copper film mounted on glass or flexible substrates was carried out, leaving a wire mesh network with 83% transmittance and sheet resistance of about 17 $\Omega\square^{-1}$. Lee et al. prepared Ni networks through the laser-based reductive sintering of NiO nanoparticles to prepare ~40 nm deep wires of nickel that are each 10 μm wide (*ACS Nano* 2014, 8, 9807). The transmittance of the pattern can be controlled by modifying the pitch of the deposited features.

The etching, seeding, and/or plating methods disclosed herein are well-suited to constructing transparent conducting features on (or in) both rigid and flexible substrates. An exemplary process for constructing transparent conducting features may be simlar to those shown in FIGS. 5B, 7, 8, 18, and 19. The LIFT literature is extensive and describes the means by which the process can be controlled in a number of ways to eject droplets of varying size with varying velocities and temperatures. In many embodiments, the enhanced LIFT procedures described herein can use much thicker donor films 304 than those typically found in the literature, which allows for deposition of larger amounts of material but may rely on significantly higher laser fluences and/or doses. The geometry and connections of the features are completely determined by the laser processing parameters, which gives great flexibility for tuning the electrical and optical properties of the transparent conductor.

In the embodiments where the globules 404 of deposited material are too sparse to prepare a conductive pattern, they can be utilized as seeds for the deposition of copper or other metallic material through typical electroless deposition methods. After plating, excess material can be polished off, leaving only the recessed plated features. In other embodiments, such as discussed with respect to FIGS. 18 and 19, the deposited material may be adequate to form the desired conductive features. Polishing may be desirable to remove any excess metallic material that is deposited beyond the recessed features.

Several wire mesh designs were constructed by a process similar to that shown in FIG. 5B. The wire mesh designs included crosshatched patterns of 10 μm wide wires with variable pitch on glass substrates. These patterns have sheets resistances less than 1 $\Omega\square^{-1}$ (Ohms per square) and transmission over 90%, far surpassing typical ITO performance for sheet resistance with similar transmittance. Microscopic imperfections are observed after the plating, and represent fruitful space for further optimization of the process that would enable smaller wire dimensions.

Figure 20A:
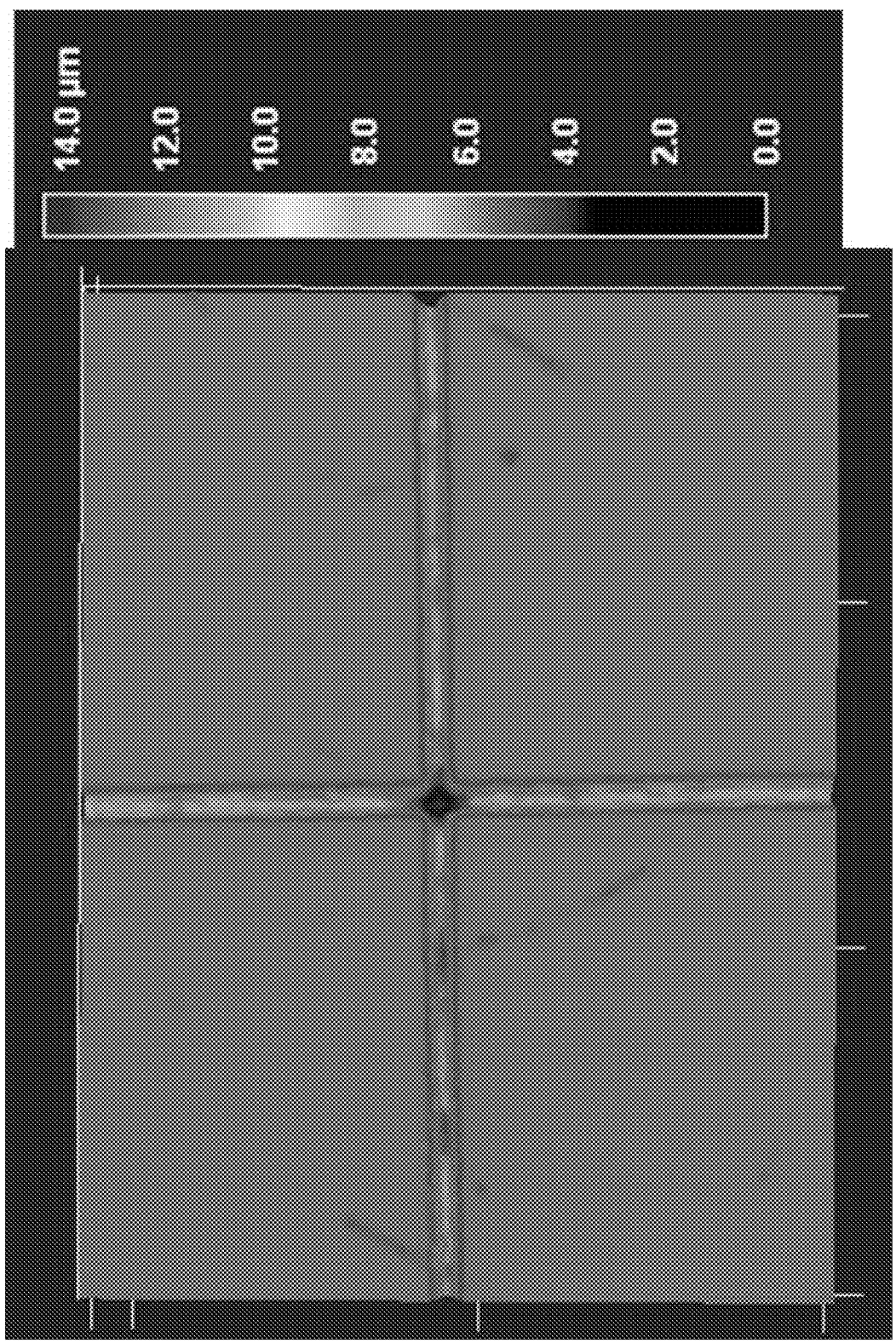
FIG. 20A is a UV laser scanning micrograph of height measurement of an intersecting wire mesh pattern on a glass substrate.
Figure 20B:
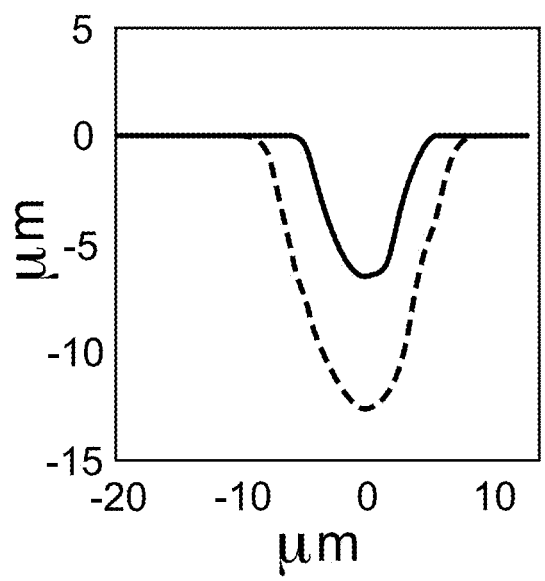
FIG. 20B is a graph showing profile measurements of the wire and intersection associated with FIG. 20A.
Figure 20C:
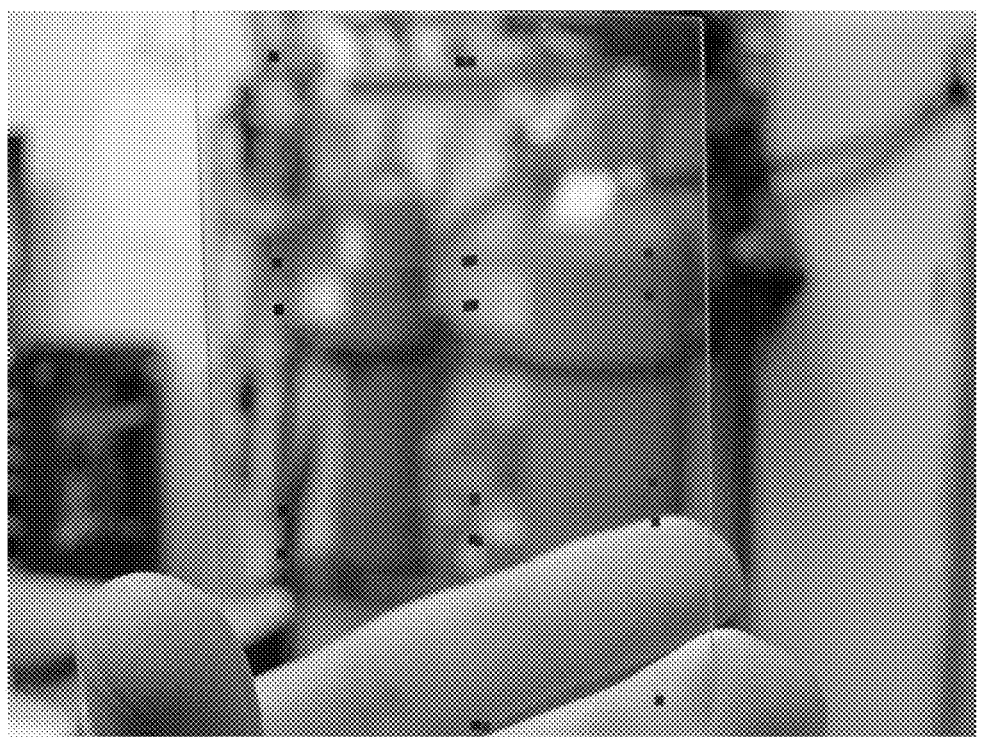
FIG. 20C and FIG. 20D are photographic images demonstrating the relative transparency of a wire mesh design deposited on both sides of a transparent substrate with overlapping pads in the middle.
Figure 20D:
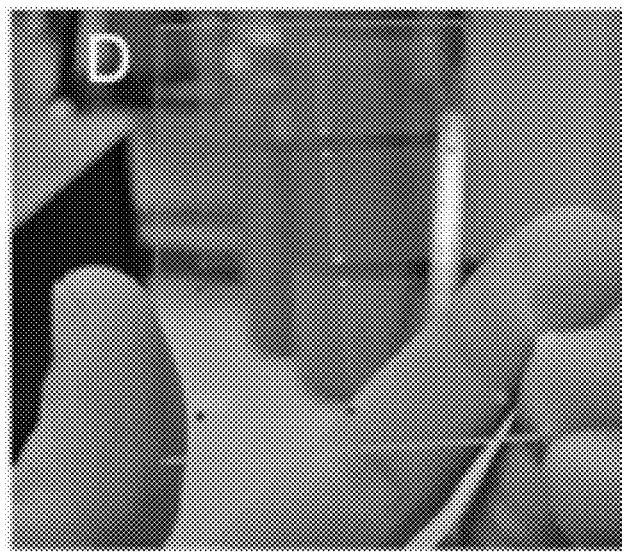
Figure 21A:
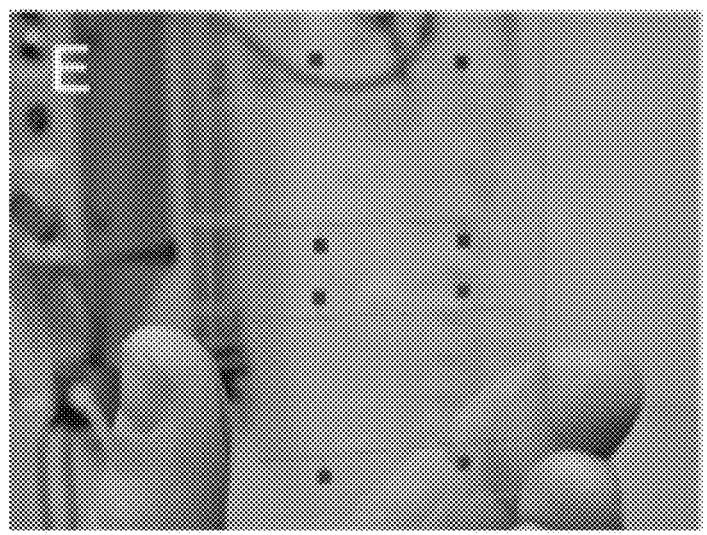
FIG. 21A and FIG. 21B are photographic images demonstrating the relative transparency of a touch pad design on glass utilizing 10 μm wide wires.
Figure 21B:
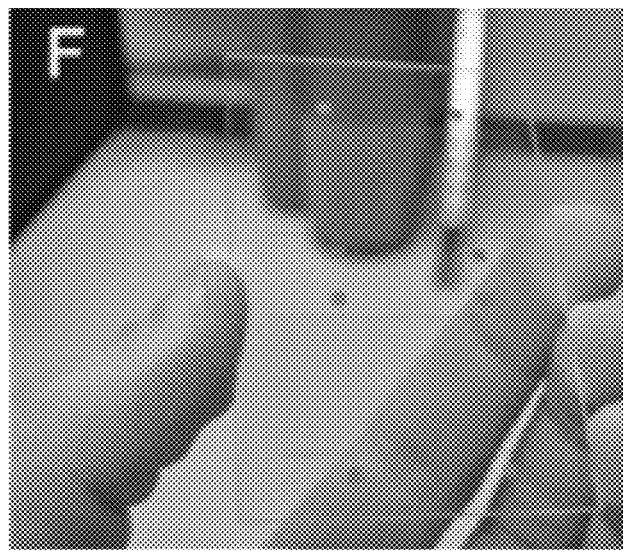

FIG. 20A is a UV laser scanning micrograph of height measurement of an intersection of the wire mesh pattern. The tick marks at the edge of the micrograph represent a spacing of 100 μm. FIG. 20B is a graph showing profile measurements of the wire and intersection associated with FIG. 20A. The profile measurements of the wire are depicted with the upper solid line, and the profile measurements of the intersection of the wires are depicted with the lower dashed line. FIG. 20C and FIG. 20D are photographic images demonstrating the relative transparency of a wire mesh design. FIG. 21A and FIG. 21B are photographic images demonstrating the relative transparency of a wire mesh design deposited on both sides of a transparent glass substrate with overlapping pads in the middle.

Figure 22:
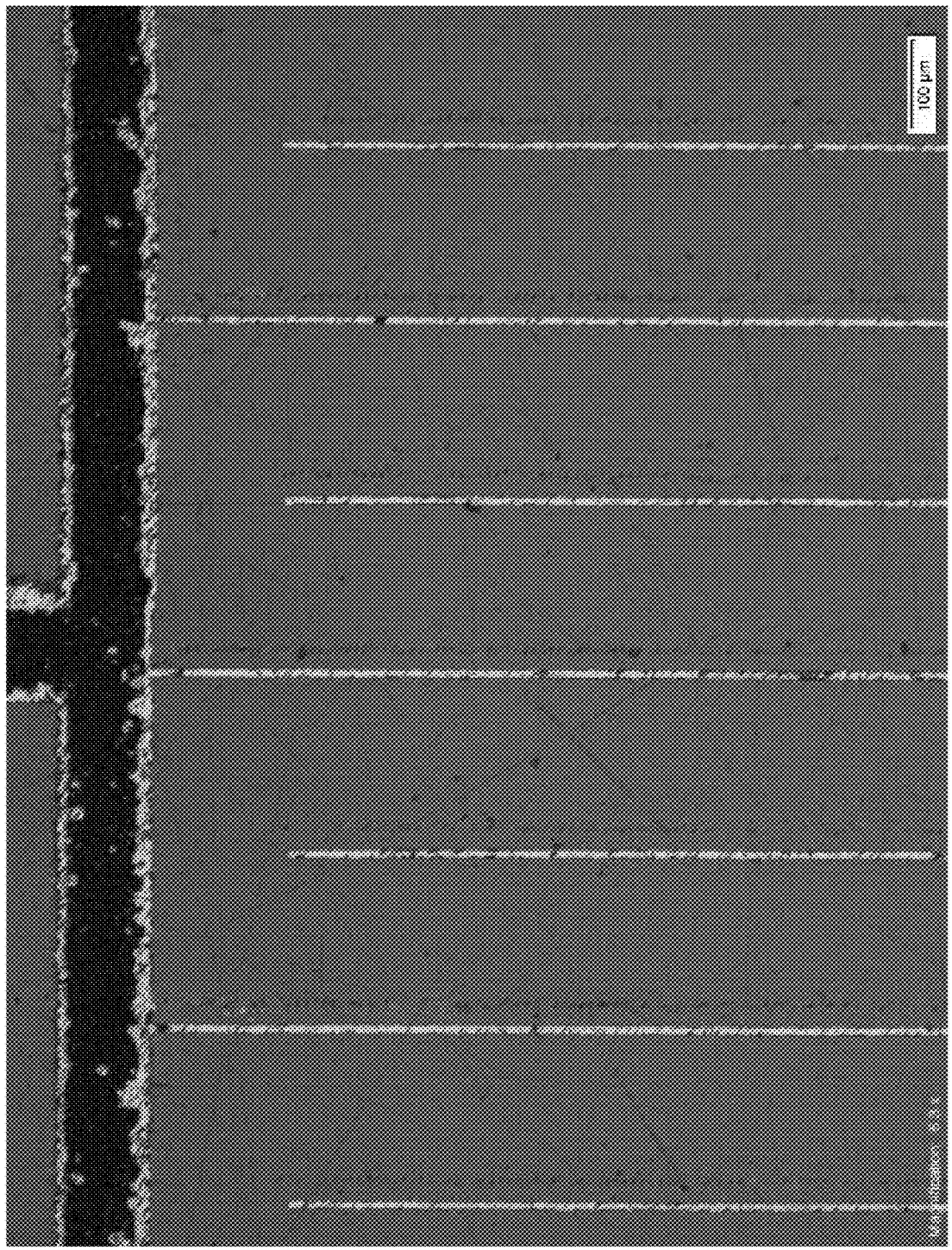
FIG. 22 is an optical microscope image of a touch pad produced by methods disclosed herein.
Figure 23:
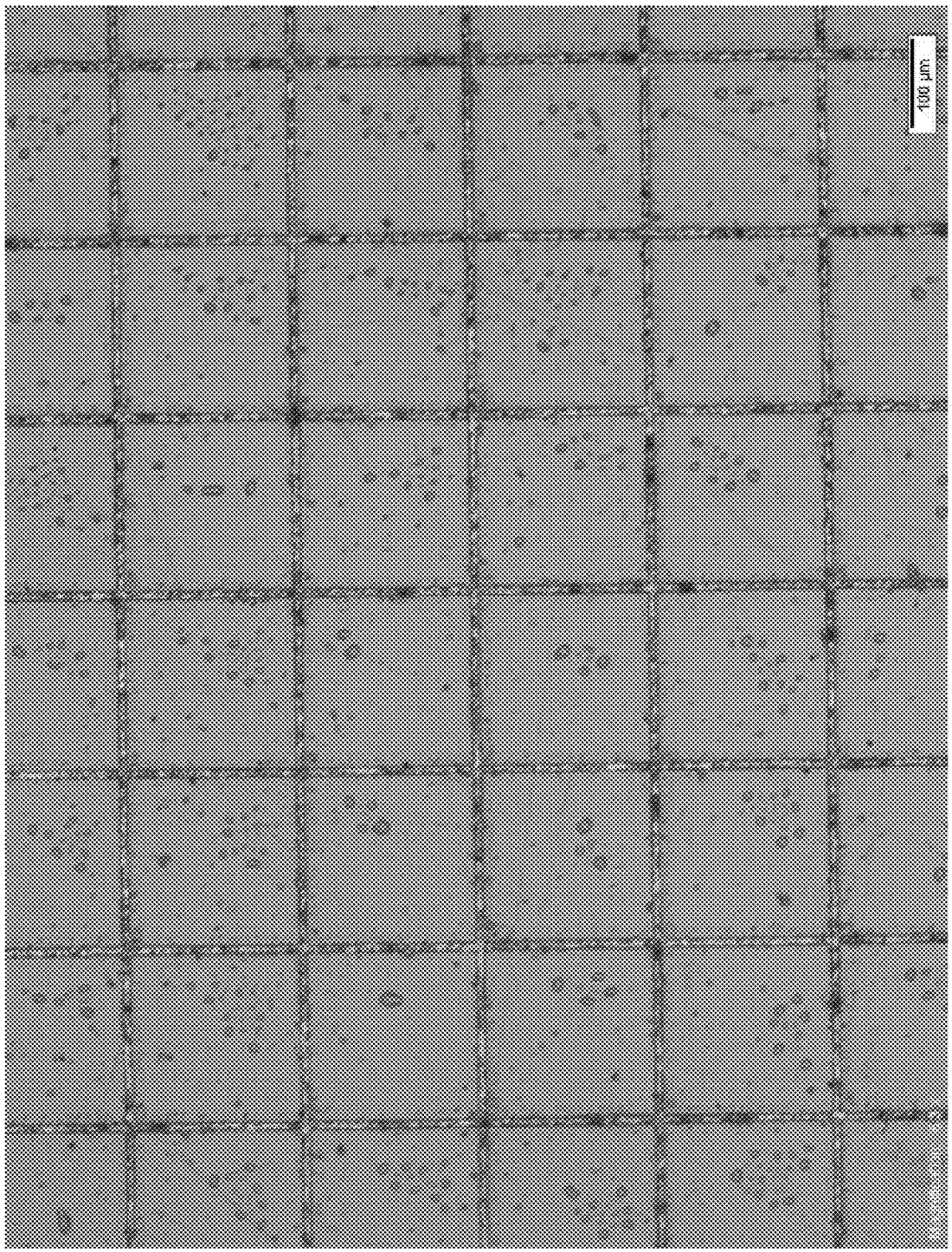
FIG. 23 is an optical microscope image of a wire mesh design produced by methods disclosed herein.

FIG. 22 is a micrograph of a touch pad produced by methods disclosed herein, and FIG. 23 is micrograph of a wire mesh design produced by methods disclosed herein. With reference to FIGS. 22 and 23, the micrographs have 10× magnification and show wire mesh designs with 200 μm pitch, but with some microscopic imperfections in the wires.

The described process offers a number of advantages over current efforts to prepare next-generation transparent conducting materials. Higher conductivities and optical transmission are found compared to nanowire methods, all while avoiding the synthetic chemistry, wet processing steps, and sintering associated with these methods. Furthermore, concerns regarding oxidation of copper nanowires are eliminated. The process has very low materials cost compared to ITO, graphene, conductive polymer, carbon nanotube, or silver-based methods (silver nanowire films or nanoparticle pastes). Finally, there are no special environmental conditions required, such as high vacuum deposition, inert gases, etc., associated with thin-film deposition methods.

VII. CONCLUSION

The foregoing is illustrative of embodiments of the invention and is not to be construed as limiting thereof. Although a few specific example embodiments have been described with reference to the drawings, those skilled in the art will readily appreciate that many modifications to the disclosed exemplary embodiments and examples, as well as other embodiments, are possible without materially departing from the novel teachings and advantages of the invention.

Accordingly, all such modifications are intended to be included within the scope of the invention as defined in the claims. For example, skilled persons will appreciate that the subject matter of any sentence or paragraph can be combined with subject matter of some or all of the other sentences or paragraphs, except where such combinations are mutually exclusive.

The scope of the present invention should, therefore, be determined by the following claims, with equivalents of the claims to be included therein.

What is claimed is:

1. A method, comprising:
in a first laser process, directing a beam of laser energy to a workpiece to form a recess within the workpiece, wherein the workpiece comprises a main surface and wherein the recess includes a sidewall surface extending from the main surface;
in a second laser process, forming a seed layer within the recess, wherein forming the seed layer includes directing a beam of laser energy onto a seed material, wherein forming the seed layer comprises:
providing a donor structure comprising a carrier substrate that is transparent to the beam of laser energy and a donor film, wherein the donor film faces toward the workpiece; and
directing the beam of laser energy through the carrier substrate to impinge a portion of the donor film such that at least a portion of the donor film impinged by the laser energy is transferred off from the carrier substrate as a plurality of liquid droplets and onto the workpiece,
wherein, in the second laser process, the seed layer is formed on the sidewall surface of the recess; and
performing a plating process using the seed layer as a seed to form a conductive feature within the recess.

2. The method of claim 1, wherein the workpiece comprises a glass substrate.

3. The method of claim 1, wherein the seed layer comprises copper.

4. The method of claim 1, wherein performing the plating comprises performing an electroless plating process.

5. The method of claim 1, wherein the conductive feature comprises copper.

6. The method of claim 1, wherein the conductive feature has a width smaller than 12 µm.

7. The method of claim 1, wherein the conductive feature comprises copper and wherein the conductive feature has a resistivity less than or equal to 1.5 times that of bulk copper.

8. The method of claim 1, further comprising forming a through hole within the workpiece, wherein forming the seed layer comprises forming the seed layer within the through hole.

9. The method of claim 1, wherein, in the second laser process, the beam of laser energy has a wavelength shorter than 550 nm.

10. The method of claim 1, wherein, in the second laser process, the beam of laser energy is characterized by a pulse repetition rate less than 200 kHz and an average power less than 20 W.

11. The method of claim 1, wherein the donor structure is spaced apart from the workpiece during formation of the seed layer.

12. The method of claim 1, wherein the beam of laser energy directed in the second laser process is a pulsed beam of laser energy.

13. The method of claim 1, wherein a quasi-continuous wave (QCW) laser is employed to provide the beam of laser energy directed in the second laser process.

14. The method of claim 1, wherein the conductive feature is a wire mesh.

15. The method of claim 1, wherein the workpiece and the conductive features exhibit an optical transmission greater than or equal to 90%.

16. The method of claim 1, wherein the workpiece is flexible.

17. The method of claim 1, wherein the recess further includes a bottom surface extending from the sidewall surface,
wherein, in the second laser process, the seed layer is formed on the bottom surface of the recess.

18. The method of claim 1, wherein the second laser process further includes forming the seed layer outside the recess, the method further comprising:
removing the seed layer outside the recess before performing the plating process.

19. The method of claim 1, wherein the workpiece comprises a main surface and wherein the recess extends into the workpiece from the main surface,
wherein a surface defining the recess is rougher than the main surface.

20. A method, comprising:
in a first laser process, directing a beam of laser energy to a workpiece to form a through hole within the workpiece;
in a second laser process, forming a seed layer within the through hole, wherein forming the seed layer includes directing a beam of laser energy onto a seed material, wherein forming the seed layer comprises:
providing a donor structure comprising a carrier substrate that is transparent to the beam of laser energy and a donor film, wherein the donor film faces toward the workpiece; and
directing the beam of laser energy through the carrier substrate to impinge a portion of the donor film such that at least a portion of the donor film impinged by the laser energy is transferred off from the carrier substrate as a plurality of liquid droplets and onto the workpiece; and
performing a plating process using the seed layer as a seed to form a conductive feature within the through hole.

* * * * *